(12) United States Patent
Asami

(10) Patent No.: US 10,186,614 B2
(45) Date of Patent: Jan. 22, 2019

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Yoshinobu Asami, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/548,123

(22) PCT Filed: Jan. 28, 2016

(86) PCT No.: PCT/IB2016/050420
§ 371 (c)(1),
(2) Date: Aug. 2, 2017

(87) PCT Pub. No.: WO2016/125052
PCT Pub. Date: Aug. 11, 2016

(65) Prior Publication Data
US 2018/0019343 A1   Jan. 18, 2018

(30) Foreign Application Priority Data

Feb. 6, 2015  (JP) .................. 2015-022588

(51) Int. Cl.
*H01L 29/78* (2006.01)
*H01L 21/8234* (2006.01)
(Continued)

(52) U.S. Cl.
CPC .... *H01L 29/7854* (2013.01); *H01L 21/02178* (2013.01); *H01L 21/02266* (2013.01);
(Continued)

(58) Field of Classification Search
CPC .......... H01L 29/7854; H01L 29/66969; H01L 29/786; H01L 21/02178; H01L 21/02266;
(Continued)

(56) References Cited

U.S. PATENT DOCUMENTS 7,791,072 B2  9/2010  Kumomi et al.
8,547,771 B2  10/2013  Koyama
(Continued)

FOREIGN PATENT DOCUMENTS

JP  2006-165528 A  6/2006
JP  2007-096055 A  4/2007
(Continued)

OTHER PUBLICATIONS

Chatterjee.A et al., "Sub-100nm Gate Length Metal Gate NMOS Transistors Fabricated by a Replacement Gate Process", IEDM 97: Technical Digest of International Electron Devices Meeting, Dec. 7, 1997, pp. 821-824.
(Continued)

*Primary Examiner* — Mark Tornow
(74) *Attorney, Agent, or Firm* — Fish & Richardson P.C.

(57) ABSTRACT

A semiconductor device in which parasitic capacitance is reduced is provided.
A semiconductor device comprising a first insulating layer, a first oxide semiconductor layer over the first insulating layer, a second oxide semiconductor layer over the first oxide semiconductor layer, a source electrode layer and a drain electrode layer over the second oxide semiconductor layer, a second insulating layer over the first insulating layer, the source electrode layer, and the drain electrode layer, a third insulating layer over the second insulating layer, a third oxide semiconductor layer over the second oxide semiconductor layer, a gate insulating layer over the third oxide semiconductor, and a gate electrode layer over the gate
(Continued)

insulating layer. The second insulating layer is an oxygen barrier layer and includes a region in contact with side surfaces of the first oxide semiconductor layer, the second oxide semiconductor layer, the source electrode layer, and the drain electrode layer. The third oxide semiconductor layer includes a region in contact with side surfaces of the second oxide semiconductor layer, the source electrode layer, the drain electrode layer, the second insulating layer, and the third insulating layer.

17 Claims, 44 Drawing Sheets

(51) Int. Cl.

| | | |
|---|---|---|
| *H01L 21/8238* | (2006.01) | |
| *H01L 21/28* | (2006.01) | |
| *H01L 27/088* | (2006.01) | |
| *H01L 29/786* | (2006.01) | |
| *H01L 27/092* | (2006.01) | |
| *H01L 27/108* | (2006.01) | |
| *H01L 27/146* | (2006.01) | |
| *H01L 21/02* | (2006.01) | |
| *H01L 21/385* | (2006.01) | |
| *H01L 23/29* | (2006.01) | |
| *H01L 23/31* | (2006.01) | |
| *H01L 29/24* | (2006.01) | |
| *H01L 29/66* | (2006.01) | |
| *H01L 27/12* | (2006.01) | |

(52) U.S. Cl.
CPC ............ *H01L 21/28* (2013.01); *H01L 21/385* (2013.01); *H01L 21/8234* (2013.01); *H01L 21/8238* (2013.01); *H01L 23/291* (2013.01); *H01L 23/3171* (2013.01); *H01L 27/088* (2013.01); *H01L 27/092* (2013.01); *H01L 27/108* (2013.01); *H01L 27/1225* (2013.01); *H01L 27/146* (2013.01); *H01L 29/24* (2013.01); *H01L 29/66969* (2013.01); *H01L 29/786* (2013.01); *H01L 29/7869* (2013.01); *H01L 29/78696* (2013.01)

(58) Field of Classification Search
CPC ... H01L 21/28; H01L 21/385; H01L 21/8234; H01L 21/8238; H01L 23/291; H01L 23/3171; H01L 27/088; H01L 27/092; H01L 27/108; H01L 27/146
See application file for complete search history.

(56) References Cited

U.S. PATENT DOCUMENTS

| | | | |
|---|---|---|---|
| 8,878,288 B2 | 11/2014 | Isobe et al. | |
| 8,932,913 B2 | 1/2015 | Sasagawa et al. | |
| 8,946,812 B2 | 2/2015 | Ishizuka et al. | |
| 9,059,219 B2 | 6/2015 | Sasagawa et al. | |
| 9,368,636 B2 | 6/2016 | Kurata et al. | |
| 9,559,211 B2 | 1/2017 | Yamazaki | |
| 2007/0108446 A1* | 5/2007 | Akimoto | H01L 29/41733 257/61 |
| 2007/0187760 A1* | 8/2007 | Furuta | H01L 29/41733 257/347 |
| 2012/0187475 A1 | 7/2012 | Yamazaki et al. | |
| 2012/0199842 A1 | 8/2012 | Takemura | |
| 2012/0223310 A1 | 9/2012 | Noda et al. | |
| 2013/0009146 A1 | 1/2013 | Nomura et al. | |
| 2014/0004656 A1 | 1/2014 | Sasagawa et al. | |
| 2014/0034946 A1* | 2/2014 | Yamazaki | H01L 29/247 257/43 |
| 2014/0138674 A1* | 5/2014 | Sato | H01L 29/7869 257/43 |
| 2014/0291674 A1* | 10/2014 | Kurata | H01L 21/02334 257/43 |
| 2014/0339544 A1 | 11/2014 | Hanaoka et al. | |
| 2014/0339548 A1 | 11/2014 | Yamazaki et al. | |
| 2014/0339549 A1 | 11/2014 | Yamazaki et al. | |
| 2015/0270402 A1 | 9/2015 | Endo et al. | |
| 2015/0280013 A1 | 10/2015 | Yamazaki et al. | |
| 2015/0372009 A1 | 12/2015 | Yamazaki | |
| 2016/0218219 A1 | 7/2016 | Asami et al. | |
| 2016/0293766 A1 | 10/2016 | Kurata et al. | |
| 2017/0236848 A1 | 8/2017 | Yamazaki | |

FOREIGN PATENT DOCUMENTS

| | | |
|---|---|---|
| JP | 2007-123861 A | 5/2007 |
| JP | 2012-049514 A | 3/2012 |
| JP | 2012-257187 A | 12/2012 |
| JP | 2014-029994 A | 2/2014 |
| JP | 2014-212312 A | 11/2014 |
| JP | 2015-216282 A | 12/2015 |
| KR | 2014-0001117 A | 1/2014 |
| TW | 201501319 | 1/2015 |
| WO | WO-2014/188982 | 11/2014 |

OTHER PUBLICATIONS

Yagishita.A et al., "High Performance Damascene Metal Gate MOSFET's for 0.1 μm Regime", IEEE Transactions on Electron Devices, May 1, 2000, vol. 47, No. 5, pp. 1028-1034.

Hisamoto.D et al., "FinFET.A Self-Aligned Double-Gate MOSFET Scalable to 20 nm", IEEE Transactions on Electron Devices, Dec. 1, 2000, vol. 47, No. 12, pp. 2320-2325.

International Search Report (Application No. PCT/IB2016/050420) dated Apr. 19, 2016.

Written Opinion (Application No. PCT/IB2016/050420) dated Apr. 19, 2016.

* cited by examiner

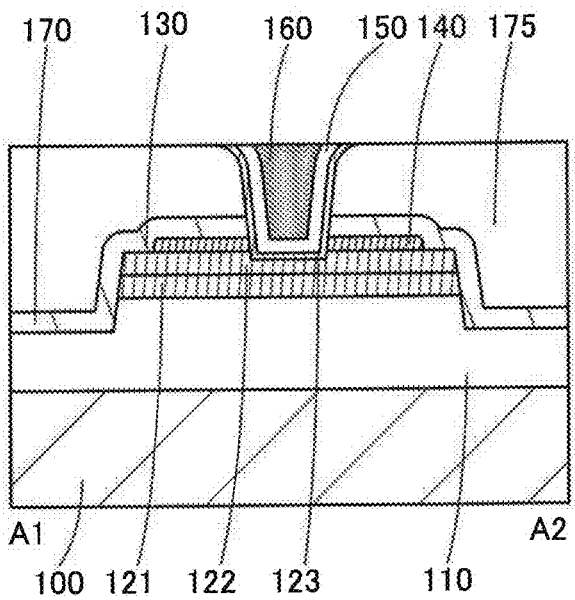
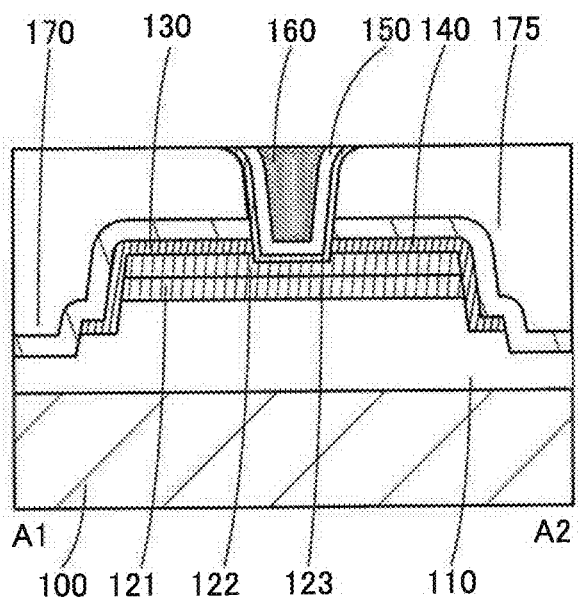

FIG. 8A
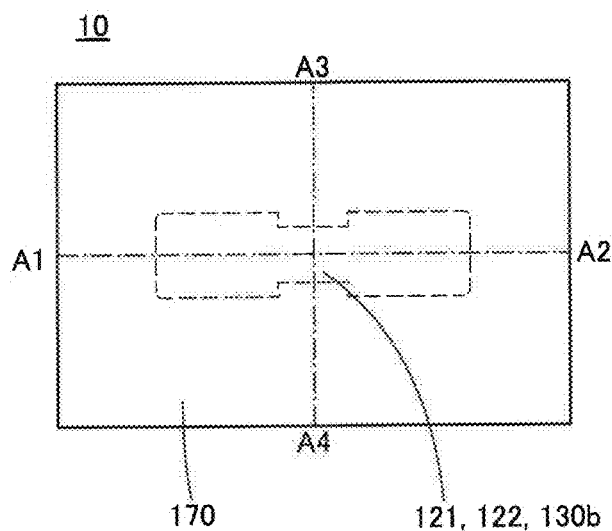
FIG. 8B
FIG. 8C
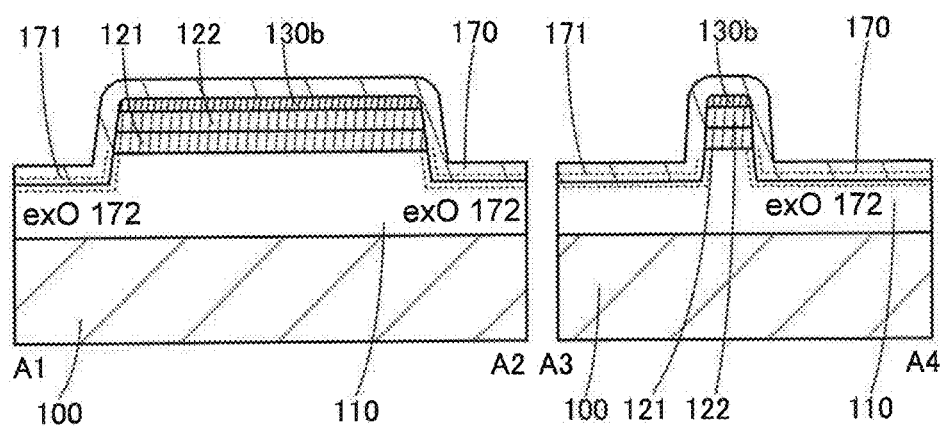

FIG. 23A
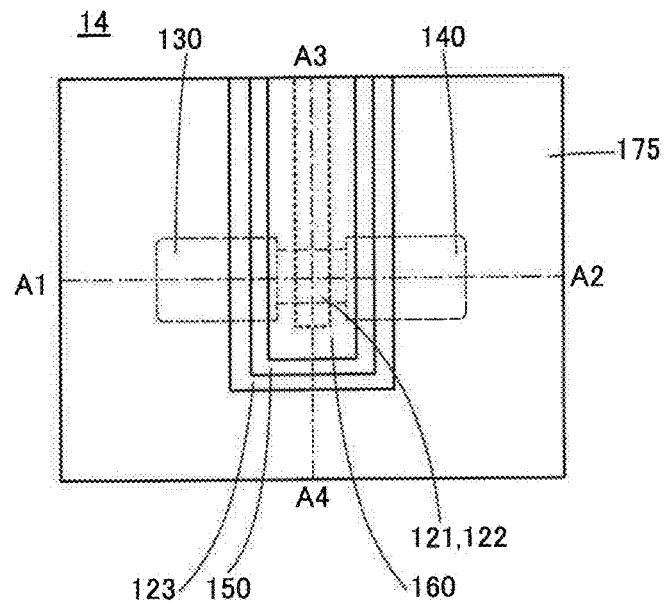
FIG. 23B
FIG. 23C
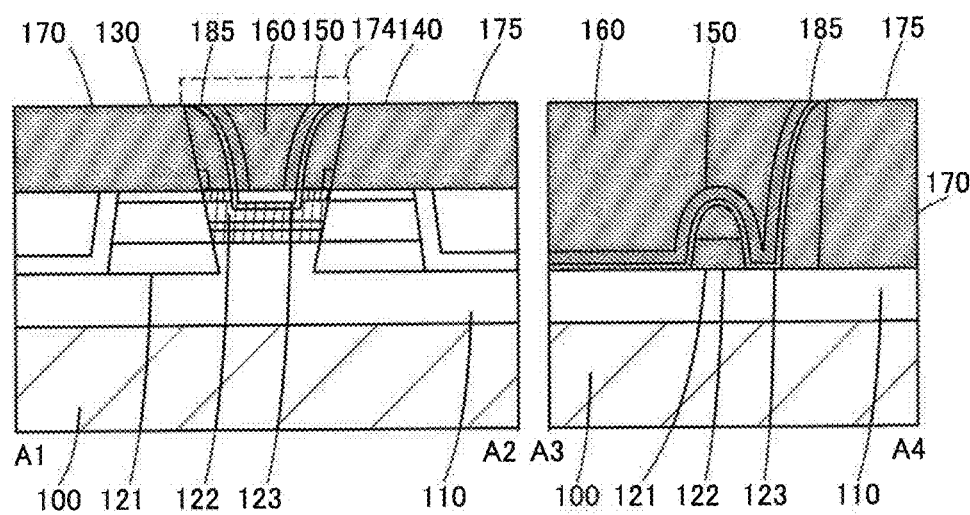

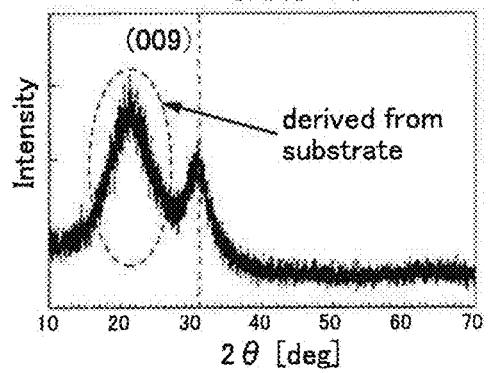
FIG. 26A out-of-plane method CAAC-OS
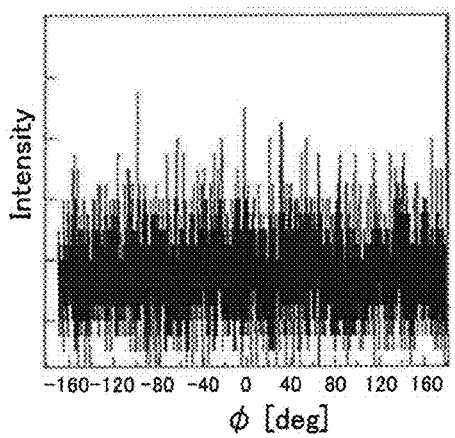
FIG. 26B
in-plane method φ scan
CAAC-OS
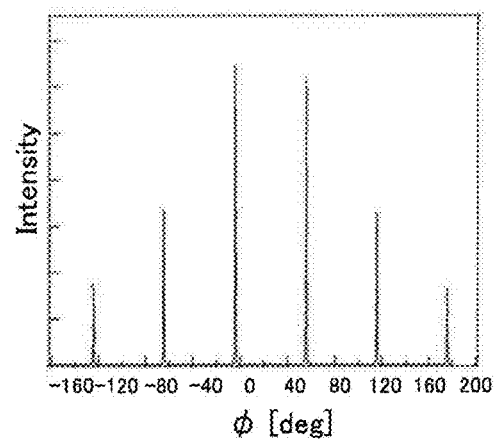
FIG. 26C
in-plane method φ scan
single crystal OS irradiation with electron beam from direction parallel to sample surface irradiation with electron beam from direction perpendicular to sample surface

SEMICONDUCTOR DEVICE AND MANUFACTURING METHOD THEREOF

TECHNICAL FIELD

The present invention relates to an object, a method, or a manufacturing method. Furthermore, the present invention relates to a process, a machine, manufacture, or a composition (a composition of matter). In particular, the present invention relates to, for example, a semiconductor device, a display device, a light-emitting device, a power storage device, an imaging device, a driving method thereof, or a manufacturing method thereof. In particular, one embodiment of the present invention relates to a semiconductor device or a manufacturing method thereof.

In this specification and the like, a semiconductor device generally means a device that can function by utilizing semiconductor characteristics. A transistor and a semiconductor circuit are embodiments of semiconductor devices. A memory device, a display device, or an electronic device includes a semiconductor device in some cases.

BACKGROUND ART

A technique by which a transistor is formed using a semiconductor film formed over a substrate having an insulating surface has been attracting attention. The transistor is applied to a wide range of electronic devices such as an integrated circuit (IC) or an image display device (display device). Although a silicon-based semiconductor material is widely known as a material for a semiconductor thin film applicable to a transistor, an oxide semiconductor has been attracting attention as another material.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

SUMMARY OF THE INVENTION

Problem to be Solved by the Invention

In miniaturization of a semiconductor element, the parasitic capacitance generated in the vicinity of a transistor is a major problem.

In the case where parasitic capacitance exists in a channel (e.g., between a source electrode and a drain electrode) and the vicinity of the channel, a time for charging the parasitic capacitance is needed in the transistor operation; thus, not only the responsiveness of the transistor but the responsiveness of the semiconductor device is lowered.

It becomes more difficult to control various steps of manufacturing transistors (in particular, film formation, processing, and the like) as the miniaturization advances, and variations due to the manufacturing process significantly affect transistor characteristics and reliability.

Furthermore, miniaturization makes patterning difficult owing to the resolution limit of a light exposure apparatus, and such problems in manufacturing a transistor are caused, which leads to huge cost of capital investment.

Thus, an object of one embodiment of the present invention is to reduce the parasitic capacitance in the vicinity of a transistor. Alternatively, one object is to provide a semiconductor device with favorable electrical characteristics. Alternatively, one object is to provide a semiconductor device with high reliability. Alternatively, one object is to provide a transistor in which a pattern with a size equal to or smaller than the resolution limit of a light exposure apparatus can be formed or a manufacturing method of the semiconductor device. Alternatively, one object is to reduce variations in characteristics of a transistor or a semiconductor device that are caused by a manufacturing process. Alternatively, one object is to provide a semiconductor device including an oxide semiconductor layer having few oxygen vacancies. Alternatively, one object is to provide a semiconductor device that can be manufactured in a simple process. Alternatively, one object is to provide a semiconductor device with a structure in which the density of interface states in the vicinity of the oxide semiconductor layer can be reduced. Alternatively, one object is to provide a semiconductor device with low power consumption. Alternatively, one object is to provide a manufacturing method of a novel semiconductor device with less development cost. Alternatively, one object is to provide a novel semiconductor device or the like. Alternatively, one object is to provide a manufacturing method of the semiconductor device.

Note that the descriptions of these objects do not disturb the existence of other objects. In one embodiment of the present invention, there is no need to achieve all the objects. Note that other objects will be apparent from the description of the specification, the drawings, the claims, and the like and can be derived from the description of the specification, the drawings, the claims, and the like.

One embodiment of the present invention is a semiconductor device that includes a first insulating layer, a first oxide semiconductor layer over the first insulating layer, a second oxide semiconductor layer over the first oxide semiconductor layer, a source electrode layer and a drain electrode layer over the second oxide semiconductor layer, a second insulating layer over the first insulating layer, the source electrode layer, and the drain electrode layer, a third insulating layer over the second insulating layer, a third oxide semiconductor layer over the second oxide semiconductor layer, a gate insulating layer over the third oxide semiconductor, and a gate electrode layer over the gate insulating layer. The second insulating layer is an oxygen barrier layer and includes a region in contact with side surfaces of the first oxide semiconductor layer, the second oxide semiconductor layer, the source electrode layer, and the drain electrode layer. The third oxide semiconductor layer includes a region in contact with side surfaces of the second oxide semiconductor layer, the source electrode layer, the drain electrode layer, the second insulating layer, and the third insulating layer.

Another embodiment of the present invention is a semiconductor device that includes a first insulating layer, a first oxide semiconductor layer over the first insulating layer, a second oxide semiconductor layer over the first oxide semiconductor layer, a source electrode layer and a drain electrode layer over the second oxide semiconductor layer, a first conductive layer and a second conductive layer each including a region in contact with a side surface of the second oxide semiconductor layer, a second insulating layer over the first insulating layer, the source electrode layer, and the drain electrode layer, a third insulating layer over the second insulating layer, a third oxide semiconductor layer over the second oxide semiconductor layer, a gate insulating layer over the third oxide semiconductor, a gate electrode layer over the gate insulating layer. The second insulating layer is an oxygen barrier layer. The first electrode layer and the second electrode layer are in contact with the second insulating layer in side surface portions. The third oxide semiconductor layer includes a region in contact with side surface portions of the first insulating layer, the first oxide semiconductor layer, the second oxide semiconductor layer, the source electrode layer, the drain electrode layer, the second insulating layer, and the third insulating layer.

Another embodiment of the present invention is a semiconductor device that includes a first insulating layer, a first oxide semiconductor layer over the first insulating layer, a second oxide semiconductor layer over the first oxide semiconductor layer, a source electrode layer and a drain electrode layer over the second oxide semiconductor layer, a second insulating layer over the first insulating layer, the source electrode layer, and the drain electrode layer, a third insulating layer over the second insulating layer, a fourth insulating layer over the source electrode layer and the drain electrode layer and in contact with side surfaces of the second insulating layer and the third insulating layer, a third oxide semiconductor layer over the second oxide semiconductor layer, a gate insulating layer over the third oxide semiconductor, and a gate electrode layer over the gate insulating layer. The second insulating layer is an oxygen barrier layer and includes a region in contact with side surfaces of the first oxide semiconductor layer, the second oxide semiconductor layer, the source electrode layer, and the drain electrode layer. The third oxide semiconductor layer includes a region in contact with side surfaces of the first insulating layer, the first oxide semiconductor layer, the second oxide semiconductor layer, the source electrode layer, the drain electrode layer, the fourth insulating layer.

An aluminum oxide layer is preferably used as the second insulating layer.

Another embodiment of the present invention includes a first conductive layer, a first insulating layer over the first conductive layer, a first oxide semiconductor layer over the first insulating layer, a second oxide semiconductor layer over the first oxide semiconductor layer, a source electrode layer and a drain electrode layer over the second oxide semiconductor layer, a second insulating layer over the first insulating layer, the source electrode layer, and the drain electrode layer, a third insulating layer over the second insulating layer, a third oxide semiconductor layer over the second oxide semiconductor layer, a gate insulating layer over the third oxide semiconductor, a gate electrode layer over the gate insulating layer, a fourth insulating layer over the third insulating layer, the third oxide semiconductor layer, the gate insulating layer, and the gate electrode layer. The second insulating layer is an oxygen barrier layer and in contact with side surfaces of the first oxide semiconductor layer, the second oxide semiconductor layer, the source electrode layer, and the drain electrode layer. The third oxide semiconductor layer includes a region in contact with side surfaces of the side surface portions of the first insulating layer, the first oxide semiconductor layer, the second oxide semiconductor layer, the source electrode layer, the drain electrode layer, the second insulating layer, and the third insulating layer. The fourth insulating layer is an oxygen barrier layer.

As each of the second insulating layer and the fourth insulating layer, an aluminum oxide film is preferably used.

Another embodiment of the present invention is a manufacturing method of a semiconductor device including the steps of: forming a first insulating layer, forming a first oxide semiconductor film over the first insulating layer, forming a second oxide semiconductor film over the first oxide semiconductor film, performing first heat treatment, forming a first conductive film over the second oxide semiconductor film, partly etching the first oxide semiconductor film and the second oxide semiconductor film with a first mask and the first conductive film to form a first oxide semiconductor layer and a second oxide semiconductor layer into island shapes, forming a second insulating layer over the first insulating layer and the first conductive film, forming a mixed layer of the first insulating layer and the second insulating film, and at the same time, adding oxygen to the mixed layer or the first insulating layer when the second insulating layer is formed, performing second heat treatment to diffuse the oxygen into the second oxide semiconductor layer, forming a third insulating film over the second insulating layer, performing planarization treatment on the third insulating layer to form a third insulating layer, selectively etching the third insulating layer and the second insulating layer with a second mask, selectively etching the first conductive film with the second mask and the second insulating layer to form a source electrode layer and a drain electrode layer, forming a third oxide semiconductor film over the third insulating layer and the second oxide semiconductor layer, forming a fourth insulating film over the third oxide semiconductor film, forming a second conductive film over the fourth insulating film, and performing chemical mechanical polishing treatment on the second conductive film, the third insulating film, and the third oxide semiconductor film to form a third oxide semiconductor layer, a gate insulating layer, and a gate electrode layer.

Another embodiment of the present invention is a manufacturing method of a semiconductor device including the steps of: forming a first insulating layer, forming a first oxide semiconductor film over the first insulating layer, forming a second oxide semiconductor film over the first oxide semiconductor film, performing first heat treatment, forming a first conductive film over the second oxide semiconductor film, selectively etching the first oxide semiconductor film and the second oxide semiconductor film with a first mask and the first conductive film to form a first oxide semiconductor layer and a second oxide semiconductor layer into island shapes, forming a second insulating film over the first insulating layer and the first conductive film, forming a mixed layer of the first insulating layer and the second insulating film and adding oxygen to the mixed layer or the first insulating layer when the second insulating film is formed, performing second heat treatment to diffuse the oxygen into the second oxide semiconductor layer, and to reduce oxygen vacancies in the second oxide semiconductor layer, forming a third insulating film over the second insulating film, performing planarization treatment on the third insulating film, partly etching the third insulating film and the second insulating film with a second mask to form a third insulating layer and a second insulating layer, forming a fourth insulating film over the first conductive layer and the third insulating layer, anisotropically etching to form a fourth insulating layer in contact with side surfaces of the second insulating layer and the third insulating layer, partly etching the first conductive film using the fourth insulating layer as a mask to form a source electrode layer and a drain electrode layer, forming a third oxide semiconductor film over the third insulating layer and the second oxide semiconductor layer, forming a fifth insulating film over the third oxide semiconductor film, forming a second conductive film over the fifth insulating film, performing chemical mechanical polishing treatment on the second conductive film, the third insulating film, and the third oxide semiconductor film to form a third oxide semiconductor layer, a gate insulating layer, and a gate electrode layer.

The second insulating film is preferably formed by a sputtering method with an oxygen gas.

The second insulating film is preferably formed over a silicon oxide film by a sputtering method using an aluminum oxide target under a condition where oxygen of 50 vol % or higher is included.

It is preferable that the second heat treatment be performed at a temperature higher than or equal to 300° C. and lower than or equal to 450° C.

A structure including the semiconductor device, a microphone, a speaker, and a housing can be used.

Effect of the Invention

According to one embodiment of the present invention, the parasitic capacitance in the vicinity of a transistor can be reduced. Alternatively, a semiconductor device with favorable electrical characteristics can be provided. Alternatively, a highly reliable semiconductor device can be provided. Alternatively, a manufacturing method of a transistor or a semiconductor device in which patterning below the resolution limit of a light-exposure apparatus can be performed can be provided. Alternatively, variations in characteristics of a transistor or semiconductor device that are caused by a manufacturing process can be reduced. Alternatively, a semiconductor device including an oxide semiconductor layer having few oxygen vacancies can be provided. Alternatively, a semiconductor device that can be manufactured in a simple process can be provided. Alternatively, a semiconductor device with a structure in which the density of interface states in the vicinity of the oxide semiconductor layer can be reduced can be provided. Alternatively, a semiconductor device with low power consumption can be provided. Alternatively, a manufacturing method of a novel semiconductor device with less development cost can be provided. Alternatively, a novel semiconductor device or the like can be provided. Alternatively, a manufacturing method of the semiconductor device can be provided.

Note that the description of these effects does not preclude the existence of other effects. Note that one embodiment of the present invention does not necessarily achieve all the effects. Other effects will be apparent from the description of the specification, the drawings, the claims, and the like and can be derived from the description of the specification, the drawings, the claims, and the like.

BRIEF DESCRIPTION OF THE DRAWINGS

FIG. 3 A top view and cross-sectional views illustrating a transistor.

FIG. 8 A top view and cross-sectional views illustrating a manufacturing method of a transistor.

FIG. 23 A top view and cross-sectional views illustrating a manufacturing method of a transistor.

FIG. 26 Views illustrating structural analysis of a CAAC-OS and a single crystal oxide semiconductor by XRD.

MODE FOR CARRYING OUT THE INVENTION

Figure 1A:
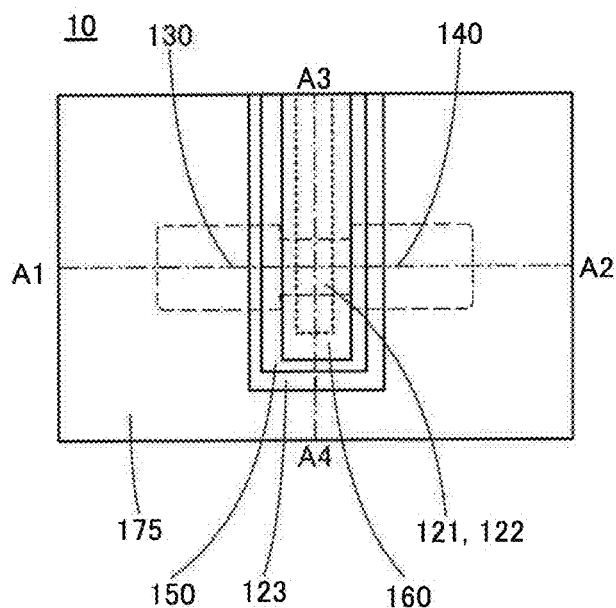
FIG. 1 A top view and cross-sectional views illustrating a transistor.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and repeated description thereof is omitted in some cases. It is also to be noted that hatching patterns of the same components constituting drawings are omitted or made different in different drawings as appropriate in some cases.

For example, in this specification and the like, an explicit description "X and Y are connected" means that the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, another connection relationship is shown in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element (e.g., a switch, a transistor, a capacitor, an inductor, a resistor, a diode, a display element, a light-emitting element, and a load) that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting (on state) or not conducting (off state) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit (an inverter, a NAND circuit, NOR circuit, or the like); a signal converter circuit (a D/A converter circuit, an A/D converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, when it is explicitly described that "X and Y are electrically connected", the description is the same as the case where it is explicitly only described that "X and Y are connected" in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has both functions of components of the wiring and the electrode. Thus, electrical connection in this specification includes in its category such a case where one conductive film has functions of a plurality of components.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and repeated description thereof is omitted.

<Notes on the Description for Drawings>

Note that in this specification, terms for describing arrangement, such as "over" "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification, the term "parallel" indicates that the angle formed between two straight lines is greater than or equal to −10° and less than or equal to 10°. Accordingly, it also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°. Accordingly, it also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings.

In drawings such as a top view (also referred to as a plan view or a layout view) and a perspective view, some of components might not be illustrated for clarity of the drawings.

"Being the same" may refer to having the same area or having the same shape. In addition, being substantially the same can also be referred to as being the same because exactly the same shape is not obtained depending on a manufacturing process.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

In this specification and the like, a structure in which an FPC (Flexible Printed Circuits), a TCP (Tape Carrier Package), or the like is attached to a substrate of a display panel, or a structure in which an IC (integrated circuit) is directly mounted on a substrate by a COG (Chip On Glass) method is referred to as a display device in some cases.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms in this specification and the like.

In this specification, the term "trench" or "groove" refers to a depression with a narrow belt shape.

In this specification, in the case where a silicon oxynitride is shown as a film, it is described as $SiO_xN_y$, for example. At this time, x and y may be natural numbers or decimals.

<Connection>

Note that in this specification, description that "A and B are connected to each other" includes a case where A and B are electrically connected to each other in addition to a case where A and B are directly connected to each other. Here, the expression "A and B are electrically connected" means the case where electric signals can be transmitted and received between A and B when an object having any electric action exists between A and B.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with text disclosed in this specification.

Note that by combining a diagram (or may be part thereof) illustrated in one embodiment with another part of the diagram, a different diagram (or may be part thereof) illustrated in the embodiment, and/or a diagram (or may be part thereof) illustrated in one or a plurality of different embodiments, much more diagrams can be formed.

(Embodiment 1)

In this embodiment, a semiconductor device of one embodiment of the present invention and a manufacturing method thereof will be described with reference to drawings.

Figure 1B:
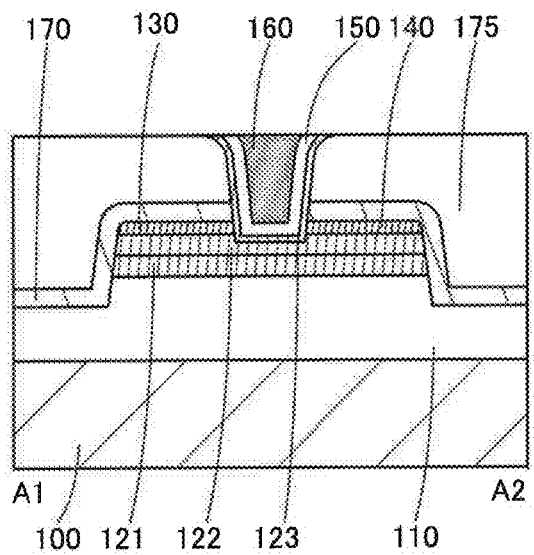
Figure 1C:
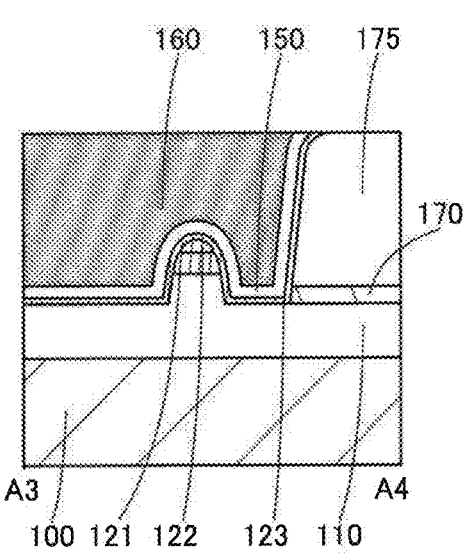

FIG. 1(A), FIG. 1(B), and FIG. 1(C) are a top view and cross-sectional views which illustrate a transistor 10 of one embodiment of the present invention. FIG. 1(A) is a top view, FIG. 1(B) is a cross-sectional view taken along the dashed-dotted line A1-A2 in FIG. 1(A), and FIG. 1(C) is a cross-sectional view taken along the dashed-dotted line A3-4. In FIG. 1(A), some components are scaled up or down or omitted for simplification of the drawing. In some cases, the direction of dashed-dotted line A1-A2 is referred to as a channel length direction, and the direction of dashed-dotted line A3-A4 is referred to as a channel width direction.

The transistor 10 includes a substrate 100, an insulating layer 110, an oxide semiconductor layer 121, an oxide semiconductor layer 122, an oxide semiconductor layer 123, a source electrode layer 130, a drain electrode layer 140, a gate insulating layer 150, a gate electrode layer 160, an insulating layer 170, and an insulating layer 175. The insulating layer 110 is formed over the substrate 100. The oxide semiconductor layer 121 is formed over the insulating layer 110. The oxide semiconductor layer 122 is formed over the oxide semiconductor layer 121. The source electrode layer 130 and the drain electrode layer 140 are formed over the oxide semiconductor layer 122 and electrically connected to the oxide semiconductor layer 122. The insulating layer 170 is formed over the insulating layer 110, the source electrode layer 130, and the drain electrode layer 140, and is in contact with side surfaces of the oxide semiconductor layer 121 and the oxide semiconductor layer 122. The insulating layer 175 is formed over the insulating layer 170 and is in contact with the oxide semiconductor layer 123 in a side surface portion. The oxide semiconductor layer 123 is formed over the oxide semiconductor layer 122. In addition, the oxide semiconductor layer 123 is in contact with a side surface of the insulating layer 170, a side surface of the insulating layer 175, a side surface of the source electrode layer 130, and a side surface of the drain electrode layer 140. The gate insulating layer 150 is formed over the oxide semiconductor layer 123. The gate electrode layer 160 is formed over the gate insulating layer 150.

Although an example where the gate electrode layer 160 is a single layer is illustrated in FIG. 1(B), it may be a stacked layer of a gate electrode layer 161 and a gate electrode layer 162, which will be described later. End portions of the oxide semiconductor layer 123 and the gate insulating layer 150 included in the transistor 10 are located on the outer side of the gate electrode layer 160. The structure described above has a high heat dissipation effect: heat generated in the oxide semiconductor layer 121, the oxide semiconductor layer 122, and the oxide semiconductor layer 123 by the operation of the transistor 10 can be sufficiently released because the oxide semiconductor layer 122 and the oxide semiconductor layer 123 are in contact with the source electrode layer 130 and the drain electrode layer 140.

In the transistor 10, when a second insulating film to be the insulating layer 170 is formed, a mixed layer including a material of the insulating layer 110 and a material of the second insulating film, a gas used during formation of the second insulating film, and the like is formed at the interface with the insulating layer 110, and oxygen (excess oxygen, referred to as exO) is added to the mixed layer or the insulating layer 110. Furthermore, with heat treatment, the oxygen can be diffused to the oxide semiconductor layer 121 and the oxide semiconductor layer 122 and oxygen vacancies that exist in the oxide semiconductor layer 121 and the oxide semiconductor layer 122 can be filled with the oxygen. Thus, transistor characteristics (e.g., a threshold voltage or reliability) can be improved.

Note that the excess oxygen that is added during the formation of the second insulating film exists in a variety of states such as an oxygen radical, an oxygen ion, or an oxygen atom owing to the influence of voltage, power, or plasma applied during the formation by a sputtering method, substrate temperature, or the like, for example. At this time, the excess oxygen is in a state of having higher energy than a stable state and thus can be taken into the insulating layer 110.

Note that the method of adding oxygen is not limited to the above method, and the insulating layer 110 may contain the excess oxygen during formation, or another method (e.g., an ion implantation method or an ion plasma immersion method) may be employed after the formation.

In the transistor 10, in the channel width direction, the gate electrode layer 160 faces the side surfaces of the oxide semiconductor layer 121, the oxide semiconductor layer 122, and the oxide semiconductor layer 123 with the gate insulating layer 150 provided therebetween as illustrated in the cross-sectional view in FIG. 1(C) taken along line A3-A4. In other words, the oxide semiconductor layer 121, the oxide semiconductor layer 122, and the oxide semiconductor layer 123 are surrounded by electric field of the gate electrode layer 160 in the channel width direction when voltage is applied to the gate electrode layer 160. The transistor structure in which a semiconductor layer is surrounded by electric field of the gate electrode layer 160 is referred to as a surrounded channel (s-channel) structure. Furthermore, the gate electrode, the source electrode, and the drain electrode of the transistor 10 can be formed with the use of a groove in a self-aligned manner; thus, alignment accuracy can be excellent and minute transistors can be easily manufactured. Note that such a structure is referred to as a self-aligned s-channel FET (Self Align s-channel FET, SA s-channel FET) structure, a trench-gate s-channel FET (Trench gate s-channel FET) structure, a TGSA FET (Trench Gate Self Align) structure, or a GLSA FET (Gate-Last Self-Aligned FET).

Here, in the case where the oxide semiconductor layer 121, the oxide semiconductor layer 122, and the oxide semiconductor layer 123 are collectively referred to as an oxide semiconductor layer 120, when the transistor having the SA s-channel structure is in an on state, a channel is formed in the entire oxide semiconductor layer 120 (bulk), so that the on-state current increases. On the other hand, when in the off state, the entire region of the channel region formed in the oxide semiconductor layer 120 is depleted, and thus the off-state current can be further reduced.

With such a structure, when the oxide semiconductor layer 123, the gate insulating layer 150, and the gate electrode layer 160 are formed in the groove portion 174, the embeddability of each film can be improved, and the transistor 10 can be easily manufactured.

In addition, the transistor 10 has the TGSA structure, whereby parasitic capacitance generated between the gate electrode and the source electrode or between the gate electrode and the drain electrode is reduced, and the cut-off frequency characteristics of the transistor 10 are improved. That is, high-speed response of the transistor 10 can be achieved.

Note that the position of the top surface of the source electrode layer 130 or the drain electrode layer 140 may be below, at the same level as, or above the position of the bottom surface of the gate electrode layer 160.

Figure 2A:
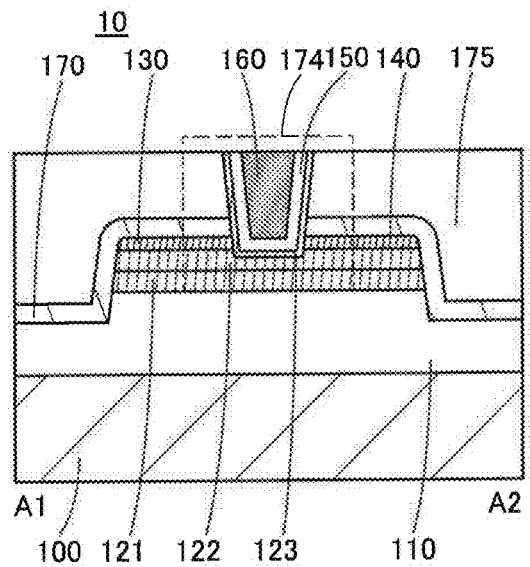
FIG. 2 A top view and cross-sectional views illustrating a transistor.
Figure 2B:
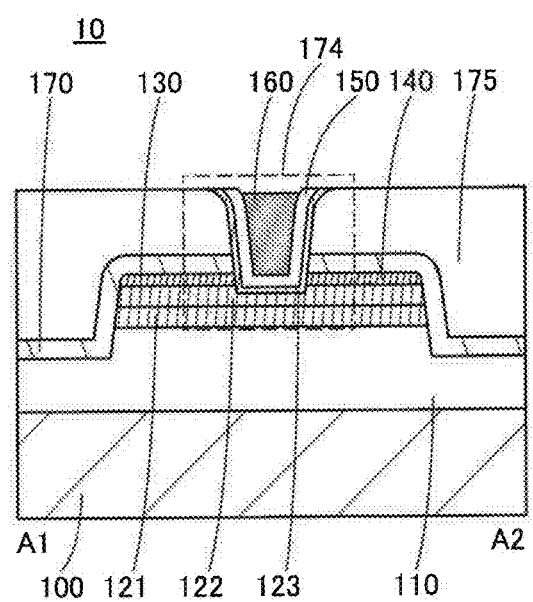
Figure 2C:
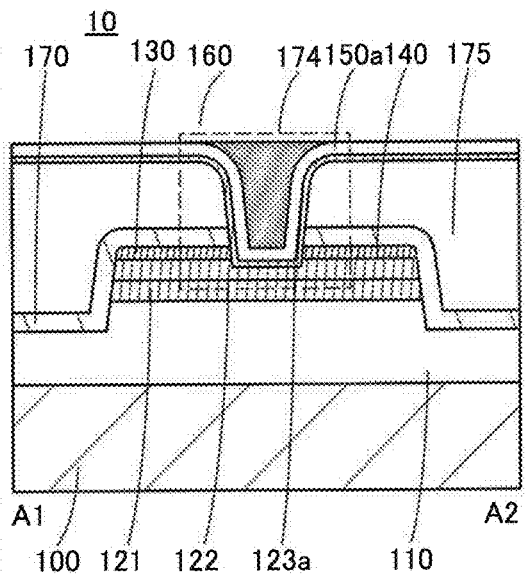

In addition, in the transistor 10, the groove portion 174 in FIG. 2(A) may have a linear shape. Alternatively, as illustrated in the transistor FIG. 2(B), the top surface of the gate electrode layer 160 may be located below the top surface of the insulating layer 175. Alternatively, in the transistor 10, planarization treatment is not necessarily performed on the insulating film 150a and the third oxide semiconductor film 123a as illustrated in FIG. 2(C). Alternatively, in the transistor 10, as illustrated in FIG. 3(A), end portions of the source electrode layer 130 and the drain electrode layer may be shorter or longer than the oxide semiconductor layer 122.

<Channel Length>

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that in one transistor, channel lengths in all regions not necessarily have the same value. In other words, the channel length of one transistor is not fixed to one value in some cases. Therefore, in this specification, the channel length is any one of values, the maximum value, the minimum value, or the average value in a region where a channel is formed.

<Channel Width>

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. Note that on one transistor, channel lengths in all regions not necessarily have the same value. In other words, the channel length of one transistor is not fixed to one value in some cases. Therefore, in this specification, the channel length is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

<About SCW>

Therefore, in this specification, in a top view of a transistor, an apparent channel width in a region where a semiconductor and a gate electrode overlap with each other is referred to as a "surrounded channel width (SCW: Surrounded Channel Width)" in some cases. Further, in this specification, in the case where the term channel width is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<Improvement of Characteristics in Miniaturization>

High integration of a semiconductor device requires miniaturization of a transistor. However, it is known that miniaturization of a transistor causes deterioration of electrical characteristics of the transistor, and a decrease in channel width causes a reduction in on-state current.

For example, as described above, the transistor of one embodiment of the present invention shown in FIG. 1 has a structure in which the third oxide semiconductor layer 123 is formed so as to cover the oxide semiconductor layer 122 where a channel is formed and the channel formation layer and the gate insulating layer are not in contact with each other. Accordingly, scattering of carriers at the interface between the channel formation layer and the gate insulating layer can be reduced and the on-state current of the transistor can be increased.

In the transistor of one embodiment of the present invention, the gate electrode layer 160 is formed to electrically surround the oxide semiconductor layer 122, which is to be a channel, in the channel width direction; accordingly, a gate electric field is applied to the oxide semiconductor layer 1223 in the side surface direction in addition to the perpendicular direction. In other words, a gate electric field is applied to the oxide semiconductor layer entirely, so that current flows in the whole of the oxide semiconductor layer 122, leading to a further increase in on-state current.

The transistor of one embodiment of the present invention has an effect of suppressing formation of interface states by forming the oxide semiconductor layer 123 over the oxide semiconductor layer 121 and the oxide semiconductor layer 122, an effect of eliminating an influence of an impurity that enters from above and below by positioning the oxide semiconductor layer 122 at the middle, and the like as well. Therefore, the transistor can achieve stabilization of the threshold voltage and a reduction in the S value (subthreshold value) in addition to the increase in the on-state current. Thus, Icut (current when gate voltage VG is 0 V) can be reduced and power consumption can be reduced. In addition, since the threshold voltage of the transistor becomes stable, long-term reliability of the semiconductor device can be improved.

Although an example where a channel or the like is used in the oxide semiconductor layer 120 or the like is described in this embodiment, one embodiment of the present invention is not limited thereto. For example, depending on circumstances or conditions, a channel, the vicinity of the channel, a source region, a drain region, or the like may be formed using a material containing silicon (including strained silicon), germanium, silicon germanium, silicon carbide, gallium arsenide, aluminum gallium arsenide, indium phosphide, gallium nitride, an organic semiconductor, or the like.

<Structure of Transistor>

A structure of a transistor of this embodiment will be described below.

<<Substrate 100>>

A glass substrate, a ceramic substrate, a quartz substrate, a sapphire substrate, or the like can be used as the substrate 100. Alternatively, a single crystal semiconductor substrate or a polycrystalline semiconductor substrate of silicon, silicon carbide, or the like, a compound semiconductor substrate of silicon germanium or the like, an SOI (Semiconductor-On-Insulator) substrate, or the like may be used, and any of these substrates provided with a semiconductor element may be used. The substrate 100 is not limited to a simple supporting substrate, and may be a substrate where a device such as a transistor is formed. In that case, one of the gate electrode layer 160, the source electrode layer 130, and the drain electrode layer 140 of the transistor may be electrically connected to the above another device.

Alternatively, a flexible substrate may be used as the substrate 100. As a method for providing the transistor over a flexible substrate, there is a method in which the transistor is formed over a non-flexible substrate and then the transistor is separated and transferred to the substrate 100 that is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 µm and less than or equal to 700 µm, preferably greater than or equal to 10 µm and less than or equal to 500 µm, or further preferably greater than or equal to 15 µm and less than or equal to 300 µm. When the substrate 100 is thinned, the weight of the semiconductor device can be reduced. When the substrate 100 is thinned, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 100 because of its low coefficient of linear expansion.

<<Insulating Layer 110>>

The insulating layer 110 can have a function of supplying oxygen to the oxide semiconductor layer 120 as well as a function of preventing diffusion of impurities from the substrate 100. For this reason, the insulating layer 110 is preferably an insulating film containing oxygen, further preferably an insulating film having an oxygen content higher than that in the stoichiometric composition. For example, the insulating layer 110 is a film of which the amount of released oxygen when converted into oxygen atoms is $1.0\times10^{19}$ atoms/cm$^3$ or more in TDS analysis. Note that the temperature of the film surface in the TDS analysis is preferably higher than or equal to 100° C. and lower than or equal to 700° C., or higher than or equal to 100° C. and lower than or equal to 500° C. In the case where the substrate 100 is a substrate over which another device is formed as described above, the insulating layer 110 also has a function of an interlayer insulating film. In that case, planarization treatment such as CMP (chemical mechanical polishing) treatment is preferably performed so as to have a flat surface.

<<Oxide Semiconductor Layers 121, 122, and 123>>

The oxide semiconductor layer 122 is an oxide semiconductor film containing In or Zn and typically contains In—Ga oxide, In—Zn oxide, In—Mg oxide, Zn—Mg oxide, or an In—M—Zn oxide (M is Al, Ti, Ga, Y, Zr, Sn, La, Ce, Mg, or Nd).

An oxide semiconductor that can be used for each of the oxide semiconductor layer 121, the oxide semiconductor layer 122, and the oxide semiconductor layer 123 preferably contains at least indium (In) or zinc (Zn). Alternatively, both In and Zn are preferably contained. In order to reduce variations in electrical characteristics of the transistors including the oxide semiconductor, a stabilizer is preferably contained in addition to them.

As a stabilizer, gallium (Ga), tin (Sn), hafnium (Hf), aluminum (Al), zirconium (Zr), or the like can be used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

Note that when the oxide semiconductor layer 123 is an In—M—Zn oxide, the atomic ratio of In to M is preferably as follows: the proportion of In atoms be higher than or equal to 25 atomic % and the proportion of M atoms be lower than 75 atomic %, and it is further preferably as follows: the proportion of In atoms be higher than or equal to 34 atomic % and the proportion of M atoms be lower than 66 atomic %.

The indium and gallium contents in the oxide semiconductor layer 123 can be compared with each other by time-of-flight secondary ion mass spectrometry (TOF-SIMS), X-ray photoelectron spectrometry (XPS), or ICP mass spectrometry (ICP-MS).

Since the oxide semiconductor layer 122 has an energy gap of 2 eV or more, preferably 2.5 eV or more, and further preferably 3 eV or more, the off-state current of the transistor 10 can be low.

The thickness of the oxide semiconductor layer 122 is greater than or equal to 3 nm and less than or equal to 200 nm, preferably greater than or equal to 3 nm and less than or equal to 100 nm, and further preferably greater than or equal to 3 nm and less than or equal to 50 nm.

Each of the oxide semiconductor layer 121 and the oxide semiconductor layer 123 is an oxide semiconductor film including one or more elements contained in the oxide semiconductor layer 122. Thus, interface scattering is unlikely to occur at the interfaces between the oxide semiconductor layer 122 and the oxide semiconductor layer 122 and between the oxide semiconductor layer 122 and the oxide semiconductor layer 124. The movement of carriers is not hindered at the interfaces and accordingly, the transistor 10 can have high field-effect mobility.

Each of the oxide semiconductor layers 121 and 123 is typically In—Ga oxide, In—Zn oxide, In—Mg oxide, Ga—Zn oxide, Zn—Mg oxide, or an In—M—Zn oxide (M is Al, Ti, Ga, Y, Zr, Sn, La, Ce, Mg, or Nd), and has the energy level at the conduction band minimum that is closer to a vacuum level than the energy level at the conduction band minimum of the oxide semiconductor layer 122 is. Typically, a difference between the energy level at the conduction band minimum of the oxide semiconductor layer 122 and the energy level at the conduction band minimum of each of the oxide semiconductor layer 121 and the oxide semiconductor layer 123 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. That is, the difference between the electron affinity of the oxide semiconductor layer 122 and the electron affinity of each of the oxide semiconductor layers 121 and 123 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the electron affinity refers to an energy difference between the vacuum level and the conduction band minimum.

When the oxide semiconductor layer 121 and the oxide semiconductor layer 123 each contain a larger amount of Al, Ti, Ga, Y, Zr, Sn, La, Ce, Mg, Hf, or Nd in an atomic ratio than the amount of In in an atomic ratio, any of the following effects may be obtained in some cases. (1) The energy gap of each of the oxide semiconductor layer 121, the oxide semiconductor layer 122, and the oxide semiconductor layer 124 is widened. (2) The electron affinity of each of the oxide semiconductor layer 121 and the oxide semiconductor layer 123 is reduced. (3) Impurities from the outside are blocked. (4) Insulating properties are higher than that of the oxide semiconductor layer 122. (5) Oxygen vacancies are less likely to be generated in the insulator 121 and the insulator 123 each containing a larger amount of Al, Ti, Ga, Y, Zr, Sn, La, Ce, Mg, or Nd in an atomic ratio than the amount of In in an atomic ratio because Al, Ti, Ga, Y, Zr, Sn, La, Ce, Mg, and Nd is a metal element that can be strongly bonded to oxygen.

Since the oxide semiconductor layer 121 and the oxide semiconductor layer 123 have higher insulating properties than the oxide semiconductor layer 122, they each have a function similar to that of the gate insulating layer.

When each of the oxide semiconductor layer 121 and the oxide semiconductor layer 123 is an In—M—Zn oxide, without taking Zn and O into consideration, the atomic proportion of In and that of M are preferably set to less than or equal to 50 atomic % and greater than or equal to 50 atomic %, respectively, further preferably less than or equal to 25 atomic % and greater than or equal to 75 atomic %, respectively.

Further, in the case where the oxide semiconductor layer 121 and the oxide semiconductor layer 123 are each an In—M—Zn oxide (M is Al, Ti, Ga, Y, Zr, Sn, La, Ce, Mg, or Nd), the atomic proportion of M (Al, Ti, Ga, Y, Zr, Sn, La, Ce, Mg, or Nd) in each of the oxide semiconductor layer 121 and the oxide semiconductor layer 123 is higher than that in the oxide semiconductor layer 122. Typically, the atomic proportion of M in each of the oxide semiconductor layer 121 and the oxide semiconductor layer 123 is higher than or equal to 1.5 times, preferably higher than or equal to twice, further preferably higher than or equal to three times as high as that in the oxide semiconductor layer 123. Any of the above-described elements represented by M is more strongly bonded to oxygen than indium is, and thus has a function of suppressing generation of oxygen vacancies in the oxide semiconductor layer 121 and the oxide semiconductor layer 123. That is, oxygen vacancies are less likely to be generated in the oxide semiconductor layer 121 and the oxide semiconductor layer 123 than in the oxide semiconductor layer 122.

Alternatively, the indium content in the oxide semiconductor layer 122 is preferably higher than those in the oxide semiconductor layer 121 and the oxide semiconductor layer 123. In an oxide semiconductor, an s orbital of heavy metal mainly contributes to carrier transfer, and when the proportion of In in the oxide semiconductor is increased, overlap of s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 122, a transistor having high field-effect mobility can be obtained.

In the case where the oxide semiconductor layer 122 is an In—M—Zn oxide (M is Al, Ti, Ga, Y, Zr, Sn, La, Ce, Mg or Nd) and a target having the atomic ratio of metal elements of In:M:Zn=$x_1$:$y_1$:$z_1$ is used for forming the oxide semiconductor layer 122, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS (C-Axis Aligned Crystalline Oxide Semiconductor) film is easily formed as the oxide semiconductor layer 122. Typical examples of the atomic ratio of metal elements of the target include In:M:Zn=1:1:1, 1:1:1.2, 2:1:1.5, 2:1:2.3, 2:1:3, 3:1:2, 4:2:3, and 4:2:4.1.

In the case where the oxide semiconductor layer 12*l* and the oxide semiconductor layer 123 include In—M—Zn oxide (M is Al, Ti, Ga, Y, Zr, Sn, La, Ce, Mg, or Nd) and a target having the atomic ratio of metal elements of In:M:Zn=$x_2$:$y_2$:$z_2$ is used for forming the oxide semiconductor layer 121 and the oxide semiconductor layer 123, it is preferable that $x_2/y_2 < x_1/y_1$, and $z_2/y_2$ is preferably greater than or equal to ⅓ and less than or equal to 6 and further preferably greater than or equal to 1 and less than or equal to 6. Note that when $z_2/y_2$ is greater than or equal to 1 and less than or equal to 6, CAAC-OS films are easily formed as the oxide semiconductor layer 121 and the oxide semiconductor layer 123. As typical examples of the atomic ratio of metal elements of the target, In:M:Zn=1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, 1:6:8, 1:6:4, 1:9:6, and the like are given.

In each of the oxide semiconductor layer 121 and the oxide semiconductor layer 123, the proportion of each atom in the above-described atomic ratio varies within a range of ±40% as an error in some cases.

Alternatively, the oxide semiconductor layer 123 can be metal oxide, such as aluminum oxide ($AlO_x$), gallium oxide ($GaO_x$), hafnium oxide ($HfO_x$), silicon oxide ($SiO_x$), germanium oxide ($GeO_x$), or zirconia oxide ($ZrO_x$); or the metal oxide may be provided over the oxide semiconductor layer 123.

Note that the atomic ratio is not limited to the above, and the atomic ratio may be appropriately set in accordance with needed semiconductor characteristics.

Alternatively, the oxide semiconductor layer 121 and the oxide semiconductor layer 123 may have the same composition. For example, the oxide semiconductor layer 121 and the oxide semiconductor layer 123 may be an In—Ga—Zn oxide with an atomic ratio of the metal elements in a target used in a sputtering method being In:Ga:Zn=1:3:2, 1:3:4, or 1:4:5.

Alternatively, the oxide semiconductor layer 121 and the oxide semiconductor layer 123 may have different compositions. For example, the oxide semiconductor layer 121 may be an In—Ga—Zn oxide with an atomic ratio of the metal elements in a target used in a sputtering method being In:Ga:Zn=1:3:4, and the oxide semiconductor layer 123 may be an In—Ga—Zn oxide with an atomic ratio of the metal elements in a target used in a sputtering method being In:Ga:Zn=1:3:2.

The thickness of each of the oxide semiconductor layer 121, the oxide semiconductor layer 122, and the oxide semiconductor layer 123 is preferably greater than or equal to 3 nm and less than or equal to 100 nm or greater than or equal to 3 nm and less than or equal to 50 nm.

Here, the thickness of the oxide semiconductor layer 122 may be less than, equal to, or greater than that of at least the oxide semiconductor layer 121. If the thickness of the oxide semiconductor layer 122 is large, the on-state current of the transistor can be increased. The thickness of the oxide semiconductor layer 121 may be a thickness such that an effect of suppressing the formation of an interface state at the interface with the semiconductor layer 122 is not lost. For example, the thickness of the oxide semiconductor layer 122 is larger than the thickness of the oxide semiconductor layer 121, 2 or more times, further preferably 4 or more times, still further preferably 6 or more times as large as that of the oxide semiconductor layer 121. In the case where there is no need to increase the on-state current of the transistor, the thickness of the oxide semiconductor layer 121 may be greater than or equal to the thickness of the oxide semiconductor layer 122. For example, in the case where the insulating layer 110 or 175 contains excess oxygen, the oxygen is diffused by heat treatment and the amount of oxygen vacancies in the semiconductor layer 122 can be reduced, which leads to stabilization of electrical characteristics of the semiconductor device.

The thickness of the oxide semiconductor layer 123 may be determined as appropriate, in a manner similar to that of the oxide semiconductor layer 121, as long as formation of an interface state at the interface with the oxide semiconductor layer 122 is inhibited. For example, the thickness of the oxide semiconductor layer 123 may be set smaller than or equal to that of the oxide semiconductor layer 121. If the oxide semiconductor layer 123 is thick, there is a concern that the electric field from the gate electrode layer 160 (or the gate electrode layer 161 and the gate electrode layer 162) is difficult to reach the oxide semiconductor layer 122; thus, the oxide semiconductor layer 123 is preferably formed thin. For example, the thickness of the oxide semiconductor layer 123 is smaller than that of the oxide semiconductor layer 122. Note that the thickness of the oxide semiconductor layer 123 is not limited to the above, and may be determined as appropriate in accordance with the driving voltage of the transistor in consideration of the withstand voltage of the gate insulating layer 150.

In the case where the oxide semiconductor layer 121, the oxide semiconductor layer 122, and the oxide semiconductor layer 123 have different compositions from one another, the interfaces thereof can be observed by STEM (Scanning Transmission Electron Microscopy).

<Hydrogen Concentration>

Hydrogen contained in the oxide semiconductor layer 121, the oxide semiconductor layer 122, and the oxide semiconductor layer 123 reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, a transistor using an oxide semiconductor that contains hydrogen is likely to have normally-on characteristics.

Accordingly, it is preferable that hydrogen be reduced as much as possible as well as the oxygen vacancies in the oxide semiconductor layer 121, the oxide semiconductor layer 122, and the oxide semiconductor layer 123 and at the interfaces therebetween. For example, the concentrations of hydrogen in the oxide semiconductor layer 121, the oxide semiconductor layer 122, and the oxide semiconductor layer 123 and at the interfaces between the oxide semiconductor layer 121, the oxide semiconductor layer 122, and the oxide semiconductor layer 123, which are obtained by secondary ion mass spectrometry (SIMS: Secondary Ion Mass Spectrometry), are desirably higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$. As a result, the transistor 10 can have electrical characteristics with which threshold voltage becomes positive (also referred to as normally-off characteristics).

<Concentrations of Carbon and Silicon>

When silicon and carbon, which are elements belonging to Group 14, are contained in the oxide semiconductor layer 121, the oxide semiconductor layer 122, and the oxide semiconductor layer 123 and at their interfaces, oxygen vacancies are increased and an n-type region is formed in the oxide semiconductor layer 121, the oxide semiconductor layer 122, and the oxide semiconductor layer 123. It is therefore preferable to reduce the concentrations of silicon and carbon in the oxide semiconductor layer 121, the oxide semiconductor layer 122, and the oxide semiconductor layer 123 and at the interfaces between the metal oxide layer 121, the oxide semiconductor layer 122, and the metal oxide layer 123. The concentrations of silicon and carbon in the oxide semiconductor layer 121, the oxide semiconductor layer 122, the oxide semiconductor layer 123, and the oxide semiconductor layer 124 and at the interfaces between the oxide semiconductor layer 121, the oxide semiconductor layer 122, the oxide semiconductor layer 123, and the oxide semiconductor layer 124, which are obtained by SIMS, are desirably higher than or equal to $1\times10^{16}$ atoms/cm$^3$ and lower than or equal to $1\times10^{19}$ atoms/cm$^3$, further preferably higher than or equal to $1\times10^{16}$ atoms/cm$^3$ and lower than or equal to $5\times10^{18}$ atoms/cm$^3$, still further preferably higher than or equal to $1\times10^{16}$ atoms/cm$^3$ and lower than or equal to $2\times10^{18}$ atoms/cm$^3$. As a result, the transistor 10 has electrical characteristics with which threshold voltage becomes positive (also referred to as normally-off characteristics).

<Concentration of Alkali Metal>

Alkali metal and alkaline earth metal generate carriers when bonded to an oxide semiconductor in some cases, which can increase the off-state current of the transistor. It is thus preferable to reduce the concentrations of alkali metal and alkaline earth metal in the oxide semiconductor layer 121, the oxide semiconductor layer 122, and the oxide semiconductor layer 123 and at the interfaces between the oxide semiconductor layer 121, the oxide semiconductor layer 122, and the oxide semiconductor layer 123. For example, the concentrations of alkali metal and alkaline earth metal in the oxide semiconductor layer 121, the oxide semiconductor layer 122, and the oxide semiconductor layer 123, and at the interfaces between the oxide semiconductor layer 121, the oxide semiconductor layer 122, and the oxide semiconductor layer 123, which are obtained by SIMS, are lower than or equal to $1\times10^{18}$ atoms/cm$^3$, preferably lower than or equal to $2\times10^{16}$ atoms/cm$^3$. Thus, the transistor 10 can have electrical characteristics with which threshold voltage becomes positive (also referred to as normally-off characteristics).

<Concentration of Nitrogen>

When nitrogen is contained in the oxide semiconductor layer 121, the oxide semiconductor layer 122, the oxide semiconductor layer 123 and at their interfaces, an electron serving as a carrier is generated and accordingly carrier density is increased, so that n-type regions are formed. As a result, a transistor using an oxide semiconductor that contains nitrogen is likely to have normally-on characteristics. Thus, it is preferable that nitrogen be reduced as much as possible in the oxide semiconductor layer 121, the oxide semiconductor layer 122, and the oxide semiconductor layer 123 and at the interfaces between the oxide semiconductor layer 121, the oxide semiconductor layer 122, and the oxide semiconductor layer 123. For example, the concentrations of nitrogen in the oxide semiconductor layer 121, the oxide semiconductor layer 122, and the oxide semiconductor layer 123 and at the interfaces between the oxide semiconductor layer 121, the oxide semiconductor layer 122, and the oxide semiconductor layer 123, which are obtained by SIMS, are preferably higher than or equal to $1\times10^{15}$ atoms/cm$^3$ and lower than or equal to $5\times10^{19}$ atoms/cm$^3$, further preferably higher than or equal to $1\times10^{15}$ atoms/cm$^3$ and lower than or equal to $5\times10^{18}$ atoms/cm$^3$, still further preferably higher than or equal to $1\times10^{15}$ atoms/cm$^3$ and lower than or equal to $1\times10^{18}$ atoms/cm$^3$, and yet still further preferably higher than or equal to $1\times10^{15}$ atoms/cm$^3$ and lower than or equal to $5\times10^{17}$ atoms/cm$^3$. Thus, the transistor 10 can have electrical characteristics with which threshold voltage becomes positive (also referred to as normally-off characteristics).

<About Carrier Density>

The carrier densities of the oxide semiconductor layer 121, the oxide semiconductor layer 122, and the oxide semiconductor layer 123 can be lowered by reduction in impurities in the oxide semiconductor layer 121, the oxide semiconductor layer 122, and the oxide semiconductor layer 123. The carrier densities of the oxide semiconductor layer 121, the oxide semiconductor layer 122, and the oxide semiconductor layer 123 is $1\times10^{15}$/cm$^3$ or less, preferably $1\times10^{13}$/cm$^3$ or less, further preferably less than $8\times10^{11}$/cm$^3$, still further preferably less than $1\times10^{11}$/cm$^3$, and yet still further preferably less than $1\times10^{10}$/cm$^3$ and $1\times10^{-9}$/cm$^3$ or more.

When an oxide semiconductor film having a low impurity concentration and a low density of defect states is used as each of the oxide semiconductor layer 121, the oxide semiconductor layer 122, and the oxide semiconductor layer 123, a transistor including the oxide semiconductor layers can have more excellent electrical characteristics. Here, the state in which the impurity concentration is low and the density of defect states is low (the amount of oxygen vacancies is small) is described as highly purified intrinsic or substantially highly purified intrinsic. A highly purified intrinsic or substantially highly purified intrinsic oxide semiconductor has few carrier generation sources, and thus has a low carrier density in some cases. Thus, a transistor in which a channel region is formed in the oxide semiconductor film is likely to have positive threshold voltage (normally-off characteristics). A highly purified intrinsic or substantially highly purified intrinsic oxide semiconductor film has a low density of defect states and accordingly has a low density of trap states in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1 \times 10^{-13}$ A, at a voltage between a source electrode and a drain electrode (drain voltage) of from 1 V to 10 V. Thus, the transistor whose channel region is formed in the oxide semiconductor film has a small variation in electrical characteristics and thus is a transistor with high reliability in some cases.

The off-state current of a transistor in which a highly purified oxide semiconductor film described above is used for a channel formation region is extremely low. For example, in the case where the voltage between the source and the drain is set to approximately 0.1 V, 5 V, or 10 V, the off-state current standardized on the channel width of the transistor can be as low as several yA/μm to several zA/μm.

The oxide semiconductor layer 121, the oxide semiconductor layer 122, and the oxide semiconductor layer 123 may have a non-single crystal structure, for example. The non-single crystal structure includes a CAAC-OS which is described later, a polycrystalline structure, a microcrystalline structure, or an amorphous structure, for example. Among the non-single crystal structure, the amorphous structure has the highest density of defect states, whereas the CAAC-OS has the lowest density of defect states.

The oxide semiconductor layer 121, the oxide semiconductor layer 122, and the oxide semiconductor layer 123 may have a microcrystalline structure, for example. The oxide semiconductor layer 121, the oxide semiconductor layer 122, and the oxide semiconductor layer 123 which have the microcrystalline structure each include a microcrystal with a size greater than or equal to 1 nm and less than 10 nm, for example. Alternatively, the oxide semiconductor films which have the microcrystalline structure have a mixed phase structure where crystal parts (each of which is greater than or equal to 1 nm and less than 10 nm) are distributed in an amorphous phase.

The oxide semiconductor layer 121, the oxide semiconductor layer 122, and the oxide semiconductor layer 123 may have an amorphous structure, for example. The oxide semiconductor layer 121, the oxide semiconductor layer 122, and the oxide semiconductor layer 123 which have the amorphous structure each have disordered atomic arrangement and does not have crystalline component, for example. Alternatively, the oxide semiconductor films which have an amorphous structure have, for example, an absolutely amorphous structure and no crystal part.

Note that the oxide semiconductor layer 121, the oxide semiconductor layer 122, and the oxide semiconductor layer 123 may each be a mixed film including regions having two or more of the following structures: a CAAC-OS, a microcrystalline structure, and an amorphous structure. The mixed film, for example, has a single-layer structure including a region having an amorphous structure, a region having a microcrystalline structure, and a region of a CAAC-OS. Alternatively, the mixed film may have a stacked-layer structure including a region having an amorphous structure, a region having a microcrystalline structure, and a region of a CAAC-OS, for example.

Note that the oxide semiconductor layer 121, the oxide semiconductor layer 122, and the oxide semiconductor layer 123 may have a single-crystal structure, for example.

By providing an oxide semiconductor film in which oxygen vacancies are less likely to be generated than in the oxide semiconductor layer 122, over and under and in contact with the oxide semiconductor layer 122, oxygen vacancies in the oxide semiconductor layer 122 can be reduced. Further, since the oxide semiconductor layer 122 is in contact with the oxide semiconductor layers 121 and 123 containing one or more metal elements forming the oxide semiconductor layer 122, the density of interface states at the interface between the oxide semiconductor layer 121 and the oxide semiconductor layer 122 and at the interface between the oxide semiconductor layer 122 and the oxide semiconductor layer 123 is extremely low. For example, after oxygen is added to the insulating layer 110, the oxygen is transferred through the oxide semiconductor layer 121 to the oxide semiconductor layer 122 by heat treatment; however, the oxygen is hardly trapped by the interface states at this time, and the oxygen is difficult to be trapped and the oxygen contained in the oxide semiconductor layer 121 can be efficiently transferred to the oxide semiconductor layer 122. Accordingly, oxygen vacancies in the oxide semiconductor layer 122 can be reduced. Since oxygen is added to the oxide semiconductor layer 121, oxygen vacancies in the oxide semiconductor layer 121 can be reduced. In other words, the density of localized states of at least the oxide semiconductor layer 122 can be reduced.

In addition, when the oxide semiconductor layer 122 is in contact with an insulating film including a different constituent element (e.g., a gate semiconductor film including a silicon oxide film), an interface state is sometimes formed and the interface state forms a channel. At this time, a second transistor having a different threshold voltage appears, so that an apparent threshold voltage of the transistor is varied. However, since the oxide semiconductor layer 121 and the oxide semiconductor layer 123 containing one or more kinds of metal elements forming the oxide semiconductor layer 122 are in contact with the oxide semiconductor layer 122, an interface state is not easily formed at the interfaces between the oxide semiconductor layer 121 and the oxide semiconductor layer 122 and between the oxide semiconductor layer 123 and the oxide semiconductor layer 122.

The oxide semiconductor layer 121 and the oxide semiconductor layer 123 function as barrier films that prevent constituent elements of the insulating layer 110 and the gate insulating layer 150 from entering the oxide semiconductor layer 122 and forming an impurity state.

For example, in the case of using a silicon-containing insulating film as the insulating layer 110 or the gate insulating layer 150, silicon in the gate insulating layer 150 or carbon which might be contained in the insulating layer 110 or the gate insulating layer 150 enters the oxide semiconductor layer 121 or the oxide semiconductor layer 123 to a depth of about several nanometers from the interface in some cases. An impurity, such as silicon or carbon, entering the oxide semiconductor layer 122 forms an impurity state, and the impurity state serves as a donor to generate an electron; thus, the oxide semiconductor layer 122 might become n-type.

However, when each thickness of the oxide semiconductor layer 121 and the oxide semiconductor layer 123 is greater than several nm, the impurity such as silicon or carbon does not reach the oxide semiconductor layer 122, so that the influence of impurity states is reduced.

Thus, providing the oxide semiconductor layer 121 and the oxide semiconductor layer 123 makes it possible to reduce variations in electrical characteristics of the transistor, such as threshold voltage.

In the case where the gate insulating layer 150 and the oxide semiconductor layer 122 are in contact with each other and a channel is formed at the interface therebetween, interface scattering occurs at the interface and the field-effect mobility of the transistor is decreased. However, since the oxide semiconductor layer 121 and the oxide semiconductor layer 123 containing one or more kinds of metal elements forming the oxide semiconductor 122 are provided in contact with the oxide semiconductor layer 122, scattering of carriers does not easily occur at the interfaces between the oxide semiconductor layer 122 and the oxide semiconductor layer 121 and between the oxide semiconductor layer 122 and the oxide semiconductor layer 123, and thus the field-effect mobility of the transistor can be increased.

In this embodiment, the amount of oxygen vacancies in the oxide semiconductor layer 122, and further the amount of oxygen vacancies in the oxide semiconductor layer 121 and the oxide semiconductor layer 123 in contact with the oxide semiconductor layer 122 can be reduced; thus, the density of localized states of the oxide semiconductor layer 122 can be reduced. As a result, the transistor 10 in this embodiment has characteristics in which threshold voltage has small variations and reliability is high. Further, the transistor 10 of this embodiment has excellent electrical characteristics.

Since an insulating film containing silicon is often used as a gate insulating layer of a transistor, it is preferable that a region of the oxide semiconductor layer, which serves as a channel, be not in contact with the gate insulating layer as in the transistor of one embodiment of the present invention. In the case where a channel is formed at the interface between the gate insulating layer and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating layer.

Accordingly, with the oxide semiconductor layer 120 having a stacked-layer structure including the oxide semiconductor layer 121, the oxide semiconductor layer 122, and the oxide semiconductor layer 123, a channel can be formed in the oxide semiconductor layer 123; thus, the transistor having a high field-effect mobility and stable electrical characteristics can be formed.

Note that an oxide semiconductor does not necessarily have three layers and can have a single layer, two layers, four layers, or five or more layers. In the case of a single layer, a layer corresponding to the oxide semiconductor layer 122, which is described in this embodiment, may be used.

<Band Diagram>

Here, a band diagram is described. The band diagram is illustrated with the energy levels (Ec) at the conduction band minimum of the insulating layer 110, the oxide semiconductor layer 121, the oxide semiconductor layer 122, the oxide semiconductor layer 123, and the gate insulating layer 150 for easy understanding.

Figure 4A:
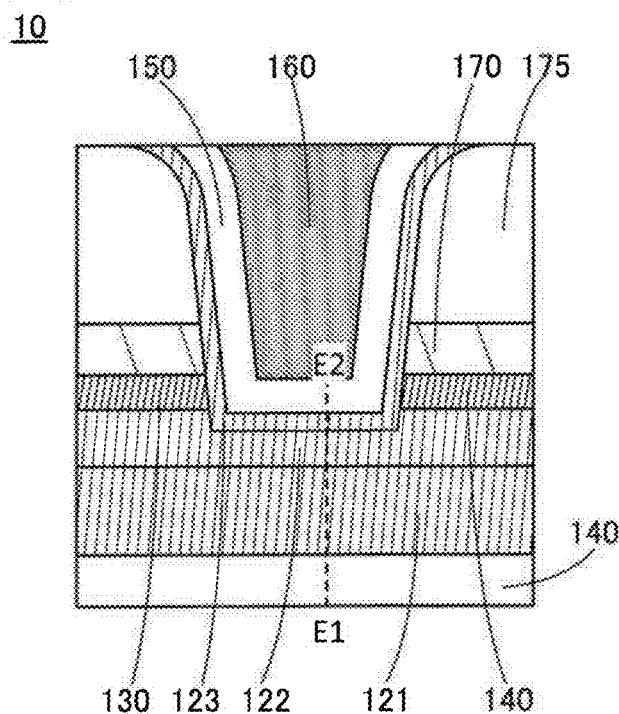
FIG. 4 Band diagrams of oxide semiconductor layers. Enlarged cross-sectional views of transistors FIG. 5 ALD deposition mechanism.
Figure 4B:
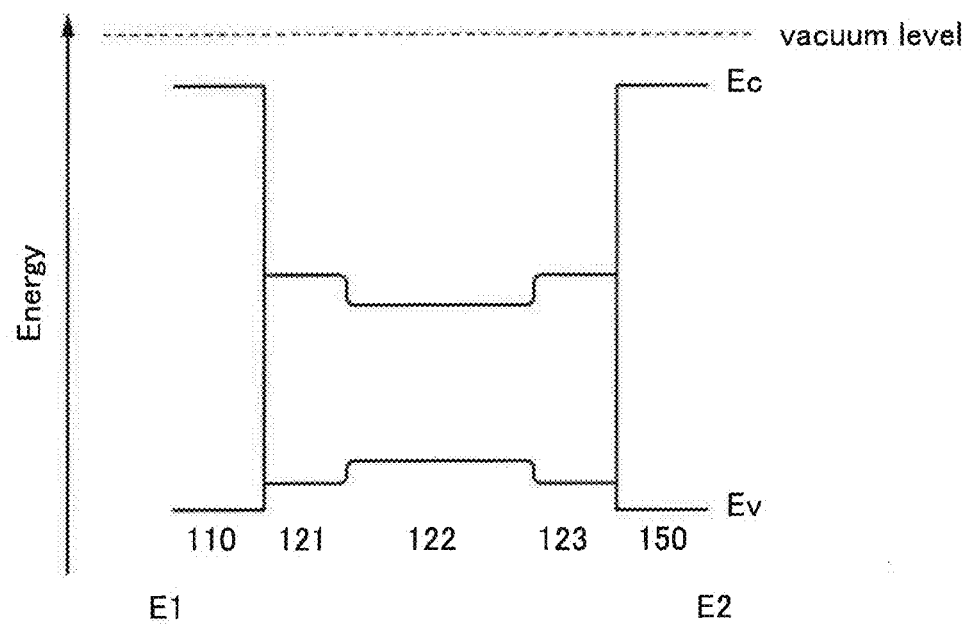
Figure 5A:
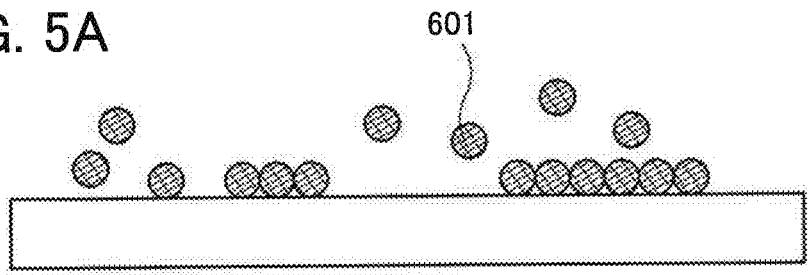
Figure 5B:
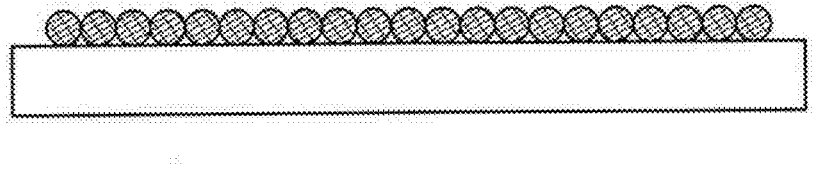
Figure 5C:
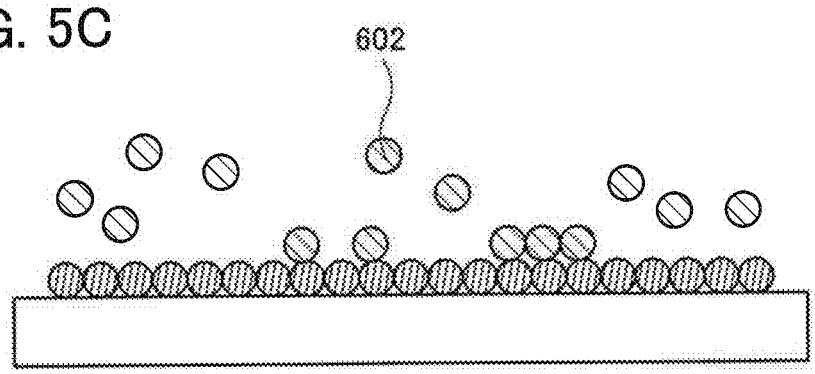
Figure 5D:
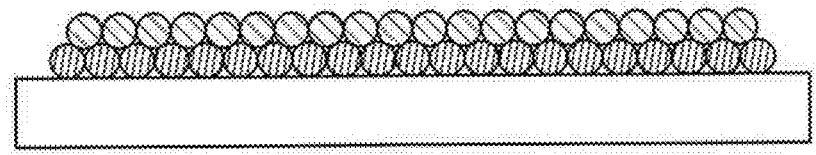

As illustrated in FIG. 4(A) and FIG. 4(B), the energy at the conduction band minimum changes continuously within the oxide semiconductor layer 121, the oxide semiconductor layer 122, and the oxide semiconductor layer 123. This can be understood also from the fact that the constituent elements are common among the oxide semiconductor layer 121, the oxide semiconductor layer 122, and the oxide semiconductor layer 123 and oxygen is easily diffused among them. Thus, the oxide semiconductor layer 121, the oxide semiconductor layer 122, and the oxide semiconductor layer 123 have a continuous physical property although they are a stack of films having different compositions.

The oxide semiconductor films, which contain the same main components and are stacked, are not simply stacked but formed to have continuous junction (here, particularly a U-shaped well (U Shape Well) structure where the energy at the conduction band minimum is continuously changed between the layers). In other words, a stacked-layer structure is formed such that there exists no impurities which form a defect level such as a trap center or a recombination center at each interface. If impurities are mixed between the films in the stacked multilayer film, the continuity of the energy band is lost and carriers disappear by a trap or recombination at the interface.

Although Ec of the oxide semiconductor layer 121 and the oxide semiconductor layer 123 are equal to each other in FIG. 4(B), they may be different.

As illustrated in FIG. 4(B) and FIG. 4(C), the oxide semiconductor layer 122 serves as a well and a channel of the transistor 10 is formed in the oxide semiconductor layer 122. Note that a channel having a U-shaped well structure in which the energy at the conduction band minimum continuously changes like the one formed in the oxide semiconductor layer 122, can also be referred to as a buried channel.

Note that trap levels due to impurities or defects can be formed in the vicinity of the interface between an insulating film such as a silicon oxide film and the oxide semiconductor layer 121 and the oxide semiconductor layer 123. The oxide semiconductor layer 122 can be distanced away from the trap levels owing to existence of the oxide semiconductor layer 121 and the oxide semiconductor layer 123. However, when the energy difference between Ec of the oxide semiconductor layer 121 or the oxide semiconductor layer 123 and Ec of the oxide semiconductor layer 122 is small, an electron in the oxide semiconductor layer 122 can go over the energy difference and reach the trap level. When electrons to be negative charge are captured by the trap levels, a negative fixed charge is generated at the interface with the insulating film, whereby the threshold voltage of the transistor is shifted in the positive direction. In addition, there is a concern that a trap is not fixed and characteristics can be changed in a long-time preservation test of a transistor.

Thus, to reduce a change in the threshold voltage of the transistor, an energy difference between the oxide semiconductor layer 122 and the Ec of each of the oxide insulating layers 121 and 123 is necessary. The energy difference is preferably greater than or equal to 0.1 eV, further preferably greater than or equal to 0.2 eV.

The oxide semiconductor layer 121, the oxide semiconductor layer 122, and the oxide semiconductor layer 123 preferably include a crystal part. In particular, stable electrical characteristics can be applied to the transistor by using a crystal in which c-axes are aligned.

In the band diagram illustrated in FIG. 4(B), an In—Ga oxide (e.g., an In—Ga oxide with an atomic ratio of In:Ga=7:93) or gallium oxide may be provided between the oxide semiconductor layer 123 and the gate insulating layer 150 without providing the oxide semiconductor layer 123. Furthermore, an In—Ga oxide or gallium oxide may be provided between the oxide semiconductor layer 123 and the gate insulating layer 150 in a state where the oxide semiconductor layer 123 is provided.

As the oxide semiconductor layer 122, an oxide having an electron affinity higher than those of the oxide semiconductor layer 121 and the oxide semiconductor layer 123 is used. The oxide which can be used for the oxide semiconductor layer 122 has, for example, an electron affinity higher than that of each of the oxide semiconductor layer 121 and the oxide semiconductor layer 123 by 0.07 eV or higher and 1.3 eV or lower, preferably 0.1 eV or higher and 0.7 eV or lower, and further preferably 0.2 eV or higher and 0.4 eV or lower.

Since the transistor described in this embodiment includes the oxide semiconductor layer 121 and the oxide semiconductor layer 123 that each include one or more kinds of metal elements included in the oxide semiconductor layer 122, an interface state is less likely to formed at the interface between the oxide semiconductor layer 121 and the oxide semiconductor layer 122 and the interface between the oxide semiconductor layer 123 and the oxide semiconductor layer 122. Thus, providing the oxide semiconductor layer 121 and the oxide semiconductor layer 123 makes it possible to reduce variations or changes in electrical characteristics of the transistor, such as threshold voltage.

<<Source Electrode Layer 130 and Drain Electrode Layer 140>>

The source electrode layer 130 and the drain electrode layer 140 are each preferably, for example, a single layer or a stacked layer of a conductive layer containing a simple substance of a material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy thereof, or a compound of oxygen, nitrogen, fluorine, silicon or the like containing any of these as its main component. For example, in the case of stacking layers, lower conductive layer which is in contact with the oxide semiconductor layer 122 (for example, a source electrode layer 131 or a drain electrode layer 141 illustrated in FIG. 15) can contain a material which is easily bonded to oxygen, and the upper conductive layer (for example, a source electrode layer 132 or a drain electrode layer 142 illustrated in FIG. 15) can contain a highly oxidation-resistant material. It is preferable to use a high-melting-point material which has both heat resistance and conductivity, such as tungsten or molybdenum. In addition, the conductive layers are preferably formed using a low-resistance conductive material such as aluminum or copper. Furthermore, a Cu—Mn alloy is preferably used because manganese oxide is formed at the interface with an insulator containing oxygen and the manganese oxide has a function of preventing Cu diffusion.

When the conductive material that is easily bonded to oxygen is in contact with an oxide semiconductor layer, a phenomenon occurs in which oxygen in the oxide semiconductor layer is diffused to the conductive material that is easily bonded to oxygen. Oxygen vacancies are generated in the vicinity of a region which is in the oxide semiconductor layer and is in contact with the source electrode layer or the drain electrode layer. Hydrogen slightly contained in the film enters the oxygen vacancies, whereby the region is markedly changed to an n-type region. Accordingly, the n-type region can serve as a source or a drain of the transistor.

For example, a stacked-layer structure using W for the lower conductive layer and Pt for the upper conductive layer can suppress oxidation of the conductive layers caused by being in contact with the insulating layer 170 while an oxide semiconductor in contact with the conductive layers becomes n-type.

<<Gate Insulating Layer 150>>

The gate insulating layer 150 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The gate insulating layer 150 may be a stack of any of the above materials. The gate insulating layer 150 may contain lanthanum (La), nitrogen, zirconium (Zr), or the like as an impurity.

An example of a stacked-layer structure of the gate insulating layer 150 will be described. The gate insulating layer 150 contains, for example, oxygen, nitrogen, silicon, or hafnium. Specifically, hafnium oxide and silicon oxide or silicon oxynitride is preferably contained.

Hafnium oxide has higher dielectric constant than silicon oxide and silicon oxynitride. Thus, a physical thickness can be made larger than an equivalent oxide thickness; as a result, even in the case where the equivalent oxide thickness is less than or equal to 10 nm or less than or equal to 5 nm, leakage current due to tunnel current can be low. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited thereto.

Note that a surface over which the hafnium oxide having a crystal structure is formed has interface states due to defects in some cases. The interface state serves as a trap center in some cases. Therefore, when hafnium oxide is provided near a channel region of a transistor, the electrical characteristics of the transistor deteriorate because of the interface state in some cases. In order to reduce the effect of the interface state, in some cases, it is preferable to separate the channel region of the transistor and the hafnium oxide from each other by providing another film therebetween. The film has a buffer function. The film having a buffer function may be a film included in the gate insulating layer 150 or a film included in an oxide semiconductor film. That is, the film having a buffer function can be formed using silicon oxide, silicon oxynitride, an oxide semiconductor, or the like. Note that for the film having a buffer function, for example, a semiconductor or an insulator having a larger energy gap than a semiconductor to be the channel region is used. Alternatively, for the film having a buffer function, for example, a semiconductor or an insulator having lower electron affinity than a semiconductor to be the channel region is used. Alternatively, for the film having a buffer function, for example, a semiconductor or an insulator having higher ionization energy than a semiconductor to be the channel region is used.

Meanwhile, in some cases, charge is trapped by the interface states (trap centers) of the hafnium oxide having a crystal structure, whereby the threshold voltage of the transistor is controlled. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. Alternatively, as the film having a buffer function, a semiconductor or an insulator having higher ionization energy than hafnium oxide may be provided. With the use of such an insulator, an electric charge trapped in the interface state is less likely to be released, and thus the electric charge can be held for a long period of time.

As an insulator, for example, silicon oxide or silicon oxynitride can be given. In order to make the interface state in the gate insulating layer 150 trap an electric charge, an electron may be transferred from an oxide semiconductor film toward the gate electrode layer 160. As a specific example, the potential of the gate electrode layer 160 is kept higher than the potential of the source electrode layer 130 or the drain electrode layer 140 under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating layer 150 or the like shifts in the positive direction. The amount of electrons to be trapped (the amount of change in threshold voltage) can be controlled by adjusting a voltage of the gate electrode layer 160 or time in which the voltage is applied. The location is not necessarily limited to the inside of the gate insulating layer 150 as long as an electric charge can be trapped therein. A stacked film having a similar structure may be used as another insulating layer.

<<Gate Electrode Layer 160>>

For example, a conductive film of aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), tantalum (Ta), tungsten (W), or the like can be used for the gate electrode layer 160. The gate electrode layer 160 can have a stacked-layer. For example, the above material may be used for the gate electrode layer 162, and a conductive film containing nitrogen, such as a nitride of the above material, may be used for the gate electrode layer 161 and the gate electrode layer 163 as illustrated in FIG. 15.

<<Insulating Layer 170>>

The insulating layer 170 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($Si_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layer 170 may be a stack of any of the above materials.

The insulating layer 170 preferably includes an aluminum oxide film. The aluminum oxide film has an effect of blocking the passage of both oxygen and impurities such as hydrogen and moisture through the film. Thus, during the manufacturing process of the transistor and after the manufacturing, the aluminum oxide film can suitably function as a protective film that has effects of preventing entry of impurities such as hydrogen and moisture, which cause variations in the electrical characteristics of the transistor, into the oxide semiconductor layer 121 and the oxide semiconductor layer 122, preventing release of oxygen, which is a main component, from the oxide semiconductor layer 121 and the oxide semiconductor layer 122, and preventing unnecessary release of oxygen from the insulating layer 110.

Furthermore, the insulating layer 170 is preferably a film having oxygen supply capability. A mixed layer is formed and oxygen is added to the mixed layer or the insulating layer 110 when a second insulating film to be the insulating layer 170 is formed, the oxygen is diffused into the oxide semiconductor by the subsequent heat treatment, and the oxygen can fill oxygen vacancies in the oxide semiconductor; therefore, the transistor characteristics (e.g., threshold voltage or reliability) can be improved.

Alternatively, another insulating layer may be provided over or under the insulating layer 170. For example, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like can be contained. For example, an insulating film containing one or more of aluminum oxide ($AlO_x$), magnesium oxide ($MgO_x$), silicon oxide ($SiO_x$), silicon oxynitride ($SiO_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layer 170 may be a stack of any of the above materials. The insulating layer 170 preferably contains oxygen more than that in the stoichiometric composition. Oxygen released from the insulating layer can be diffused into the channel formation region in the oxide semiconductor layer 120 through the gate insulating layer 150, so that oxygen vacancies formed in the channel formation region can be filled with the oxygen. In this manner, stable electrical characteristics of the transistor can be achieved.

<<Insulating Layer 175>>

The insulating layer 175 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more kinds of magnesium oxide ($MgO_x$), silicon oxide ($SiO_x$), silicon oxynitride ($SiN_xO_x$), silicon nitride oxide ($SiN_xO_x$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), and aluminum oxide ($AlO_x$) can be used. The insulating layer 175 may be a stack of any of the above materials. The insulating layer preferably contains oxygen more than that in the stoichiometric composition.

Alternatively, a low-dielectric constant material (a low-k material) may be used for the insulating layer 175. For example, silicon oxide into which several percentage fluorine (F) is introduced (SiOF), silicon oxide into which several percentage carbon (C) is introduced (SiOC), fluorinesilicate glass (FSG), organosilicate glass (OSG), silsesquioxane hydride (HSQ), methylsilsesquioxane (MSQ), an organic polymer, polyimide, a fluorine resin (e.g., polytetrafluoroethylene), amorphous carbon to which fluorine is added, or the like can be used. When the low-k material is used for the insulating layer 175, capacitance of the transistor 10 can be further reduced.

<Manufacturing Method of Transistor>

Next, a manufacturing method of a semiconductor device of this embodiment is described with reference to FIG. 5 to FIG. 13. Note that the same parts as those described in the above transistor structure are omitted. The direction of A1-A2 shown in FIG. 7 to FIG. 13 is referred to as a channel length direction shown in FIG. 1(A) and FIG. 1(B) in some cases. The direction of A3-A4 shown in FIG. 7 to FIG. 13 is referred to as a channel width direction shown in FIG. 1(A) and FIG. 1(C) in some cases.

In this embodiment, the layers included in the transistor (the insulating layer, the oxide semiconductor layer, the conductive layer, and the like) can be formed by any of a sputtering method, a chemical vapor deposition (CVD) method, a vacuum evaporation method, and a pulsed laser deposition (PLD) method. Alternatively, they are formed using a coating method or a printing method. Although the sputtering method and a plasma-enhanced chemical vapor deposition (PECVD) method are typical examples of the film formation method, a thermal CVD method may be used. As the thermal CVD method, a MOCVD (metal organic chemical vapor deposition) method or an ALD (atomic layer deposition) method may be used, for example.

<Thermal CVD Method>

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

The variety of films such as the metal film, the semiconductor film, and the inorganic insulating film which have been disclosed in the above embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

<ALD Method>

In a conventional deposition apparatus utilizing a CVD method, one or more kinds of source gases (precursors) for reaction are supplied to a chamber at the same time at the time of deposition. In a deposition apparatus utilizing an ALD method, film formation is performed in such a manner that precursors for reaction are sequentially introduced into a chamber, and then the sequence of the gas introduction is repeated. For example, two or more kinds of precursors are sequentially supplied to the chamber by switching respective switching valves (also referred to as high-speed valves). For example, a first precursor is introduced, an inert gas (e.g., argon or nitrogen) or the like is introduced after the introduction of the first precursor so that the plural kinds of precursors are not mixed, and then a second precursor is introduced. Alternatively, the first precursor may be exhausted by vacuum evacuation instead of the introduction of the inert gas, and then the second precursor may be introduced.

FIGS. 5(A), 5(B), 5(C), and 5(D) illustrate a deposition process by an ALD method. First precursors 601 are adsorbed onto a substrate surface (see FIG. 5(A)), whereby a first monolayer is formed (see FIG. 5(B)). At this time, metal atoms and the like included in the precursors can be bonded to hydroxyl groups that exist at the substrate surface. The metal atoms may be bonded to alkyl groups such as methyl groups or ethyl groups. The first monolayer reacts with second precursors 602 introduced after the first precursors 601 are evacuated (see FIG. 5(C)), whereby a second monolayer is stacked over the first monolayer to form a thin film (see FIG. 5(D)). For example, in the case where an oxidizer is included in the second precursors, the oxidizer chemically reacts with metal atoms included in the first precursors or an alkyl group bonded to metal atoms, whereby an oxide film can be formed. Moreover, with the use of a gas containing hydrogen for the second precursors, a metal film can be formed by reduction reaction.

An ALD method is a deposition method based on a surface chemical reaction, by which precursors are adsorbed onto a deposition surface and a self-stopping mechanism operates, whereby a layer is formed. For example, precursors such as trimethylaluminum react with hydroxyl groups (OH groups) that exist at the deposition surface. At this time, only a surface reaction due to heat occurs; therefore, the precursors come into contact with the deposition surface and metal atoms or the like in the precursors can be adsorbed onto the deposition surface through thermal energy. The precursors have characteristics of, for example, having a high vapor pressure, being thermally stable before being deposited and not dissolving, and being chemically adsorbed onto a substrate at a high speed. Since the precursors are introduced in a state of a gas, when the precursors, which are alternately introduced, have enough time to be diffused, a film can be formed with good coverage even onto a region having unevenness with a high aspect ratio.

In an ALD method, the sequence of the gas introduction is repeated a plurality of times until a desired thickness is obtained, whereby a thin film with excellent step coverage can be formed. The thickness of the thin film can be adjusted by the number of repetition times; therefore, it is possible to accurately adjust a film thickness. The deposition rate can be increased and the impurity concentration in the film can be reduced by improving the evacuation capability.

ALD methods include an ALD method using heating (thermal ALD method) and an ALD method using plasma (plasma ALD method). In the thermal ALD method, precursors react using thermal energy, and in the plasma ALD method, precursors react in a state of a radical.

By an ALD method, an extremely thin film can be formed with high accuracy. In addition, the coverage of an uneven surface with the film and the film density of the film are high.

<Plasma ALD>

Alternatively, when a plasma ALD method is employed, the film can be formed at a lower temperature than when an ALD method using heating (a thermal ALD method) is employed. With a plasma ALD method, for example, the film can be formed without decreasing the deposition rate even at 100° C. or lower. Moreover, in a plasma ALD method, plasma can render $N_2$ a radical; thus, a nitride film as well as an oxide film can be formed.

In addition, oxidizability of an oxidizer can be enhanced by the plasma ALD. Thus, precursors remaining in a film in the case of forming a film by ALD or organic components released from precursors can be reduced. In addition, carbon, chlorine, hydrogen, and the like in the film can be reduced; thus, a film with low impurity concentration can be obtained.

In the case of using the plasma ALD method, radical species are generated, and plasma can be generated from a place apart from the substrate like ICP (Inductively Coupled Plasma) or the like, so that plasma damage to the substrate or a film on which the protective film is formed can be suppressed.

As described above, with the plasma ALD method, the process temperature can be lowered and the coverage of the surface can be increased as compared with other deposition methods, and the film can be deposited successfully. Thus, entry of water and hydrogen from the outside can be inhibited. Accordingly, the reliability of characteristics of the transistor can be improved.

<Description of ALD Apparatus>

Figure 6A:
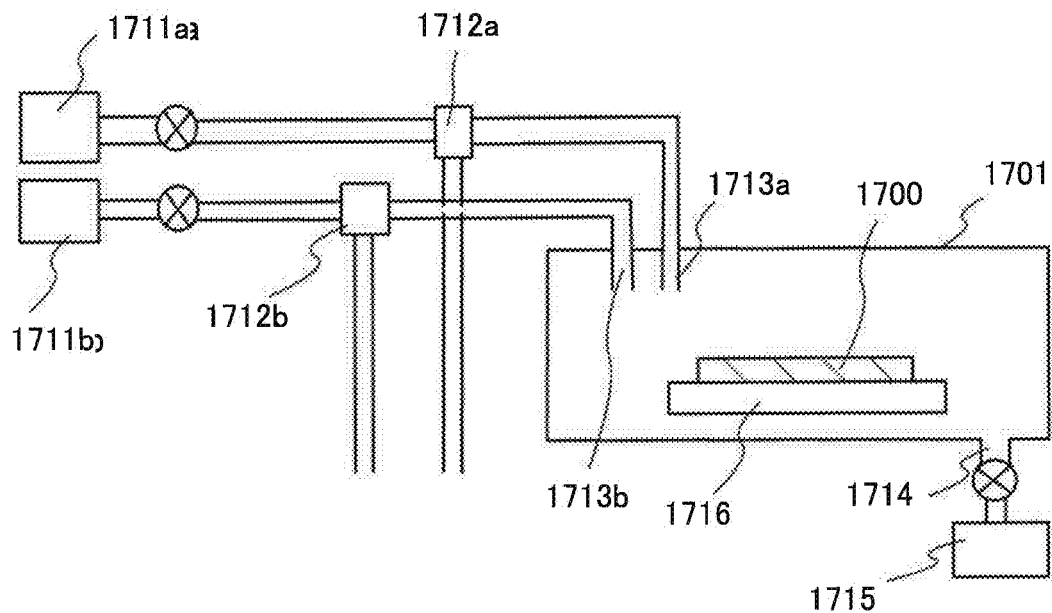
FIG. 6 Schematic views of an ALD apparatus.

FIG. 6(A) illustrates an example of a deposition apparatus utilizing an ALD method. The deposition apparatus utilizing an ALD method includes a deposition chamber (chamber 1701), a source material supply portion 1711a, a source material supply portion 1711b, a high-speed valve 1712a and a high-speed valve 1712b which are flow rate controllers, a source material introduction port 1713a, a source material introduction port 1713b, a source material exhaust port 1714, and an evacuation unit 1715. The source material introduction ports 1713a and 1713b provided in the chamber 1701 are connected to the source material supply portions 1711a and 1711b, respectively, through supply tubes and valves, and the source material exhaust port 1714 is connected to the evacuation unit 1715 through an exhaust tube, a valve, and a pressure controller.

A substrate holder 1716 with a heater is provided in the chamber, and a deposition substrate 1700 is provided over the substrate holder.

In the source material supply portion 1711a and the source material supply portion 1711b, a source gas is formed from a solid source material or a liquid source material by using a vaporizer, a heating unit, or the like. Alternatively, the source material supply portion 1711a and the source material supply portion 1711b each may have a structure in which a source gas in a gas state is supplied.

Although two source material supply portions 1711a and 1711b are provided in this example, without limitation thereon, and three or more source material supply portions may be provided. The high-speed valve 1712a and the high-speed valve 1712b can be accurately controlled by time, and supply one of a source gas and an inert gas. The high-speed valves 1712a and 1712b are flow rate controllers for a source gas, and can also be referred to as flow rate controllers for an inert gas.

In the deposition apparatus illustrated in FIG. 6(A), a thin film is formed over a surface of the deposition substrate 1700 in the following manner: the deposition substrate 1700 is transferred to be put on the substrate holder 1716, the chamber 1701 is sealed, the deposition substrate 1700 is heated to a desired temperature (e.g., higher than or equal to 100° C. or higher than or equal to 150° C.) by heating the substrate holder 1716 with a heater; and supply of a source gas, evacuation with the evacuation unit 1715, supply of an inert gas, and evacuation with the evacuation unit 1715 are repeated.

In the deposition apparatus illustrated in FIG. 6(A), an insulating layer formed using an oxide (including a composite oxide) containing one or more elements selected from hafnium (Hf), aluminum (Al), tantalum (Ta), zirconium (Zr), and the like can be formed by selecting a source material (e.g., a volatile organometallic compound) used for the source material supply portion 1711a and the source material supply portion 1711b appropriately. Specifically, it is possible to form an insulating layer formed using hafnium oxide, an insulating layer formed using aluminum oxide, an insulating layer formed using hafnium silicate, an insulating layer formed using aluminum silicate, or the like. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portion 1711a and the source material supply portion 1711b appropriately.

For example, in the case where a hafnium oxide layer is formed by a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. In this case, the first source gas supplied from the source material supply portion 1711a is TDMAH, and the second source gas supplied from the source material supply portion 1711b is ozone. Note that the chemical formula of tetrakis(dimethylamide)hafnium is $Hf[N(CH_3)_2]_4$. As another material, tetrakis(ethylmethylamide)hafnium can be given. Note that nitrogen has a function of eliminating charge trap states. Therefore, when the source gas contains nitrogen, a hafnium oxide film having low density of charge trap states can be formed.

For example, in the case where an aluminum oxide layer is formed by a deposition apparatus utilizing an ALD method, two kinds of gases, e.g., $H_2O$ as an oxidizer and a source gas which is obtained by vaporizing liquid containing a solvent and an aluminum precursor compound (TMA or the like) are used. In this case, the first source gas supplied from the source material supply portion 1711a is TMA, and the second source gas supplied from the source material supply portion 1711b is $H_2O$. Note that the chemical formula of trimethylaluminum is $Al(CH_3)_3$. As another material liquid, tris(dimethylamide)aluminum, triisobutylaluminum, aluminum tris(2,2,6,6-tetramethyl-3,5-heptanedionate), or the like is given.

For example, in the case where a silicon oxide film is formed by a deposition apparatus using ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially and repeatedly introduced to form an In—O layer, a $Ga(CH_3)_3$ gas and an $O_3$ gas are introduced at a time to form a GaO layer, and then a $Zn(CH_3)_2$ and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Further, a $Zn(CH_3)_2$ gas may be used.

<<Multi-Chamber Manufacturing Apparatus>>

Figure 6B:
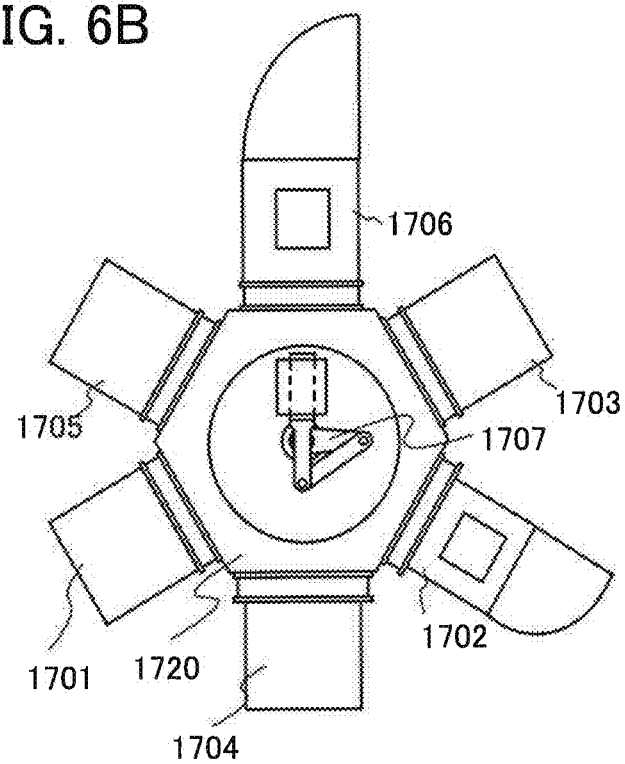
Figure 7A:
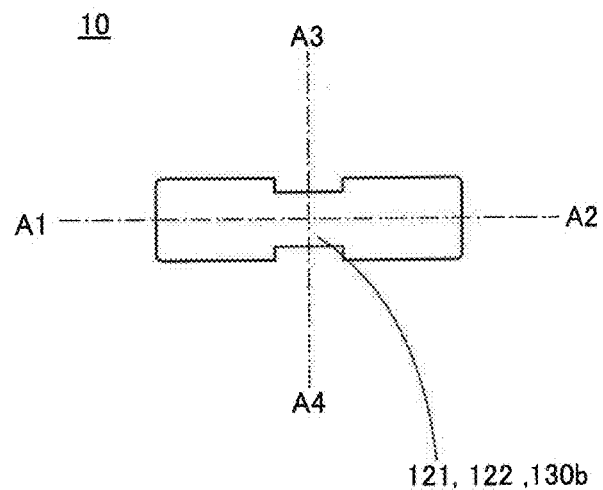
FIG. 7 A top view and a cross-sectional view illustrating a manufacturing method of a transistor.
Figures 7B, 7C:
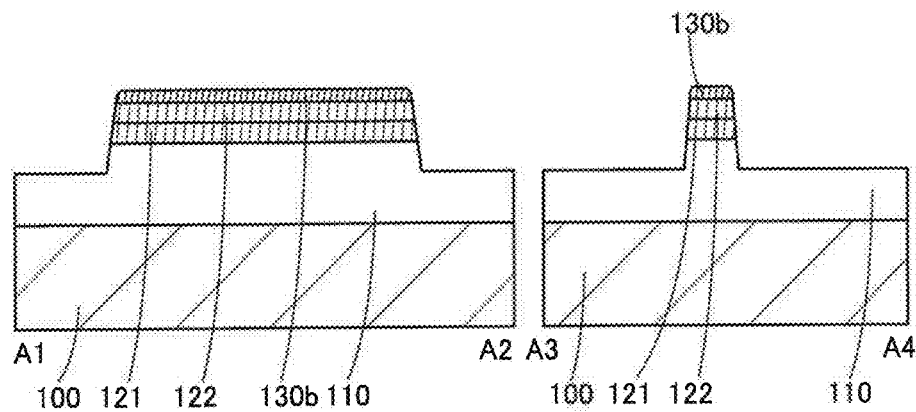
Figure 9A:
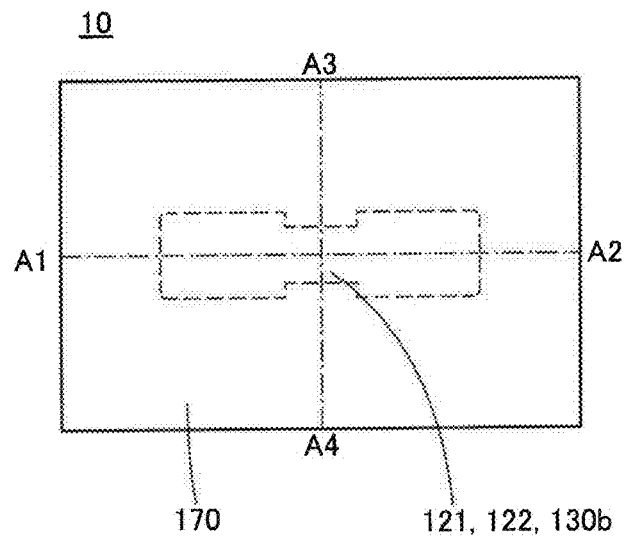
FIG. 9 A top view and cross-sectional views illustrating a manufacturing method of a transistor.
Figure 9B:
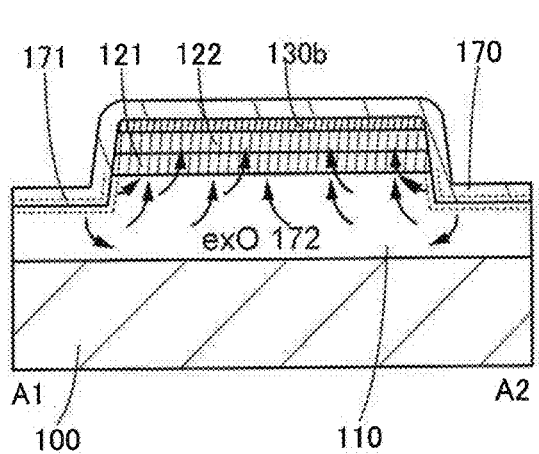
Figure 9C:
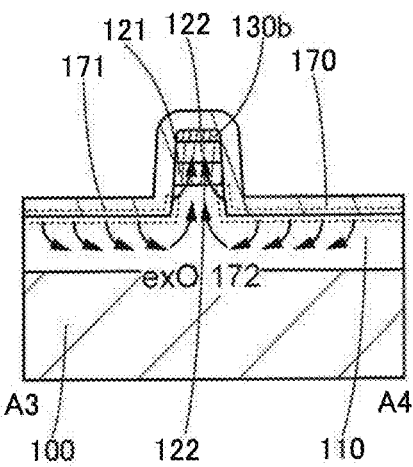

FIG. 6(B) illustrates an example of a multi-chamber manufacturing apparatus including at least one deposition apparatus illustrated in FIG. 6(A).

In the manufacturing apparatus illustrated in FIG. 6(B), a stack of films can be successively formed without exposure to the air, and entry of impurities is prevented and throughput is improved.

The manufacturing apparatus illustrated in FIG. 6(B) includes at least a load chamber 1702, a transfer chamber 1720, a pretreatment chamber 1703, a chamber 1701 which is a deposition chamber, and an unload chamber 1706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 1704 and 1705 may be deposition apparatuses utilizing an ALD method like the chamber 1701, deposition apparatuses utilizing a plasma CVD method, deposition apparatuses utilizing a sputtering method, or deposition apparatuses utilizing a metal organic chemical vapor deposition (MOCVD: Metal Organic Chemical Vapor Deposition) method.

For example, an example in which a stack of films is formed under a condition that the chamber 1704 is a deposition apparatus utilizing a plasma CVD method and the chamber 1705 is a deposition apparatus utilizing an MOCVD method will be described below.

Although FIG. 6(B) shows an example in which a top view of the transfer chamber 1720 is a hexagon, a manufacturing apparatus in which the top surface shape is set to a polygon having more than six corners and more chambers are connected depending on the number of layers of a stacked film may be used. The top surface shape of the substrate is rectangular in FIG. 6(B); however, there is no particular limitation thereon. Although FIG. 6(B) shows an example of the single wafer type, a batch-type deposition apparatus in which a plurality of substrates are formed at a time may be used.

<Formation of Insulating Layer 110>

First, the insulating layer 110 is formed over the substrate 100. The insulating layer 110 can be formed by a plasma CVD method, a thermal CVD method (an MOCVD method, an ALD method), a sputtering method, or the like with use of an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, these materials may be stacked, in which case at least an upper layer of the stacked layer which is in contact with a first oxide semiconductor film to be the oxide semiconductor layer 121 later is preferably formed using a material containing excess oxygen that can serve as a supply source of oxygen to the oxide semiconductor layer 122.

As the insulating layer 110, for example, a 100-nm-thick silicon oxynitride film can be formed by a plasma CVD method.

Next, heat treatment may be performed to release water, hydrogen, or the like contained in the insulating layer 110. As a result, the concentration of water, hydrogen, or the like contained in the insulating layer 110 can be reduced. The heat treatment can reduce the amount of water, hydrogen, or the like diffused to the first oxide semiconductor film formed later.

<Formation of First Oxide Semiconductor Film and Second Oxide Semiconductor Film>

Then, a first oxide semiconductor film to be the oxide semiconductor layer 121 is formed later and a second oxide semiconductor film to be the oxide semiconductor layer 122 later are formed over the insulating layer 110. The first oxide semiconductor film and the second oxide semiconductor film can be formed by a sputtering method, an MOCVD method, a PLD method, or the like, and preferably formed using a sputtering method. As a sputtering method, an RF sputtering method, a DC sputtering method, an AC sputtering method, or the like can be used. In addition, a facing-target-type method (also referred to as a counter-electrode-type method, a gas phase sputtering method, and a VDSP (also referred to as Vapor Deposition Spattering) method) is used, whereby plasma damage at the time of deposition can be reduced.

When the first oxide semiconductor film is formed by a sputtering method, it is preferable that each chamber of the sputtering apparatus be able to be evacuated to a high vacuum (about $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably 400° C. or higher so that water and the like acting as impurities in the oxide semiconductor can be removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation in a chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

As a sputtering gas, a rare gas (typically argon), an oxygen, or a mixed gas of a rare gas and oxygen is used as appropriate. In the case of the mixed gas of a rare gas and oxygen, the proportion of oxygen gas to the rare gas is preferably increased.

Note that, for example, in the case where a sputtering method is used form the oxide semiconductor film, the oxide semiconductor film is formed at a substrate temperature higher than or equal to 150° C. and lower than or equal to 750° C., preferably higher than or equal to 150° C. and lower than or equal to 450° C., further preferably higher than or equal to 200° C. and lower than or equal to 420° C., whereby a CAAC-OS film can be formed.

The material of the first oxide semiconductor film is selected so that the first oxide semiconductor film can have a lower electron affinity than the second oxide semiconductor film.

The indium content of the second oxide semiconductor film may be higher than those of the first oxide semiconductor film and a third oxide semiconductor film. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the oxide semiconductor layer 122, a transistor having high mobility can be obtained.

When the first oxide semiconductor film and the second oxide semiconductor film are formed by a sputtering method, for example, the first oxide semiconductor film and the second oxide semiconductor film can be successively formed without exposing to the air with use of a multi-chamber sputtering apparatus. In that case, entry of unnecessary impurities and the like into the interface between the first oxide semiconductor film and the second oxide semiconductor film can be prevented and interface states can be reduced accordingly. Thus, the electrical characteristics of a transistor can be stabilized, particularly in a reliability test.

If the first oxide semiconductor film is damaged by addition of oxygen, the oxide semiconductor layer 123, which is a main conduction path, can keep a distance from the damaged part thanks to the existence of the oxide semiconductor layer 122; thus, the electrical characteristics of a transistor can be stabilized, particularly in a reliability test.

For example, as the first oxide semiconductor film, a 20-nm-thick oxide semiconductor film which is formed by a sputtering method using a target having an atomic ratio of In:Ga:Zn=1:3:4 can be used. In addition, as the second oxide semiconductor film, a 15-nm-thick oxide semiconductor film which is formed by a sputtering method using a target having an atomic ratio of In:Ga:Zn=1:1:1 can be used.

The amount of oxygen vacancies in the second oxide semiconductor film can be reduced by performing heat treatment after the first oxide semiconductor film and the second oxide semiconductor film are formed.

Next, by performing the first heat treatment, part of oxygen is transferred to the second oxide semiconductor film, whereby oxygen vacancies in the second oxide semiconductor film can be reduced. The second oxide semiconductor film in which oxygen vacancies are reduced is the second oxide semiconductor film. In addition, at this time, oxygen vacancies in the first oxide semiconductor film can be reduced. Hydrogen, water, or the like contained in the first oxide semiconductor film and the second oxide semiconductor film to which oxygen is added can be released by the first heat treatment. As a result, the content of impurities contained in the first oxide semiconductor film and the second oxide semiconductor film to which oxygen is added can be reduced.

The temperature of the first heat treatment is higher than or equal to 250° C. and lower than the strain point of the substrate, preferably higher than or equal to 300° C. and lower than or equal to 650° C., further preferably higher than or equal to 350° C. and lower than or equal to 550° C.

The first heat treatment is preferably performed under an inert gas atmosphere containing nitrogen or a rare gas such as helium, neon, argon, xenon, or krypton. Further, after heat treatment is performed in an inert gas atmosphere, heat treatment may be performed in an oxygen atmosphere or a dry air atmosphere (air whose dew point is lower than or equal to −80° C., preferably lower than or equal to −100° C., and preferably lower than or equal to −120° C.). The treatment may be performed under reduced pressure. Note that it is preferable that hydrogen, water, and the like be not contained in an inert gas and an oxygen gas, like the dry air, and the dew point is preferably lower than or equal to −80° C., further preferably lower than or equal to −100° C. The treatment time is 3 minutes to 24 hours.

In the first heat treatment, instead of an electric furnace, any device for heating an object to be processed by heat conduction or heat radiation from a heating element, such as a resistance heating element, may be used. For example, an RTA (Rapid Thermal Annealing) apparatus, such as a GRTA (Gas Rapid Thermal Annealing) apparatus or an LRTA (Lamp Rapid Thermal Annealing) apparatus, can be used. The LRTA apparatus is an apparatus for heating an object to be processed by radiation of light (an electromagnetic wave) emitted from a lamp, such as a halogen lamp, a metal halide lamp, a xenon arc lamp, a carbon arc lamp, a high pressure sodium lamp, or a high pressure mercury lamp. The GRTA apparatus is an apparatus for the first heat treatment using a high-temperature gas. As the high-temperature gas, a rare gas like argon or an inert gas, such as nitrogen is used.

Note that the first heat treatment may be performed after etching for forming the oxide semiconductor layer 121 and the oxide semiconductor layer 122 described later.

For example, after heat treatment is performed at 450° C. in a nitrogen atmosphere for one hour, heat treatment is performed at 450° C. in an oxygen atmosphere for one hour.

Through the above steps, oxygen vacancies and impurities such as hydrogen and water in the oxide semiconductor films can be reduced. The oxide semiconductor films in which the density of localized states is reduced can be formed.

<Formation of First Conductive Film>

Next, a first conductive film to be the source electrode layer 130 and the drain electrode layer 140 is formed over the oxide semiconductor layer 123. The first conductive film can be formed by a sputtering method, a chemical vapor deposition (CVD) method (a metal organic chemical vapor deposition (MOCVD) method, a metal chemical vapor deposition method, an atomic layer deposition (ALD) method, or a plasma-enhanced chemical vapor deposition (PECVD) method), an evaporation method, a pulsed laser deposition (PLD) method, or the like.

The material of the first conductive film preferably has a single layer or a stacked layer of a conductive film containing a simple substance of a material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), ruthenium (Ru), platinum (Pt), iridium (Ir), or strontium (Sr), an alloy of such a low-resistance material, or a compound containing any of these as its main component. For example, in the case of stacking layers, the lower conductive layer which is in contact with the oxide semiconductor layer 122 contains a material which is easily bonded to oxygen, and the upper conductive layer contains a highly oxidation-resistant material. It is preferable to use a high-melting-point material, such as tungsten (W) or molybdenum (Mo), which has both heat resistance and conductivity. In addition, the first conductive film is preferably formed using a low-resistance conductive material such as aluminum (Al) or copper (Cu). Furthermore, a Cu—Mn alloy is preferably used, in which case a film containing manganese oxide is formed at the interface with an insulator containing oxygen and the manganese oxide has a function of preventing Cu diffusion.

As the first conductive film, for example, a tungsten film having a thickness of 20 to 100 nm can be formed by a sputtering method.

A conductive layer 130b formed by processing the first conductive film in a subsequent step can have a function as a hard mask and a function as a source electrode layer and a drain electrode layer in the subsequent steps; thus, no additional formation step is needed. Thus, the semiconductor manufacturing process can be shortened.

<Formation of Oxide Semiconductor Layer 121 and Oxide Semiconductor Layer 122>

Then, a resist mask is formed through a lithography process, and the first conductive film is selectively etched using the resist mask, so that the conductive layer 130b is formed. Next, after the resist over the conductive layer 130b is removed, the second oxide semiconductor film and the first oxide semiconductor film are selectively etched using the conductive layer 130b as a hard mask, so that the oxide semiconductor layer 122 and the oxide semiconductor layer 121 each can be formed into an island shape (see FIG. 7). Note that as an etching method, a dry etching method can be used. Note that the use of the conductive layer 130b as a hard mask for etching of the oxide semiconductor layer can reduce edge roughness of the oxide semiconductor layer after the etching as compared with the case of using a resist mask.

For example, the first oxide semiconductor film and the second semiconductor film are selectively etched using a resist mask and a hard mask with a methane gas and an argon gas used as an etching gas, whereby the oxide semiconductor layer 121 and the oxide semiconductor layer 122 can be formed.

<Formation of Second Insulating Film>

Next, the second insulating film is formed over the insulating layer 110 and the conductive layer 130b.

The second insulating film and the third insulating film can be formed by a plasma CVD method, a thermal CVD method (an MOCVD method or an ALD method), a sputtering method, a spin coating method, or the like with the use of an oxide insulating film of aluminum oxide ($SiO_x$), magnesium oxide ($MgO_x$), silicon oxide ($SiO_x$), silicon oxynitride ($SiO_xN_y$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), or the like; a nitride insulating film of silicon nitride ($SiN_x$), silicon nitride oxide ($SiN_xO_y$), aluminum nitride ($AlN_x$), aluminum nitride oxide ($AlN_xO_y$), or the like; or a mixed material of any of these. The second insulating film may be a stack of any of the above materials.

As the second insulating film, an aluminum oxide film is preferably formed by a sputtering method. Moreover, aluminum oxide is preferably used as a sputtering target. As a gas for forming a film, an oxygen gas is preferably used.

A mixed layer 171 is formed at an interface with the insulating layer 110 when the aluminum oxide film is formed.

For example, the oxygen gas used for forming the second insulating film exists in a variety of states such as an oxygen radical, an oxygen ion, or an oxygen atom during the formation by a sputtering method owing to the influence of applied voltage, power, plasma, substrate temperature, or the like. At this time, oxygen (excess oxygen, referred to as exO) 172 is added to the insulating layer 110 or the mixed layer 171 (see FIG. 8).

After that, second heat treatment may be performed. The second heat treatment can be performed typically at a temperature higher than or equal to 150° C. and lower than the strain point of the substrate, preferably higher than or equal to 250° C. and lower than or equal to 500° C. and further preferably higher than or equal to 300° C. and lower than or equal to 450° C. By the heat treatment, oxygen 172 added to the insulating layer 110 and the mixed layer is diffused and moved to the oxide semiconductor 122, and oxygen vacancies in the oxide semiconductor 122 can be filled with the oxygen (see FIG. 9).

For example, the second insulating film can be formed by a sputtering method with an aluminum oxide ($AlO_x$) target and 50 vol % of an oxygen gas used as a sputtering gas. The thickness can be 20 nm to 40 nm. The second heat treatment can be performed at 400° C. in an oxygen atmosphere for one hour.

<Oxygen Addition>

The manufacturing method of the transistor 10 is not limited to the above method, and treatment for adding oxygen may be additionally performed. The treatment for adding the oxygen may be performed on the insulating layer 110 or performed on the first oxide semiconductor film or the third oxide semiconductor film 123a described later. As the oxygen to be added, at least one or more of oxygen radicals, oxygen atoms, oxygen atomic ions, oxygen molecular ions, and the like are used. As a method for adding the oxygen, an ion doping method, an ion implantation method, a plasma immersion ion implantation method, or the like can be used.

In the case of using an ion implantation method as the method for adding oxygen, oxygen atomic ions or oxygen molecular ions can be used. The use of oxygen molecular ions can reduce damage to a film to which oxygen is added. Oxygen molecular ions are broken down into oxygen atomic ions at the surface of the film to which oxygen is added, and the oxygen atomic ions are added. Since energy for breaking oxygen molecules down into oxygen atoms is used, the energy per oxygen atomic ion in the case of adding oxygen molecular ions to the film to which oxygen is added is lower than that in the case of adding oxygen atomic ions to the film to which oxygen is added. Therefore, damage to the film to which oxygen is added can be reduced.

In the case of injecting oxygen molecular ions, the energy per oxygen atomic ion is low as compared with the case of injecting oxygen atomic ions. Thus, by using oxygen molecular ions for injection, the acceleration voltage can be increased and throughput can be increased. Moreover, by using oxygen molecular ions for injection, the same amount of oxygen atomic ions can be added at a dose half that necessary in the case of using oxygen atomic ions. As a result, throughput of the manufacturing process can be increased.

In the case of adding oxygen to the film to which the oxygen is added, it is preferable that oxygen be added to the film to which oxygen is added so that a peak of the concentration profile of oxygen atomic ions is located in the film to which oxygen is added. As a result, the acceleration voltage for implantation can be lowered as compared to the case where oxygen atomic ions are implanted, and damage to the film to which oxygen is added can be reduced. In other words, defects in the film to which oxygen is added can be reduced, and variations in electrical characteristics of the transistor can be suppressed. As a result, damage to the film to which oxygen is added can be reduced, suppressing variation in the electrical characteristics of the transistor.

Plasma treatment (plasma immersion ion implantation method) in which the film to which oxygen is added is exposed to plasma generated in an atmosphere containing oxygen may be performed to add oxygen to the film to which the oxygen is added. As the oxygen-containing atmosphere, an atmosphere containing an oxidation gas such as oxygen, ozone, dinitrogen monoxide, or nitrogen dioxide can be given. Note that it is preferable that the film to which the oxygen is added be exposed to plasma generated in a state where bias is applied to the substrate 100 side because the amount of oxygen added to the film to which the oxygen is added can be increased. As an example of an apparatus with which such plasma treatment is performed, an ashing apparatus is given.

For example, oxygen molecular ions can be added to the first oxide semiconductor film by an ion implantation method with a dose of $1 \times 10^{16}/cm^2$ at an acceleration voltage of 5 kV.

Through the above-described steps, which are combined with heat treatment in a later step, the amount of oxygen vacancies in the oxide semiconductor layer 122 can be reduced. Note that the film to which oxygen is added has a low film density compared with the film to which oxygen has not been added yet.

<Formation of Third Insulating Film>

Next, the third insulating film is formed over the second insulating film. The third insulating film can be formed by a plasma CVD method, a thermal CVD method (an MOCVD method or an ALD method), a sputtering method, a spin coating method, or the like with the use of an oxide insulating film of aluminum oxide ($SiO_x$), magnesium oxide ($MgO_x$), silicon oxide ($SiO_x$), silicon oxynitride ($SiO_xN_y$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), or the like; a nitride insulating film of silicon nitride ($SiN_x$), silicon nitride oxide ($SiN_xO_y$), aluminum nitride ($AlN_x$), aluminum nitride oxide ($AlN_xO_y$), or the like; or a mixed material of any of these. Alternatively, a stack of any of the above materials may be used.

Alternatively, a low-dielectric constant material (a low-k material) may be used for the third insulating film. For example, silicon oxide into which several percentage fluorine (F) is introduced (SiOF), silicon oxide into which several percentage carbon (C) is introduced (SiOC), fluorinesilicate glass (FSG), organosilicate glass (OSG), silsesquioxane hydride (HSQ), methylsilsesquioxane (MSQ), an organic polymer, a fluorine resin (polytetrafluoroethylene), polyimide, amorphous carbon to which fluorine is added, or the like can be used.

Note that the second heat treatment may be performed after the formation of the third insulating film.

<Planarization of Third Insulating Film>

Then, planarization treatment is performed on the third insulating film, so that the insulating layer 175b is formed. The planarization treatment can be performed by a CMP (Chemical Mechanical Polishing) method, a dry etching method, a reflow method, or the like. In the case where the CMP method is used to planarize, a film whose composition is different from that of the third insulating film is provided over the third insulating film, whereby the film thickness of the insulating layer 175 in the substrate surface after the CMP treatment can be uniform.

Note that the second heat treatment may be performed after the planarization of the third insulating film.

<Formation of Groove Portion, Source Electrode Layer 130, and Gate Insulating Layer 150>

Figure 10A:
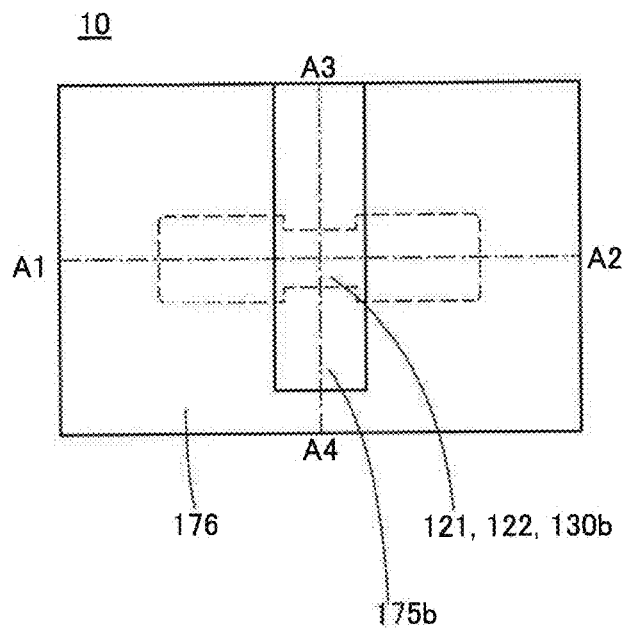
FIG. 10 A top view and cross-sectional views illustrating a manufacturing method of a transistor.
Figure 10B:
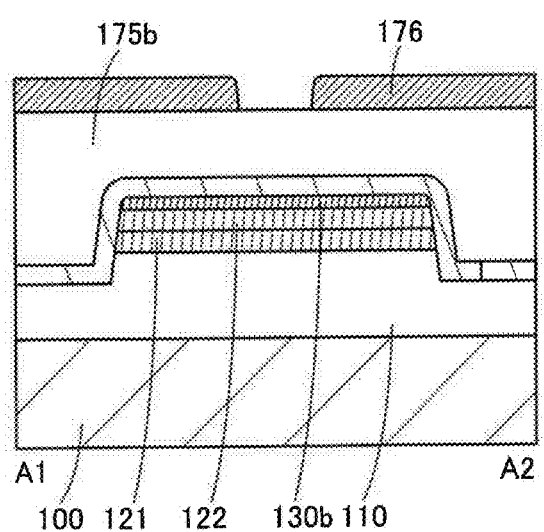
Figure 10C:
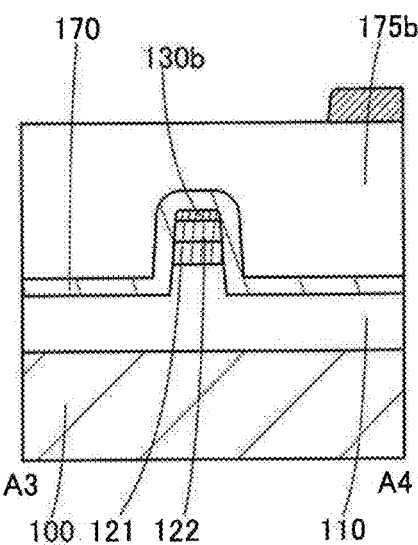

Next, a resist mask 176 is formed over the insulating layer 175b by a lithography process (see FIG. 10). Note that the lithography process may be performed after an organic film is applied to the insulating layer 175b or an organic film is applied to the resist. The organic film contains propylene glycolmonomethyl ether, ethyl lactate, or the like, and has a function as an anti-reflection film (BARC, Bottom Anti Reflective Coating) during light exposure, and has an effect of improving adhesion between the resist and the film and the resolution, and the like.

Note that in the case where a transistor having an extremely short channel length is formed, at least the conductive layer in a region to divide the conductive layer 130b to be the source electrode layer 130 and the drain electrode layer 140 is etched using a resist mask that is processed by a method suitable for micropatterning, such as electron beam exposure, liquid immersion exposure, or EUV exposure. Note that in the case of forming the resist mask by electron beam exposure, a positive resist is used as the resist mask, so that an exposed region can be minimized and throughput can be improved. In the above-described manner, a transistor having a channel length of 100 nm or less, further, 30 nm or less can be formed. Alternatively, minute processing may be performed by an exposure technology which uses light with an extremely short wavelength (e.g., extreme ultraviolet (EUV: Extreme Ultra-violet)), X-rays, or the like.

With the resist mask, groove processing is performed on the insulating layer 175b by a dry etching method. In this state, the etching process selectively proceeds, whereby the groove portion 174 is formed in the insulating layer 175.

Figure 11A:
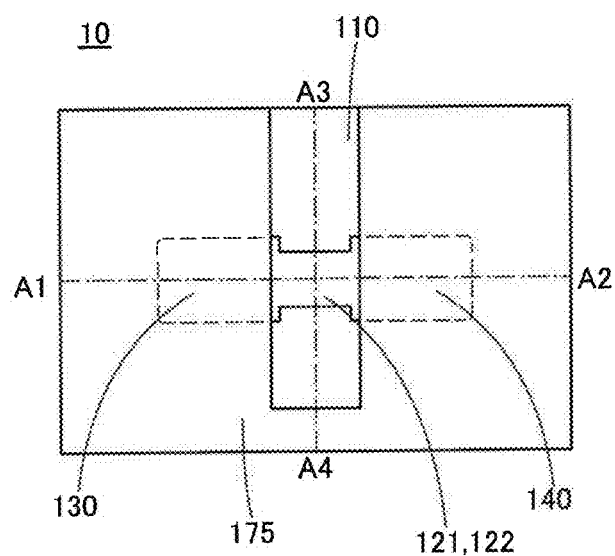
FIG. 11 A top view and cross-sectional views illustrating a manufacturing method of a transistor.
Figure 11B:
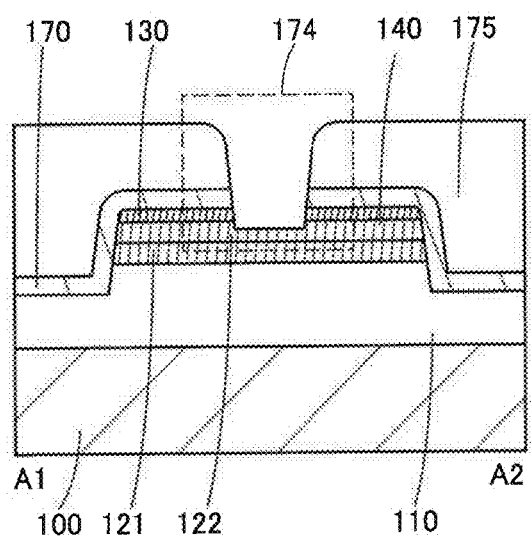
Figure 11C:
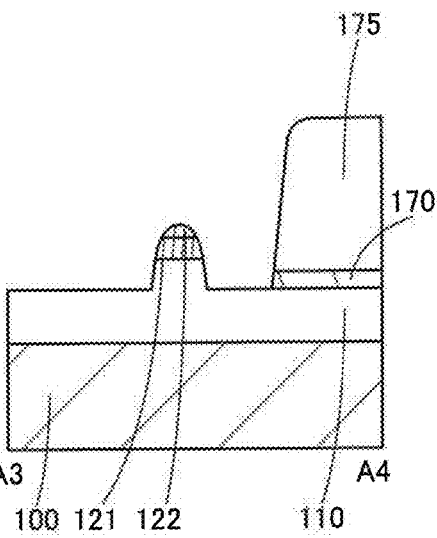

Then, the exposed conductive layer 130b is selectively etched to be divided, so that the source electrode layer 130 and the drain electrode layer 140 can be formed (see FIG. 11).

After the source electrode layer 130 and the drain electrode layer 140 are formed, cleaning treatment may be performed to remove an etching residue. The cleaning treatment can prevent a short circuit between the source electrode layer 130 and the drain electrode layer 140. The cleaning treatment can be performed using an alkaline solution such as a TMAH (Tetramethylammonium Hydroxide) solution, an acidic solution such as diluted hydrofluoric acid, an oxalic acid solution, or a phosphoric acid solution. By the cleaning treatment, part of the oxide semiconductor layer 122 is etched and a depressed portion is formed in the oxide semiconductor layer 122.

Note that the formation order of the oxide semiconductor layer 121, the oxide semiconductor layer 122, the source electrode layer 130, and the drain electrode layer 140 can be changed. For example, the groove portion 174 for forming the source electrode layer 130 and the drain electrode may be formed first and then the oxide semiconductor layer 121 and the oxide semiconductor layer 122 may be formed.

For example, the silicon oxynitride film formed as the second insulating film is planarized, a resist mask is formed over the silicon oxynitride film by a lithography method, an opening treatment is formed in the silicon oxynitride film by a dry etching method using the resist mask and gas containing carbon or fluorine, and dry etching is performed on the conductive layer 130b using a chlorine-based gas or a fluorine-based gas, whereby the source electrode layer 130 and the drain electrode layer 140 can be formed.

<Formation of Third Oxide Semiconductor Film 123a>

Next, the third oxide semiconductor film 123a to be used as the oxide semiconductor layer 123 is formed over the oxide semiconductor layer 122 and the insulating layer 175. The third oxide semiconductor film 123a can be formed in a manner similar to that of the first oxide semiconductor film, and the materials can be selected such that the electron affinity of the third oxide semiconductor film 123a is smaller than that of the second oxide semiconductor film.

For example, as the third oxide semiconductor film 123a, a 5-nm-thick oxide semiconductor film which is formed by a sputtering method using a target having an atomic ratio of In:Ga:Zn=1:3:2 can be used.

<Formation of Insulating Film 150a>

Next, a fourth insulating film 150a to be the gate insulating layer 150 is formed over the oxide semiconductor film 123a. The fourth insulating film 150a can be formed using aluminum oxide ($AlO_x$), magnesium oxide ($MgO_x$), silicon oxide ($SiO_x$), silicon oxynitride ($SiO_xN_y$), silicon nitride oxide, silicon nitride, gallium oxide, germanium oxide, yttrium oxide, zirconium oxide, lanthanum oxide, neodymium oxide, hafnium oxide, tantalum oxide, or the like. Note that the fourth insulating film 150a may be a stack containing any of the above materials. The fourth insulating film 150a can be formed by a sputtering method, a CVD method (e.g., a plasma CVD method, an MOCVD method, or an ALD method), an MBE method, or the like. The fourth insulating film 150a can be formed by a method similar to that of the insulating layer 110 as appropriate.

For example, as the fourth insulating film 150a, a 10-nm-thick silicon oxynitride film can be formed by a plasma CVD method.

<Formation of Conductive Film 160a>

Figure 12A:
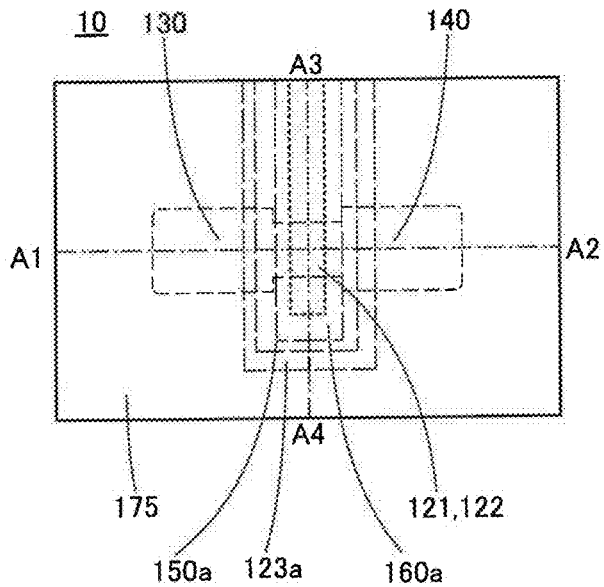
FIG. 12 A top view and cross-sectional views illustrating a manufacturing method of a transistor.
Figure 12B:
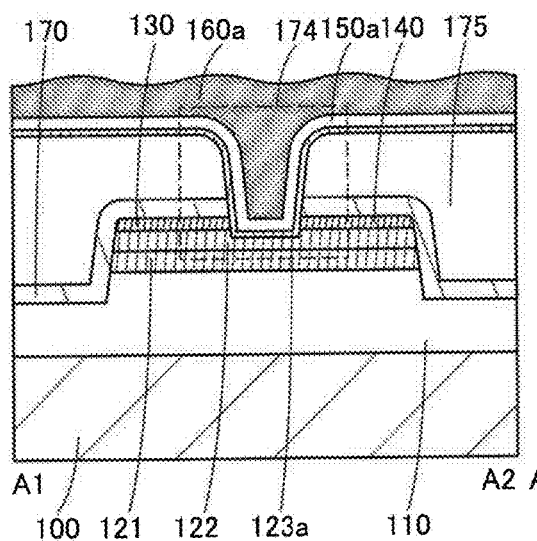
Figure 12C:
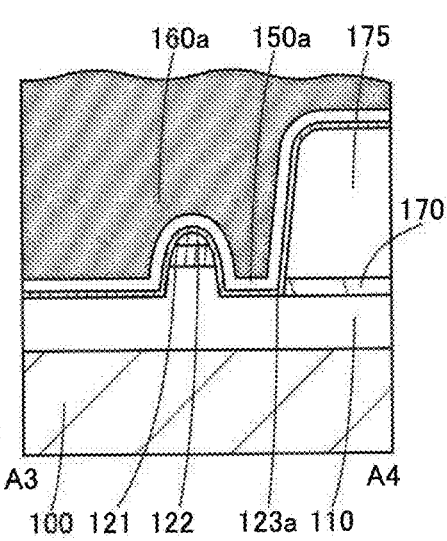
Figure 13A:
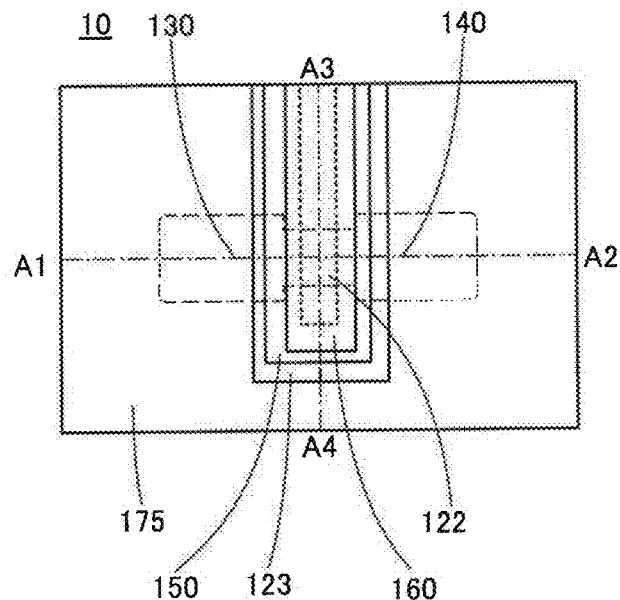
FIG. 13 A top view and cross-sectional views illustrating a manufacturing method of a transistor.
Figure 13B:
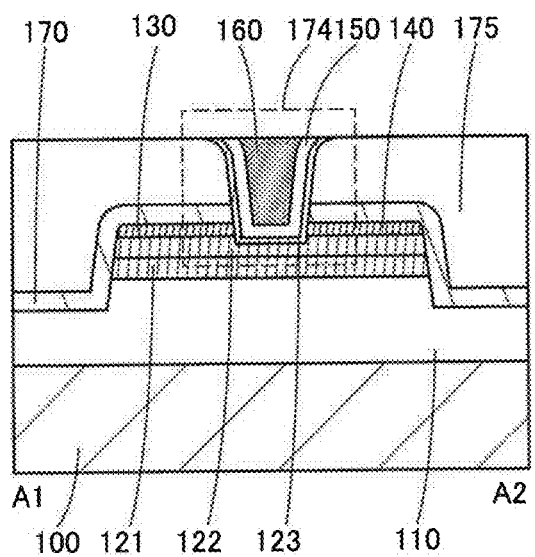
Figure 13C:
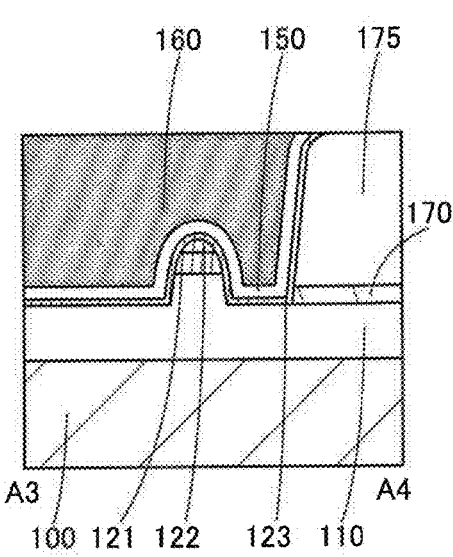

Next, a second conductive film 160a to be the gate electrode layer 160 is formed over the fourth insulating film 150a (see FIG. 12). For example, aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), gold (Au), platinum (Pt), tantalum (Ta), and tungsten (W), or an alloy material containing any of these as its main component can be used for the second conductive film 160a. The second conductive film 160a can be formed by a sputtering method, a CVD method (e.g., a plasma CVD method, an MOCVD method, or an ALD method), an MBE method, an evaporation method, a plating method, or the like. The second conductive film 160a may be formed using a conductive film containing nitrogen or a stack including the above conductive film and a conductive film containing nitrogen. Note that the second conductive film 160a may be either a single layer or a stacked layer.

For example, a stacked structure of 10-nm-thick titanium nitride deposited by an ALD method and 150-nm-thick tungsten deposited by a metal CVD method can be used as the conductive film 160a.

<Planarization Treatment>

Then, planarization treatment is performed. The planarization treatment can be performed by a CMP method, a dry etching method, or the like. The planarization treatment may be terminated at the time when the third insulating film 150a is exposed, may be terminated at the time when the third oxide semiconductor film 123a is exposed, or may be terminated at the time when the insulating layer 175 is exposed. Accordingly, the gate electrode layer 160, the gate insulating layer 150, and the oxide semiconductor layer 123 can be formed (see FIG. 13).

In the case where the oxide semiconductor film 123a or the insulating film 150a is provided over the insulating layer 175 that has been planarized, another resist mask may be used for the processing. The resist mask is formed over the oxide semiconductor film 123a or the insulating film 150a by a lithography process. The mask has a larger area than that of the top surface portion of the gate electrode layer 160, and the insulating film 150a and the oxide semiconductor film 123a are selectively etched using the mask, so that the gate insulating layer 150 and the oxide semiconductor layer 123 can be formed.

In the transistor 10, by providing the oxide semiconductor layer 123 in which oxygen vacancies are unlikely to occur, release of oxygen from a side surface of the oxide semiconductor layer 123 in the channel width direction is suppressed, so that generation of oxygen vacancies can be suppressed. As a result, a transistor that has improved electrical characteristics and high reliability can be provided.

Next, third heat treatment may be performed. The temperature of the heat treatment is typically higher than or equal to 150° C. and lower than the strain point of the substrate, preferably higher than or equal to 250° C. and lower than or equal to 500° C., and further preferably higher than or equal to 300° C. and lower than or equal to 450° C. By the heat treatment, oxygen added to an insulating layer (e.g., the insulating layer 175) is diffused and moved to the oxide semiconductor layer 122, and oxygen vacancies in the oxide semiconductor layer 122 can be filled with the oxygen.

For example, the heat treatment can be performed at 400° C. in an oxygen atmosphere for one hour.

Through the above-described steps, the density of localized states of the oxide semiconductor films is lowered, and thus a transistor with excellent electrical characteristics can be manufactured. In addition, a highly reliable transistor with a small variation in electrical characteristics with time or due to a stress test can be manufactured.

<Modification Example 1 of Transistor 10: Transistor 11>

A transistor 11 with a shape different from that of the transistor 10 illustrated in FIG. 1 will be described with reference to FIG. 14.

Figure 14A:
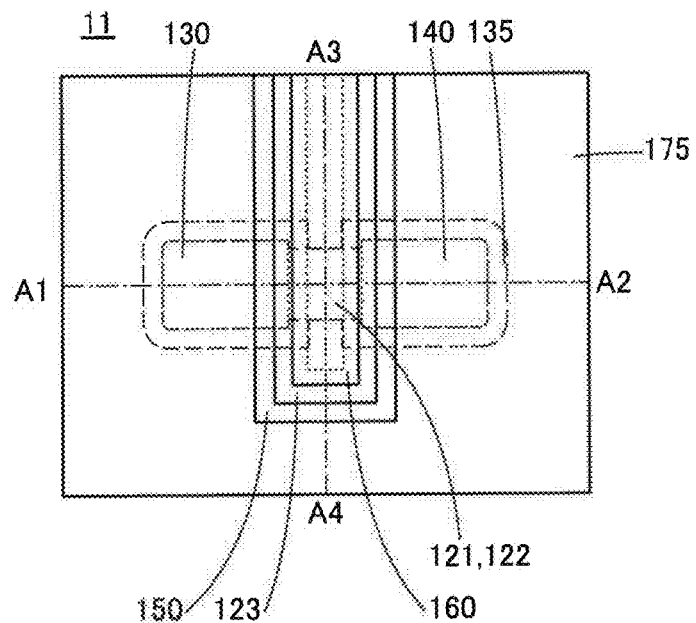
FIG. 14 A top view and cross-sectional views illustrating a transistor.
Figure 14B:
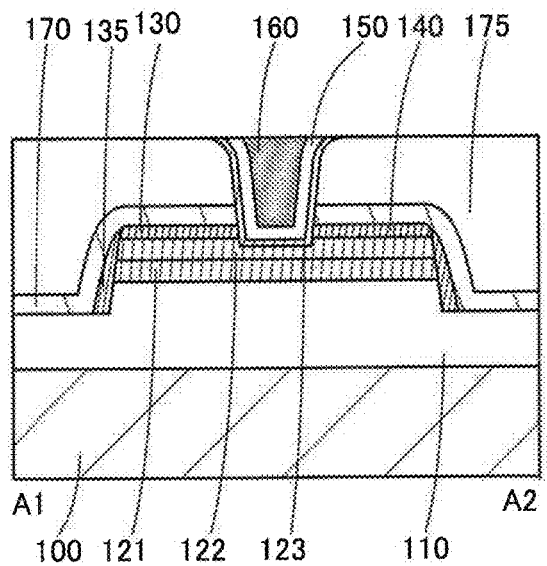
Figure 14C:
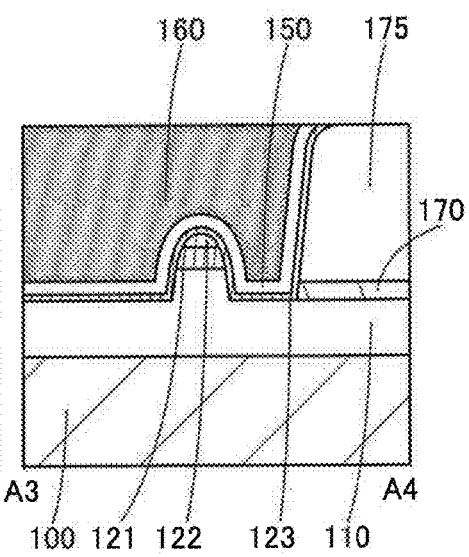

FIG. 14(A), FIG. 14(B), and FIG. 14(C) are a top view and cross-sectional views of the transistor 11. FIG. 14(A) is a top view of the transistor 11, FIG. 14(B) is a cross-sectional view taken along the dashed-dotted line A1-A2 in FIG. 14(A), and FIG. 14(C) is a cross-sectional view taken along the dashed-dotted line A3-4 in FIG. 14(A).

The transistor 11 is different from the transistor 10 in including a conductive layer 135, which is in contact with side surfaces of the oxide semiconductor layer 121 and the oxide semiconductor layer 122 (except for a channel region), side surfaces of the source electrode layer 130 and the drain electrode layer 140, a side surface and a top surface of the insulating layer 110, and a bottom surface of the insulating layer 170, is included. The conductive layer 135 has a side wall shape as shown in FIG. 14(B).

<<Conductive Layer 135>>

The conductive layer 135 is preferably a single layer or a stacked layer of a conductive layer containing a simple substance of a material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy thereof, or a compound of oxygen, nitrogen, fluorine, silicon or the like with any of these as its main component. For example, in the case of stacking layers, the lower conductive layer which is in contact with the oxide semiconductor layer 122 contains a material which is easily bonded to oxygen, and the upper conductive layer contains a highly oxidation-resistant material. It is preferable to use a high-melting-point material which has both heat resistance and conductivity, such as tungsten or molybdenum. In addition, the conductive layers are preferably formed using a low-resistance conductive material such as aluminum or copper. Furthermore, a Cu—Mn alloy is preferably used because manganese oxide is formed at the interface with an insulator containing oxygen and the manganese oxide has a function of preventing Cu diffusion.

With the conductive layer 135, the area of a conductive layer that is in contact with the oxide semiconductor layer 121 and the oxide semiconductor layer 122 can be increased, which increases on-state current.

<Modification Example 2 of Transistor 10: Transistor 12>

A transistor 12 with a shape different from that of the transistor 10 illustrated in FIG. 1 will be described with reference to FIG. 15 and FIG. 16.

Figure 15A:
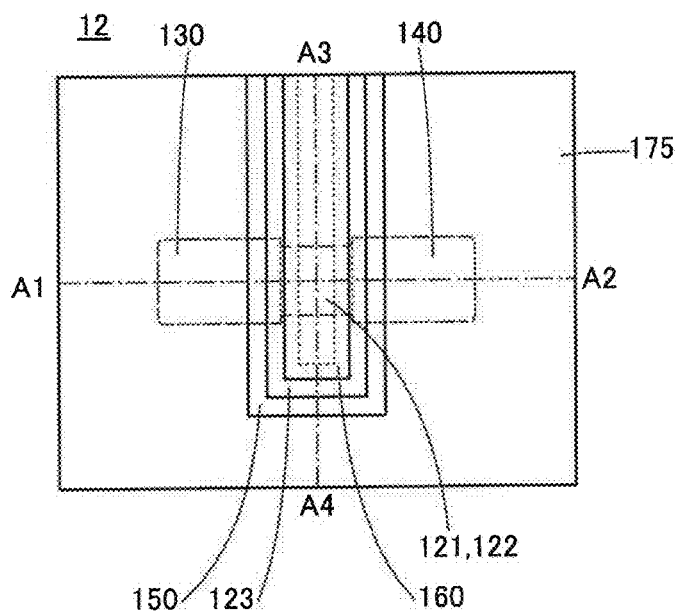
FIG. 15 A top view and cross-sectional views illustrating a transistor.
Figure 15B:
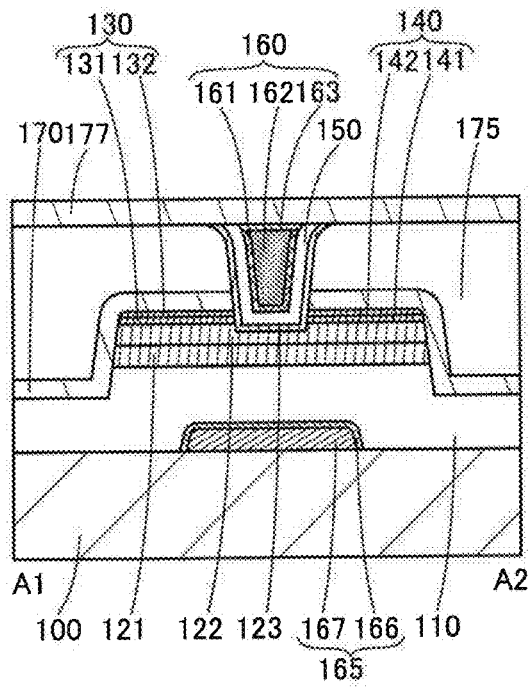
Figure 15C:
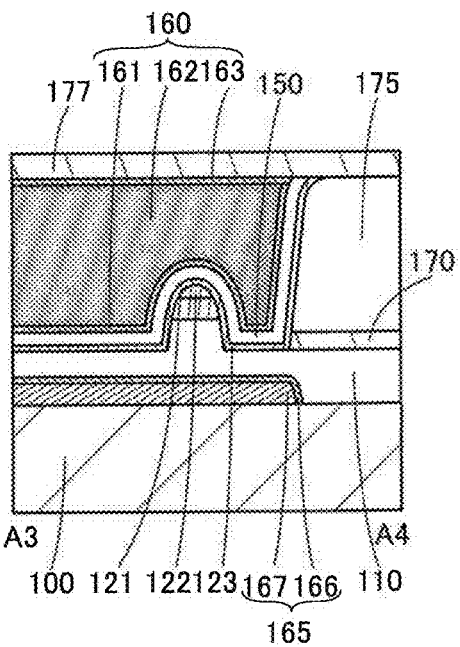
Figure 16A:
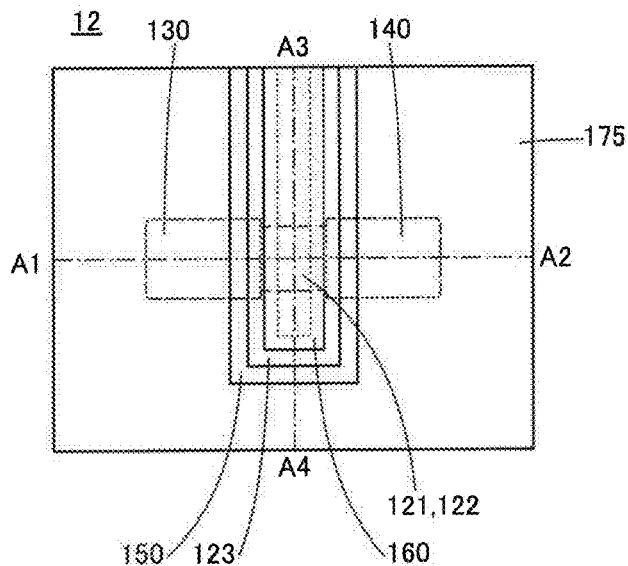
FIG. 16 A top view and cross-sectional views illustrating a manufacturing method of a transistor.
Figure 16B:
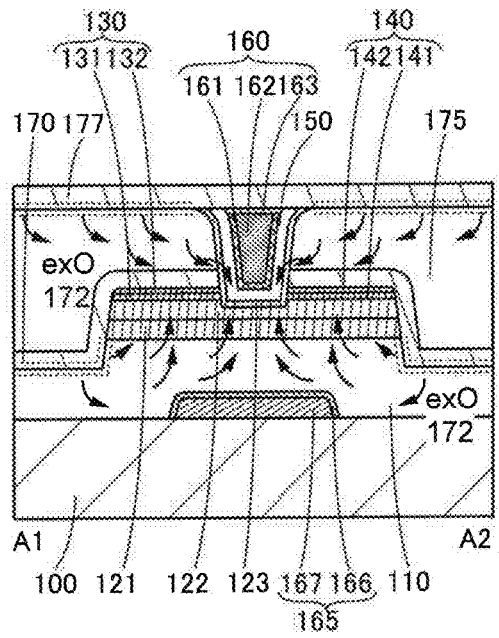
Figure 16C:
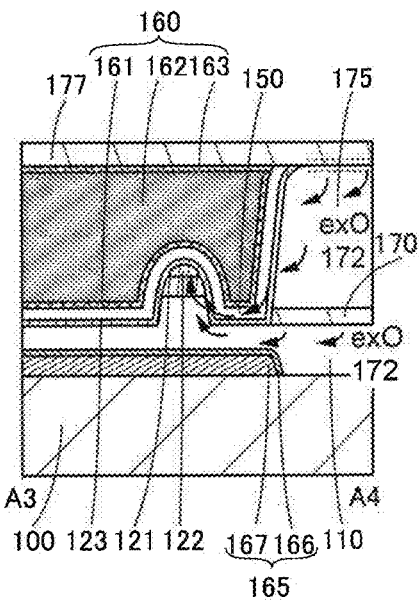

FIG. 15(A), FIG. 15(B), and FIG. 15(C) are a top view and cross-sectional views of the transistor 12. FIG. 15(A) is a top view of the transistor 11, FIG. 15(B) is a cross-sectional view taken along the dashed-dotted line A1-A2 in FIG. 15(A), and FIG. 15(C) is a cross-sectional view taken along the dashed-dotted line A3-4 in FIG. 15(A).

The transistor 12 is different from the transistor 10 in that a conductive layer 165 is provided under the insulating layer 110 and an insulating layer 177 is provided over top surfaces of the insulating layer 175, the oxide semiconductor layer 123, the gate insulating layer 150, and the gate electrode layer 160.

<<Conductive Layer 165>>

The conductive layer 165 can have a function of a bottom gate. The conductive layer 165 can be supplied with the same potential as the gate electrode layer 160 and can be supplied with a different potential from the gate electrode layer 160. The conductive layer 165 is preferably, for example, a single layer or a stacked layer of a conductive layer containing a simple substance of a material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy thereof, or a compound of oxygen, nitrogen, fluorine, silicon or the like containing any of these as its main component. For example, a conductive layer 166 can contain a highly oxidation-resistant material. It is preferable to use a high-melting-point material, such as tungsten or molybdenum, which has both heat resistance and conductivity for a conductive layer 167. In addition, the conductive layers are preferably formed using a low-resistance conductive material such as aluminum or copper.

<<Insulating Layer 177>>

The insulating layer 177 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of aluminum oxide ($AlO_x$), magnesium oxide ($MgO_x$), silicon oxide ($SiO_x$), silicon oxynitride ($Si_xN_y$), silicon nitride oxide ($SiN_xO_y$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), and tantalum oxide ($TaO_x$) can be used. The insulating layer 177 may be a stack of the above materials.

The insulating layer 177 preferably includes an aluminum oxide film. The aluminum oxide film has an effect of blocking the passage of both oxygen and impurities such as hydrogen and moisture through the film. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 121 and the oxide semiconductor layer 122, preventing release of oxygen, which is a main component, from the oxide semiconductor layer 121 and the oxide semiconductor layer 122, and preventing unnecessary release of oxygen from the insulating layer 175.

The insulating layer 177 is preferably a film having oxygen supply capability. For example, the insulating layer 177 is preferably formed using a sputtering method. When the insulating layer 177 is formed, a mixed layer is formed at the interface with the insulating layer 175 and the oxygen 172 can be added to the mixed layer or the insulating layer 175.

For the transistor 12, the third heat treatment can be performed after forming the insulating layer 177. The third heat treatment can be performed typically at a temperature higher than or equal to 150° C. and lower than the strain point of the substrate, preferably higher than or equal to 250° C. and lower than or equal to 500° C. and further preferably higher than or equal to 300° C. and lower than or equal to 450° C. By the third heat treatment, the oxygen 172 added to the insulating layer 175 is diffused and moved to the oxide semiconductor layer 121 and the oxide semiconductor layer 122, and oxygen vacancies that exist in the oxide semiconductor layer 122 can be filled with the oxygen.

The third heat treatment can serve as the second heat treatment. Thus, the oxygen 172 added to the insulating layer 110 and the insulating layer 175 moves to the oxide semiconductor layer 122 through the gate insulating layer 150, the oxide semiconductor layer 123, the oxide semiconductor layer 121, or the like, and oxygen vacancies that exist in the oxide semiconductor layer 122 can be filled with the oxygen (see FIG. 16).

Thus, transistor characteristics (e.g., a threshold voltage or reliability) of the transistor 12 can be improved.

Figure 17A:
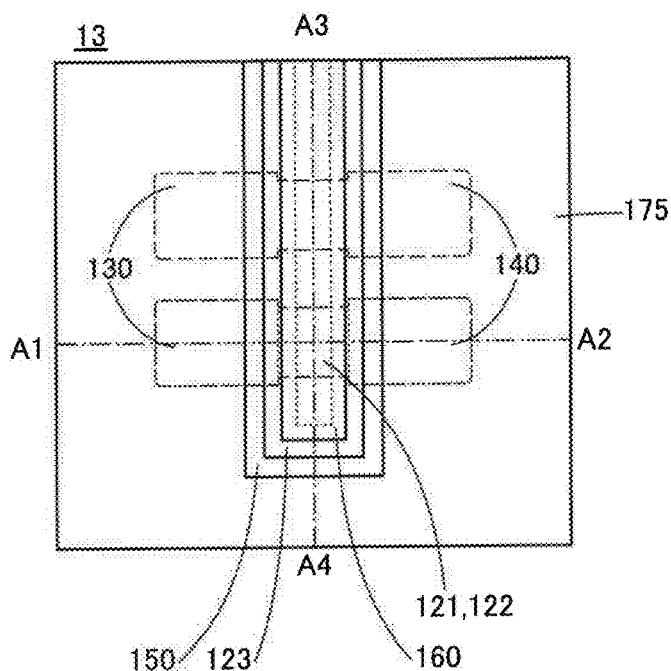
FIG. 17 A top view and cross-sectional views illustrating a transistor.
Figures 17B, 17C:
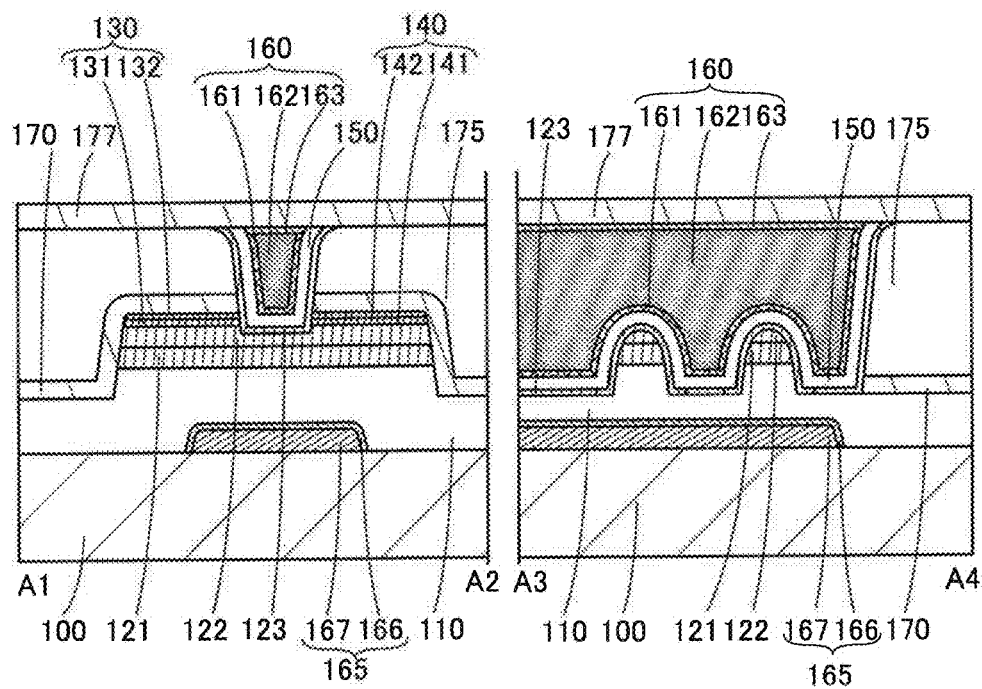
Figure 18:
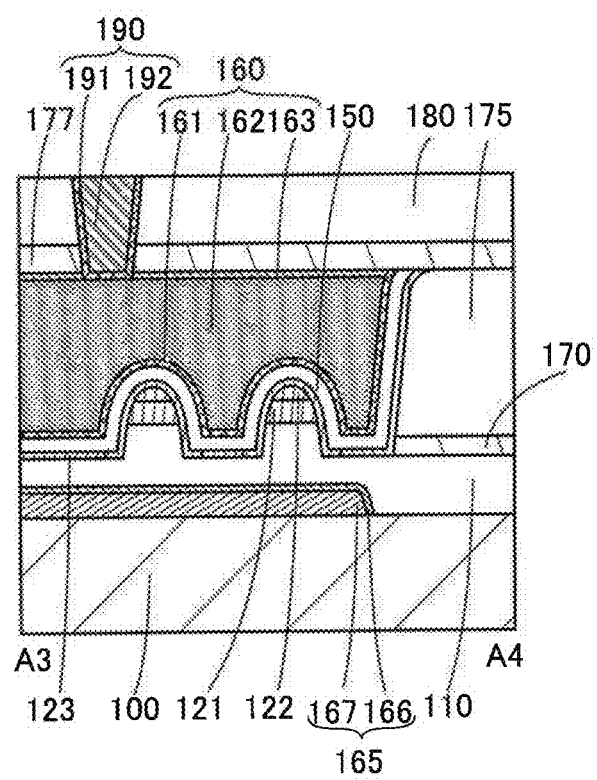
FIG. 18 A top view and a cross-sectional view illustrating a transistor.

Note that the transistor 12 can have a structure in which transistors are provided in parallel (transistor 13) as shown in FIG. 17 (see FIG. 17). Furthermore, the transistor 13 includes an insulating layer 180 over the insulating layer 170 and a conductive layer 190 over the gate electrode layer 160 (a conductive layer 191, a conductive layer 192), and can have a structure in which the gate electrode layer 160 and the conductive layer 190 are electrically connected with each other as illustrated in FIG. 18.

The insulating layer 180 can be formed of a similar material to the insulating layer 175. Furthermore, the conductive layer 190 can be formed of a similar material to that of the gate electrode layer 160.

The transistor 13 can have an increased on-state current while exhibiting favorable transistor characteristics.

Note that this embodiment can be combined with any of the other embodiments and examples in this specification as appropriate.

(Embodiment 2)

In this embodiment, a transistor 14 having a structure different from that of the transistor 10 described in Embodiment 1 and a method for manufacturing the transistor 14 will be described.

<Transistor 14>

Figure 19A:
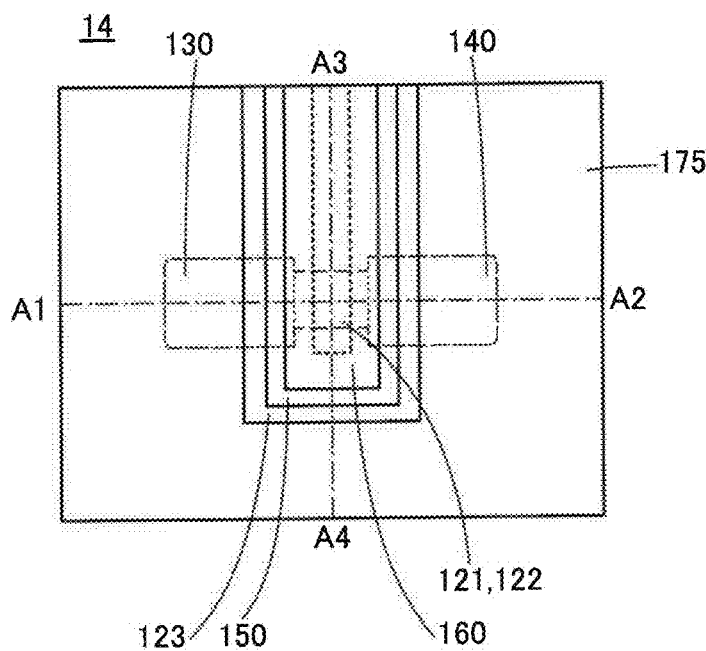
FIG. 19 A top view and cross-sectional views illustrating a transistor.
Figure 19B:
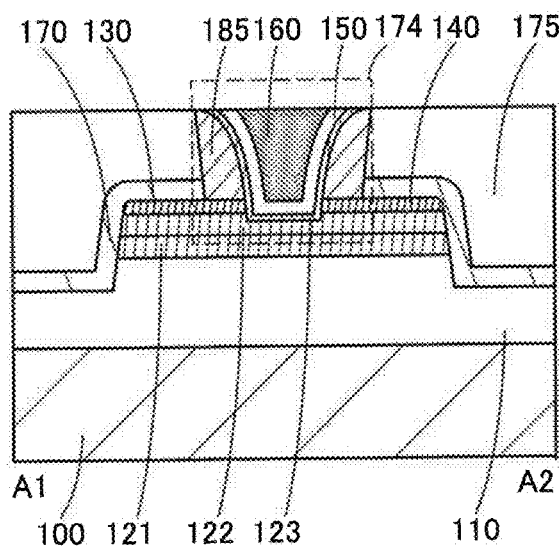
Figure 19C:
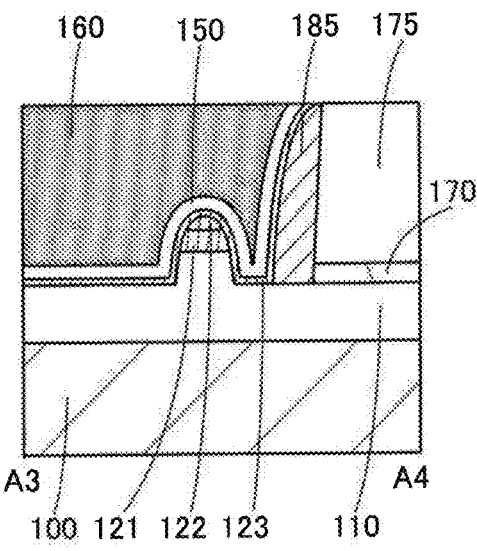

FIG. 19(A), FIG. 19(B), and FIG. 19(C) are a top view and cross-sectional views which illustrate a transistor 14 of one embodiment of the present invention. FIG. 19(A) is a top view, FIG. 19(B) is a cross-sectional view taken along the dashed-dotted line A1-A2 in FIG. 19(A), and FIG. 19(C) is a cross-sectional view taken along the dashed-dotted line A3-4. In FIG. 19(A), some components are scaled up or down or omitted for simplification of the drawing. In some cases, the direction of dashed-dotted line A1-A2 is referred to as a channel length direction, and the direction of dashed-dotted line A3-A4 is referred to as a channel width direction.

The transistor 14 is different from the transistor 10 in that an insulating layer 185 is provided over top surfaces of the source electrode layer 130 and the drain electrode layer 140 in the groove portion 174 as shown in FIG. 19(A), FIG. 19(B), and FIG. 19(C). The insulating layer 185 is in contact with side surfaces of the insulating layer 170 and the insulating layer 175, and the oxide semiconductor layer 123 is provided over the insulating layer 185.

<<Insulating Layer 185>>

The insulating layer 185 can contain oxygen (O), nitrogen (N), fluorine (F), aluminum (Al), magnesium (Mg), silicon (Si), gallium (Ga), germanium (Ge), yttrium (Y), zirconium (Zr), lanthanum (La), neodymium (Nd), hafnium (Hf), tantalum (Ta), titanium (Ti), or the like. For example, an insulating film containing one or more of magnesium oxide ($MgO_x$), silicon oxide ($SiO_x$), silicon oxynitride ($SiO_xN_x$), silicon nitride oxide ($SiN_xO_x$), silicon nitride ($SiN_x$), gallium oxide ($GaO_x$), germanium oxide ($GeO_x$), yttrium oxide ($YO_x$), zirconium oxide ($ZrO_x$), lanthanum oxide ($LaO_x$), neodymium oxide ($NdO_x$), hafnium oxide ($HfO_x$), tantalum oxide ($TaO_x$), and aluminum oxide ($AlO_x$) can be used. Furthermore, the insulating layer 185 may be a stack including any of the above materials. The insulating layer preferably contains oxygen more than that in the stoichiometric composition.

Alternatively, a low-dielectric constant material (Low-k material) may be used for the insulating layer 185. For example, silicon oxide into which several percentage fluorine (F) is introduced (SiOF), silicon oxide into which several percentage carbon (C) is introduced (SiOC), fluorinesilicate glass (FSG), organosilicate glass (OSG), silsesquioxane hydride (HSQ), methylsilsesquioxane (MSQ), an organic polymer, polyimide, a fluorine resin (polytetrafluoroethylene), amorphous carbon to which fluorine is added, or the like can be used. When the low-k material is used for the insulating layer 185, capacitance of the transistor 14 can be further reduced.

In the transistor 14, owing to insulating layer 185, processing below the resolution limit of a device can be performed and minuter processing can be performed; thus, cost for development such as introduction of new equipment can be reduced.

<Manufacturing Method of Transistor 14>

A manufacturing method of the transistor 14 will be described. Note that for steps similar to those of the transistor 10 described in Embodiment 1, the description is referred to.

Figure 20A:
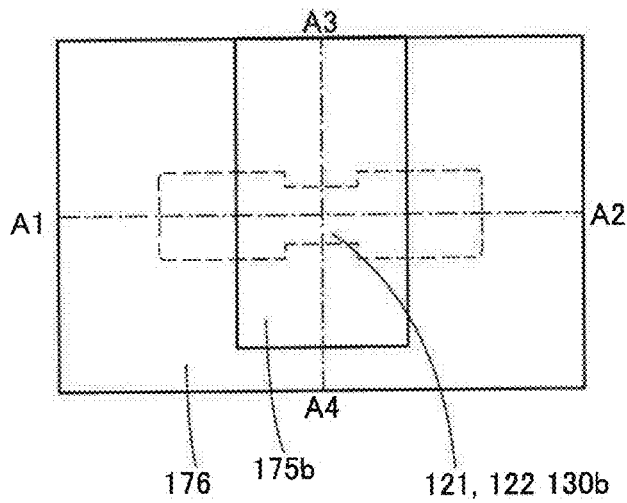
FIG. 20 A top view and cross-sectional views illustrating a manufacturing method of a transistor.
Figure 20B:
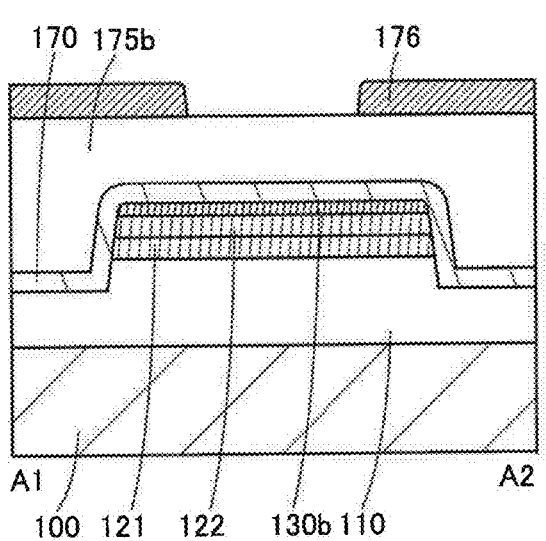
Figure 20C:
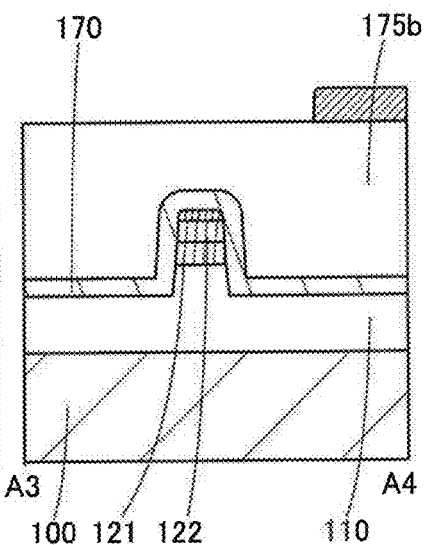

As shown in FIG. 20(A) and FIG. 20(B), after the insulating layer 170 and the insulating layer 175b are formed, the resist mask 176 for forming a groove portion is formed. With the resist mask 176, the size of a groove can be widened (the design rule can be flexible) as compared to that in manufacturing of the transistor 10.

Next, the insulating layer 175b is selectively etched using the resist mask 176, so that the insulating layer 175 is formed.

Then, a fourth insulating film to be the insulating layer 185 is formed. The fourth insulating film can be formed by a plasma CVD method, a thermal CVD method (an MOCVD method, an ALD method), a sputtering method, a spin coating method, or the like.

Next, the insulating layer 185 is formed by etch-back treatment using a dry etching method.

Figure 21A:
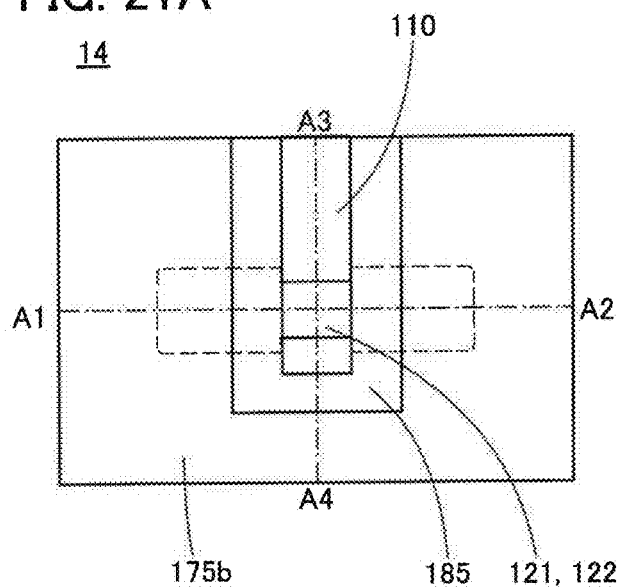
FIG. 21 A top view and cross-sectional views illustrating a manufacturing method of a transistor.
Figure 21B:
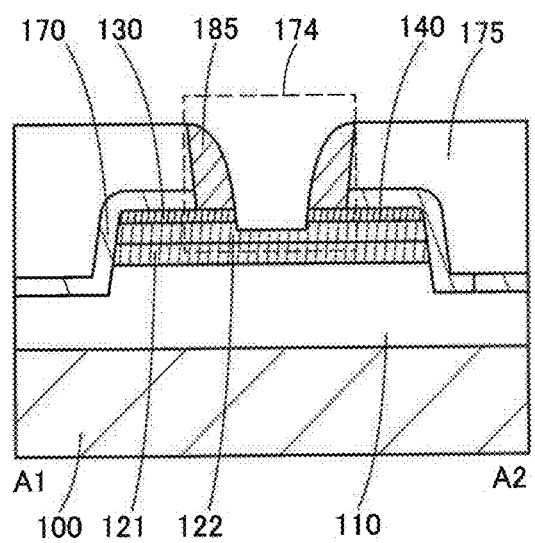
Figure 21C:
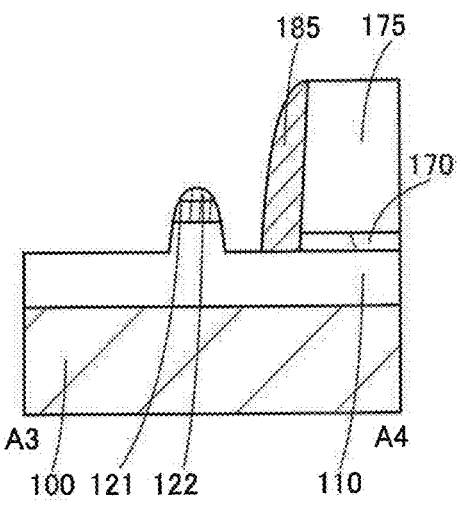

Next, the conductive layer 130b is selectively etched using the insulating layer 185 as a hard mask until the oxide semiconductor layer 122 is exposed, whereby the source electrode layer 130 and the drain electrode layer 140 are formed (see FIG. 21).

Next, the third oxide semiconductor film 123a, the third insulating film 150a, and the conductive film 160a are sequentially formed (see FIG. 22), and planarization treatment is performed, whereby the transistor 14 is manufactured (see FIG. 23).

Note that this embodiment can be combined with any of the other embodiments and examples in this specification as appropriate.

(Embodiment 3)

<Structure of Oxide Semiconductor>

A structure of an oxide semiconductor will be described below.

Oxide semiconductors are classified into a single crystal oxide semiconductor and a non-single-crystal oxide semiconductor. Examples of a non-single-crystal oxide semiconductor include a CAAC-OS (C-Axis Aligned Crystalline Oxide Semiconductor), a polycrystalline oxide semiconductor, a nc-OS (nanocrystalline Oxide Semiconductor), an amorphous-like oxide semiconductor (a-like OS: amorphous like Oxide Semiconductor), and an amorphous oxide semiconductor.

From another perspective, oxide semiconductors are classified into an amorphous oxide semiconductor and a crystalline oxide semiconductor other than that. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. It can also be said that an amorphous structure has a flexible bond angle and a short-range order but does not have a long-range order.

When viewed from the opposite side, an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM: Transmission Electron Microscope), a plurality of pellets can be observed. However, in the high-resolution TEM image, a boundary between pellets, that is, a grain boundary cannot be clearly observed. Thus, in the CAAC-OS, a reduction in electron mobility due to the grain boundary is less likely to occur.

Figure 24A:
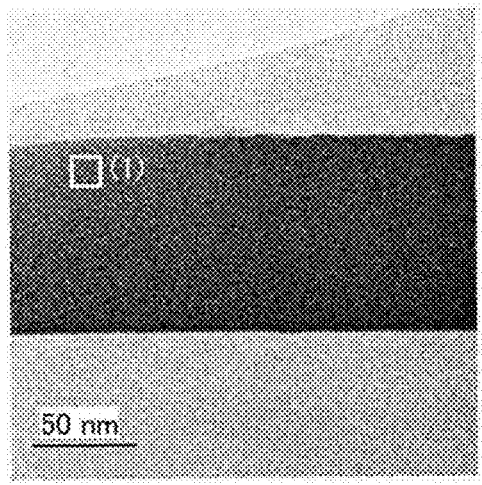
FIG. 24 Cs-corrected high-resolution TEM images of a cross section of a CAAC-OS and a schematic cross-sectional view of the CAAC-OS.

The CAAC-OS observed with a TEM will be described below. FIG. 24(A) shows a high-resolution TEM image of a cross section of the CAAC-OS which is observed from a direction substantially parallel to the sample surface. To observe the high-resolution TEM image, a spherical aberration corrector function is used. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 24B:
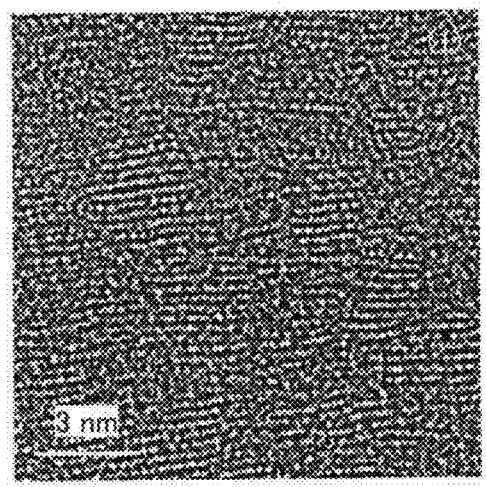

FIG. 24(B) shows an enlarged Cs-corrected high-resolution TEM image of a region (1) in FIG. 24A. According to FIG. 24(B), it can be observed that metal atoms are arranged in a layered manner in a pellet. Each metal atom layer has a configuration reflecting unevenness of a surface over which the CAAC-OS is formed (also referred to as a formation surface) or a top surface of the CAAC-OS, and is arranged parallel to the formation surface or the top surface of the CAAC-OS.

Figure 24C:
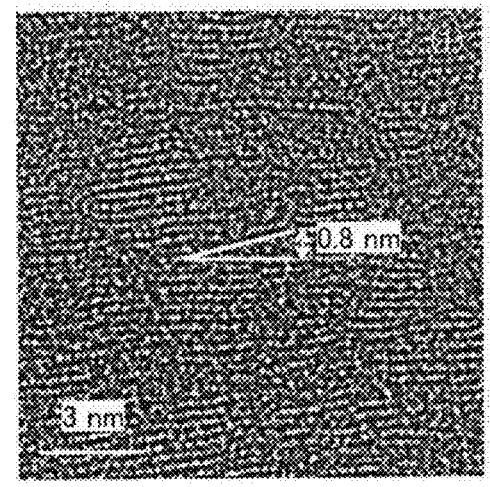

As shown in FIG. 24(B), the CAAC-OS has a characteristic atomic arrangement. The characteristic atomic arrangement is denoted by an auxiliary line in FIG. 24(C). FIG. 24(B) and FIG. 24(C) prove that the size of a pellet is 1 nm or more, or 3 nm or more, and the size of a space caused by tilt of the pellets is approximately 0.8 nm. Therefore, the pellet can also be referred to as a nanocrystal (nc). Furthermore, the CAAC-OS can also be referred to as an oxide semiconductor including CANC (C-Axis Aligned Nanocrystals).

Figure 24D:
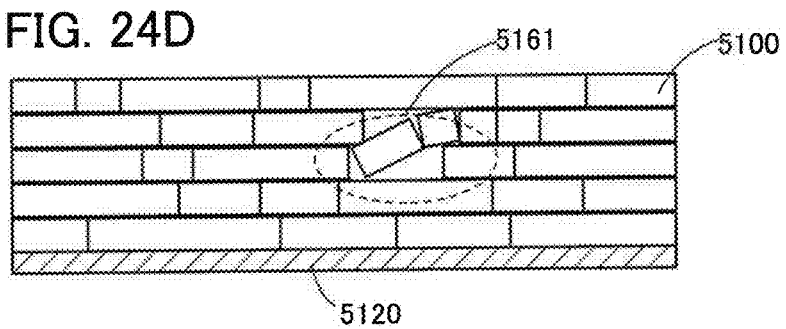

Here, according to the Cs-corrected high-resolution TEM images, the schematic arrangement of pellets 5100 of a CAAC-OS over a substrate 5120 is illustrated by such a structure in which bricks or blocks are stacked (see FIG. 24(D)). The part in which the pellets are tilted as observed in FIG. 24(C) corresponds to a region 5161 shown in FIG. 24(D).

Figure 25A:
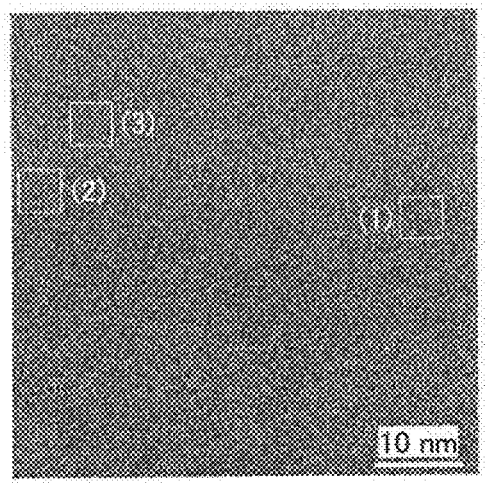
FIG. 25 Cs-corrected high-resolution TEM images of a plane of a CAAC-OS.
Figure 25B:
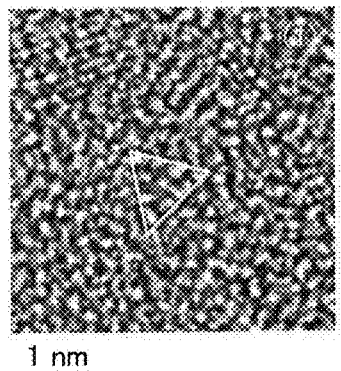
Figure 25C:
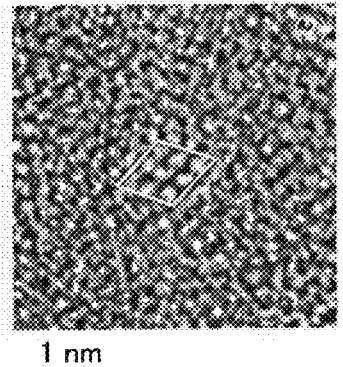
Figure 25D:
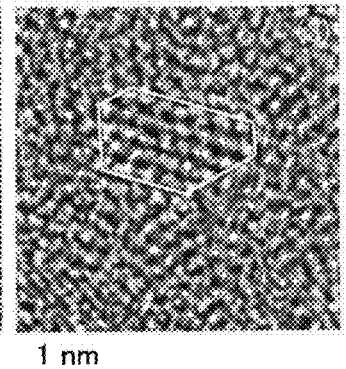

FIG. 25(A) shows a Cs-corrected high-resolution TEM image of a plane of the CAAC-OS observed from a direction substantially perpendicular to the sample surface. FIG. 25(B), FIG. 25(C), and FIG. 25(D) are enlarged Cs-corrected high-resolution TEM images of a region (1), a region (2), and a region (3) in FIG. 25(A), respectively. FIG. 25(B), FIG. 25(C), and FIG. 25(D) indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle ($2\theta$) of around 31° as shown in FIG. 26(A). This peak is derived from the (009) plane of the $InGaZnO_4$ crystal, which indicates that crystals in the CAAC-OS have c-axis alignment, and that the c-axes are aligned in the direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. In a preferable CAAC-OS whose structure is analyzed by an out-of-plane method, a peak appears when $2\theta$ is around 31° and no peak appears when $2\theta$ is around 36°.

On the other hand, in structural analysis of the CAAC-OS by an in-plane method in which an X-ray is incident on a sample in the direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 26(B), a peak is not clearly observed. In contrast, in the case of a single crystal oxide semiconductor of $InGaZnO_4$, when $\phi$ scan is performed with $2\theta$ fixed at around 56°, as shown in FIG. 26(C), six peaks which are derived from crystal planes equivalent to the (110) plane are observed. Accordingly, the structural analysis using XRD shows that the directions of a-axes and b-axes are irregularly oriented in the CAAC-OS.

Figure 27A:
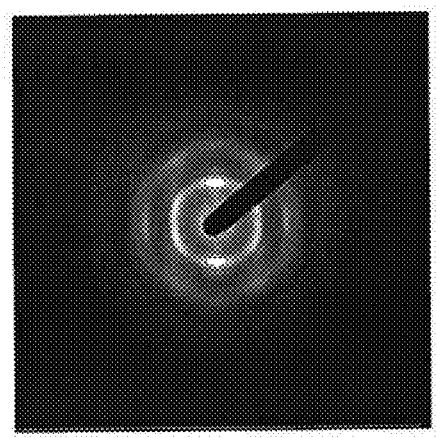
FIG. 27 Views illustrating electron diffraction patterns of a CAAC-OS.
Figure 27B:
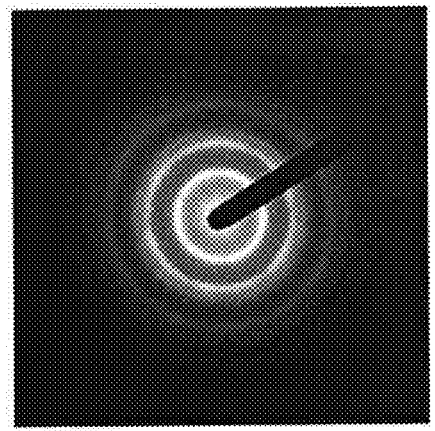

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 27(A) can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 27(B) shows a diffraction pattern obtained in such a manner that an electron beam with a probe diameter of 300 nm is incident on the same sample in a direction perpendicular to the sample surface. As shown in FIG. 27(B), a ring-like diffraction pattern is observed. Thus, the electron diffraction also indicates that the a-axes and b-axes of the pellets included in the CAAC-OS do not have regular alignment. The first ring in FIG. 27(B) is considered to be derived from the (010) plane, the (100) plane, and the like of the $InGaZnO_4$ crystal. The second ring in FIG. 27(B) is considered to be derived from the (110) plane and the like.

As described above, the CAAC-OS is an oxide semiconductor with high crystallinity. Since entry of impurities, formation of defects, or the like might decrease the crystallinity of an oxide semiconductor, when viewed from the opposite side, it is also said that the CAAC-OS is an oxide semiconductor with small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor might serve as carrier traps or serve as carrier generation sources when hydrogen is captured therein.

The CAAC-OS having small amounts of impurities and oxygen vacancy is an oxide semiconductor with a low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane cannot be detected. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots are observed in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is observed in a ring-like region in some cases.

Since there is no regularity of crystal orientation between the pellets (nanocrystals) as mentioned above, the nc-OS can also be referred to as an oxide semiconductor including RANC (Random Aligned nanocrystals) or an oxide semiconductor including NANC (Non-Aligned Nanocrystals).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS is an oxide semiconductor having a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation will be described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value), and the value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 28:
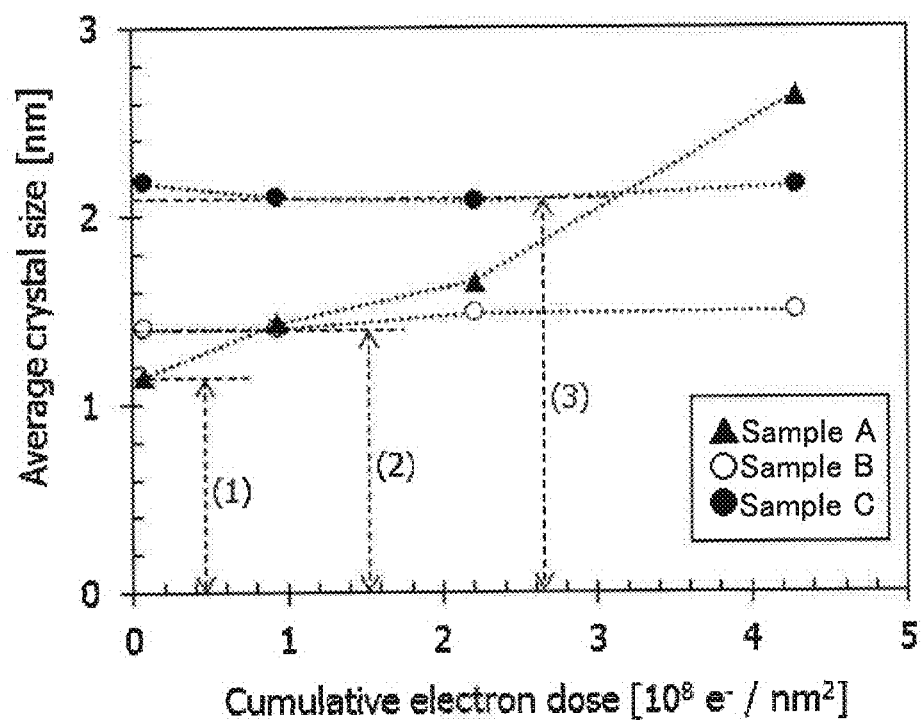
FIG. 28 A view showing a change in crystal part of an In—Ga—Zn oxide induced by electron irradiation.

FIG. 28 shows change in the average size of crystal parts (at 22 points to 45 points) in each sample. Note that the length of a lattice fringe corresponds to the crystal part size. FIG. 28 indicates that the crystal part size in the a-like OS increases with an increase in the cumulative electron dose. Specifically, as shown by (1) in FIG. 28, a crystal part of approximately 1.2 nm at the start of TEM observation (the crystal part is also referred to as an initial nucleus) grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 28, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal having the same composition. The density of each of the nc-OS and the CAAC-OS is higher than or equal to 92.3% and lower than 100% of the density of the single crystal having the same composition. Note that it is difficult to deposit an oxide semiconductor having a density of lower than 78% of the density of the single crystal.

For example, in the case of an oxide semiconductor satisfying In:Ga:Zn=1:1:1 [atomic ratio], the density of single crystal InGaZnO$_4$ with a rhombohedral crystal structure is 6.357 g/cm$^3$. Accordingly, for example, in the case of the oxide semiconductor satisfying In:Ga:Zn=1:1:1 [atomic ratio], the density of the a-like OS is higher than or equal to 5.0 g/cm$^3$ and lower than 5.9 g/cm$^3$. For example, in the case of the oxide semiconductor satisfying In:Ga:Zn=1:1:1 [atomic ratio], the density of each of the nc-OS and the CAAC-OS is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to use as few kinds of single-crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

(Embodiment 4)

In this embodiment, an example of a circuit utilizing the transistor of one embodiment of the present invention will be described with reference to drawings.

<Cross-Sectional Structure>

Figure 29A:
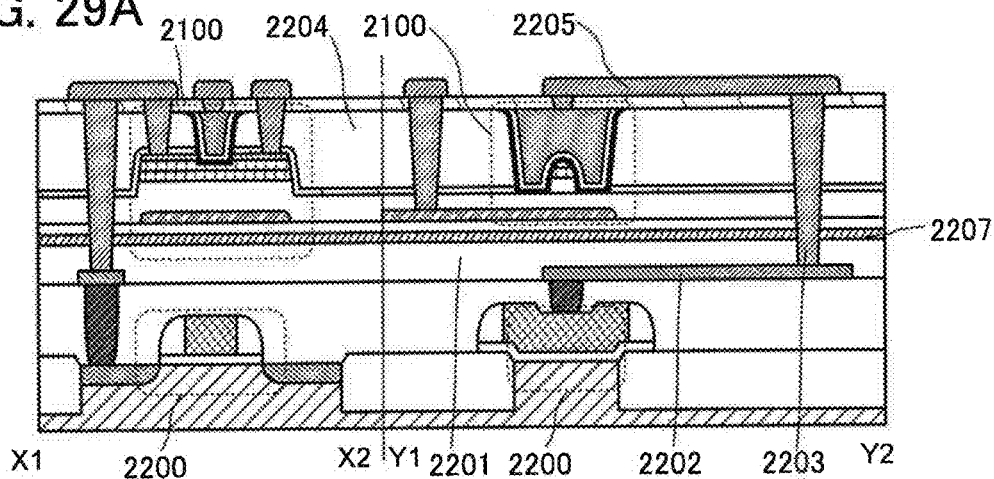
FIG. 29 Cross-sectional views and circuit diagrams of a semiconductor device.

FIG. 29(A) is a cross-sectional view of a semiconductor device of one embodiment of the present invention. In FIG. 29(A), X1-X2 direction represents a channel length direction and Y1-Y2 direction represents a channel width direction. The semiconductor device illustrated in FIG. 29(A) includes a transistor 2200 containing a first semiconductor material in a lower portion and a transistor 2100 containing a second semiconductor material in an upper portion. In FIG. 29(A), an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, when the transistor described in the above embodiment is used as a transistor using an oxide semiconductor, the transistor can have excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which includes an oxide semiconductor.

FIG. 29(A) illustrates a structure in which the transistor 2100 is provided over the transistor 2200 with insulators 2201 and 2207 provided therebetween. Furthermore, a plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

Since the two kinds of transistors are stacked in this manner, the area occupied by the circuit can be reduced, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, providing the insulator 2207 having a function of preventing diffusion of hydrogen between the transistors 2100 and 2200 is particularly effective. The insulator 2207 makes hydrogen remain in the lower portion, thereby improving the reliability of the transistor 2200, and in addition, since the insulator 2207 suppresses diffusion of hydrogen from the lower portion to the upper portion, the reliability of the transistor 2100 can also be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 can be prevented and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor can be a FIN-type transistor, a TRI-GATE transistor, or the like. An example of a cross-sectional view in this case is shown in FIG. 29(D). An insulator 2212 is provided over a semiconductor substrate 2211. The semiconductor substrate 2211 includes a projecting portion with a thin tip (also referred to as a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

<Circuit Configuration Example>

In the above structure, electrodes of the transistor 2100 and the transistor 2200 can be connected as appropriate; thus, a variety of circuits can be formed. Examples of circuit configurations which can be achieved by using the semiconductor device of one embodiment of the present invention will be described below.

<CMOS Inverter Circuit>

Figures 29B, 29C:
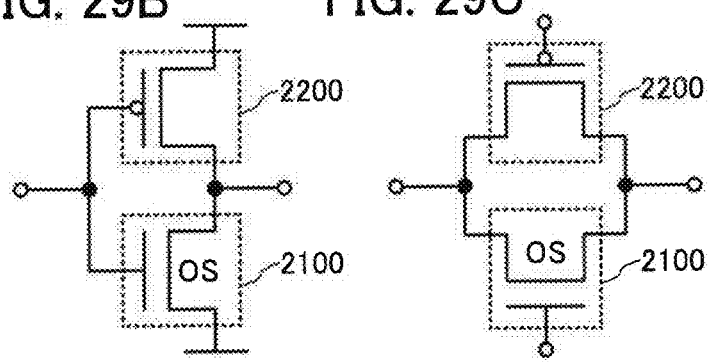
Figure 29D:
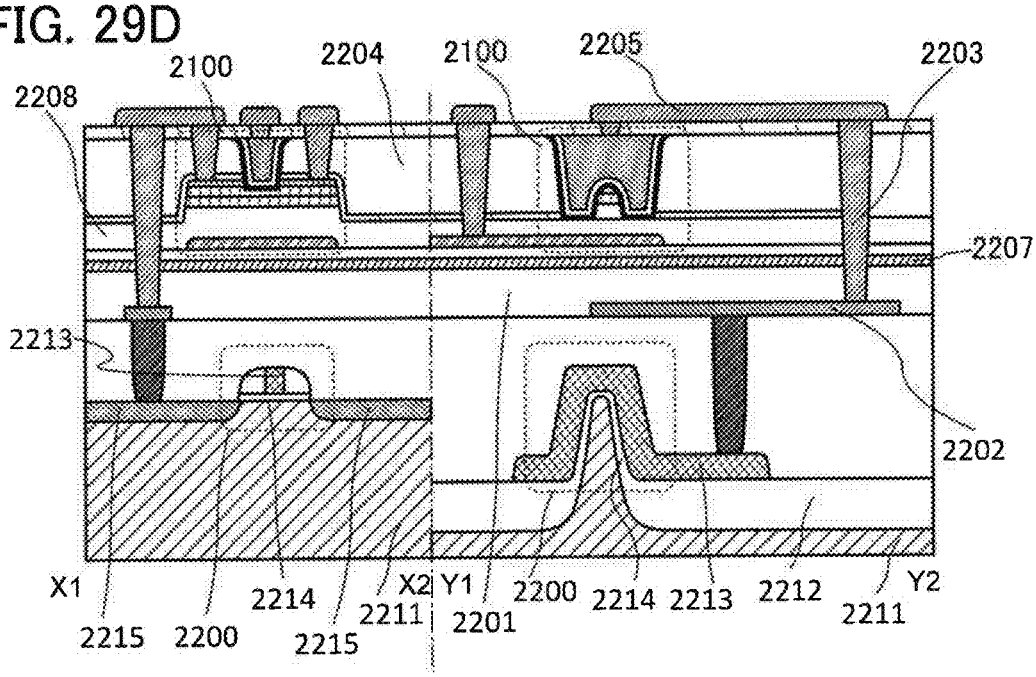

A circuit diagram in FIG. 29(B) shows a configuration of a CMOS inverter in which the p-channel transistor 2200 and the n-channel transistor 2100 are connected to each other in series and in which gates of them are connected to each other.

<CMOS Analog Switch>

A circuit diagram in FIG. 29(C) shows a configuration in which sources of the transistor 2100 and the transistor 2200 are connected to each other and drains thereof are connected to each other. In FIG. 29(A), X1-X2 direction represents a channel length direction and Y1-Y2 direction represents a channel width direction. With such a configuration, the transistors can function as a so-called CMOS analog switch.

<Memory Device Example>

An example of a semiconductor device (memory device) which includes the transistor of one embodiment of the present invention, which can retain stored data even when not powered, and which has an unlimited number of write cycles is shown in FIG. 30.

Figure 30A:
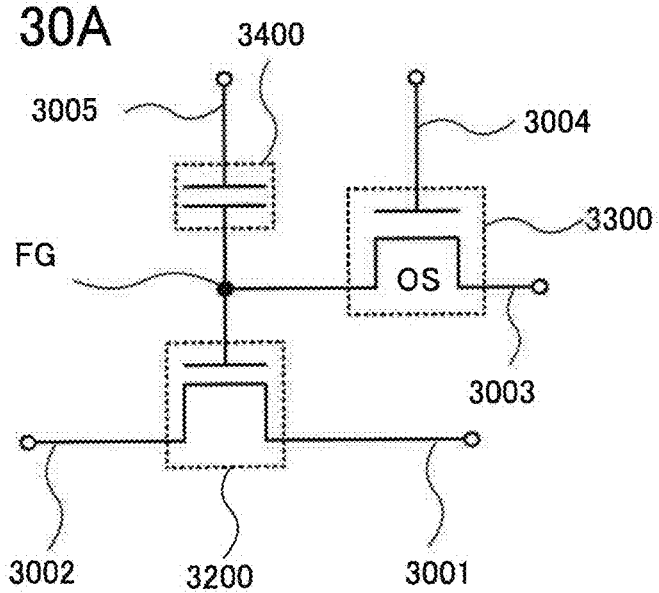
FIG. 30 A cross-sectional view and circuit diagrams of semiconductor devices.

The semiconductor device illustrated in FIG. 30(A) includes a transistor 3200 using a first semiconductor material, a transistor 3300 using a second semiconductor material, and a capacitor 3400. Note that any of the transistors described in Embodiment 1 and 2 can be used as the transistor 3300.

Figure 30B:
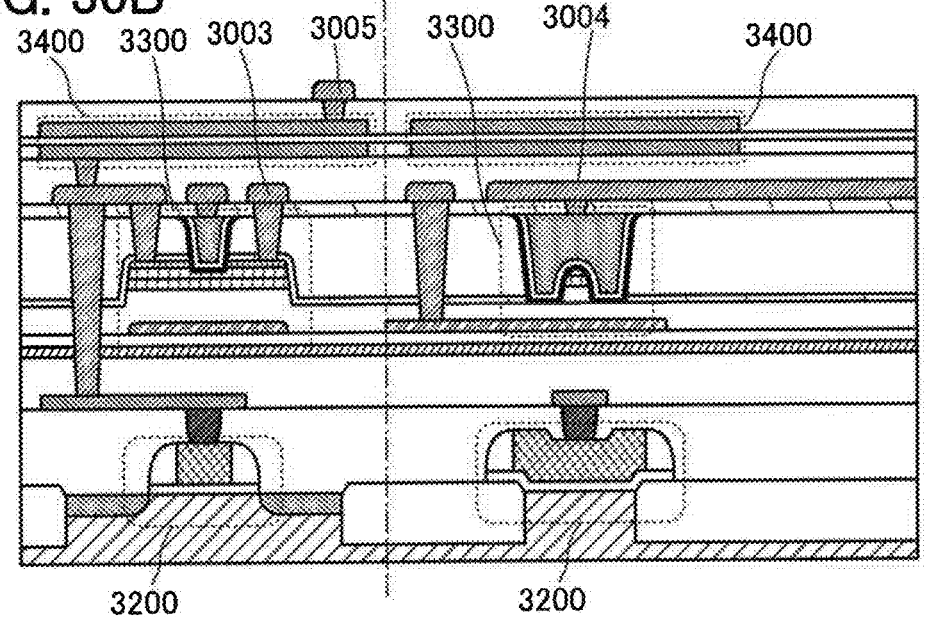

FIG. 30(B) is a cross-sectional view of the semiconductor device illustrated in FIG. 30(A). The semiconductor device in the cross-sectional view has a structure in which the transistor 3300 is provided with a back gate; however, a structure without a back gate may be employed.

Figure 22A:
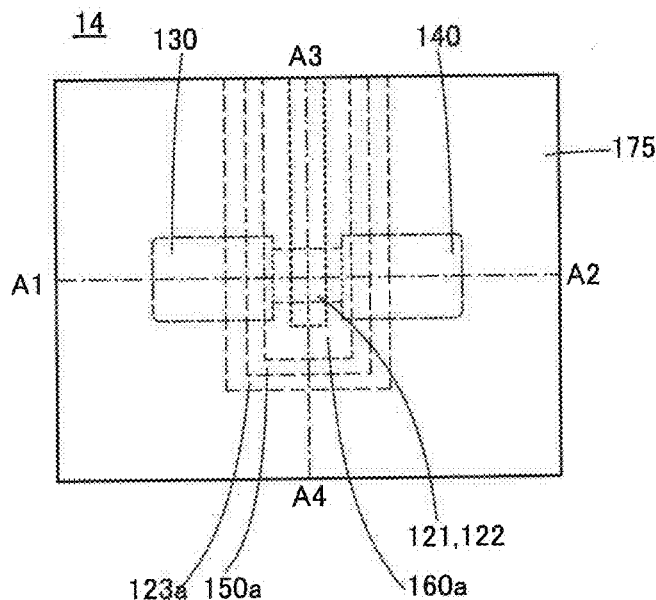
FIG. 22 A top view and cross-sectional views illustrating a manufacturing method of a transistor.
Figure 22B:
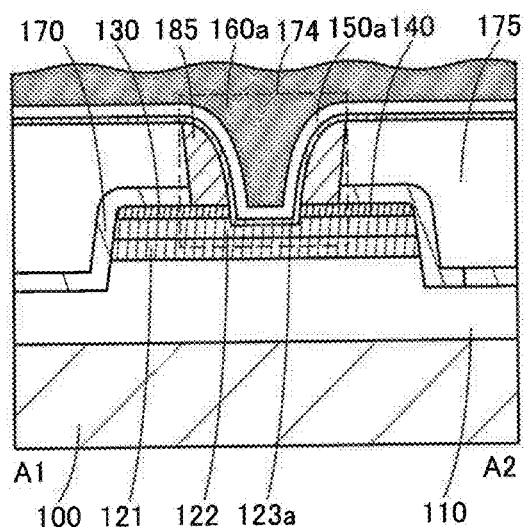
Figure 22C:
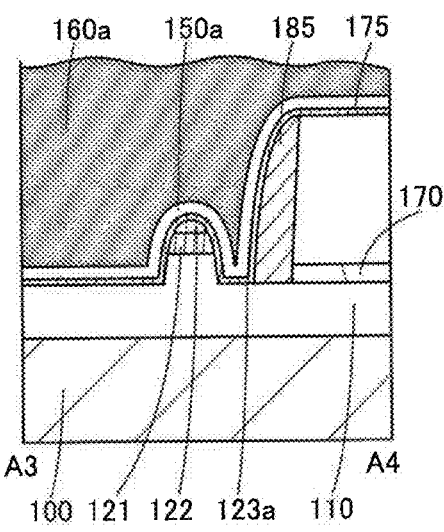

FIG. 30(A) illustrates a structure in which an intermediate layer 2210 has conductivity, and in the case where the intermediate layer 2210 has an insulating property, as in FIG. 22, the transistor 2200 is connected to the transistor 2100 with a wiring 3005.

The transistor 3300 is a transistor in which a channel is formed in a semiconductor layer including an oxide semiconductor. Since the off-state current of the transistor 3300 is low, stored data can be retained for a long time. In other words, a semiconductor memory device in which refresh operation is unnecessary or the frequency of refresh operation is extremely low can be provided, leading to a sufficient reduction in power consumption.

In FIG. 30(A), a first wiring 3001 is electrically connected to a source electrode of the transistor 3200, and a second wiring 3002 is electrically connected to a drain electrode of the transistor 3200. A third wiring 3003 is electrically connected to one of a source electrode and a drain electrode of the transistor 3300, and a fourth wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. A fifth wiring 3005 is electrically connected to the other electrode of the capacitor 3400.

The semiconductor device in FIG. 30(A) utilizes a feature that the potential of the gate electrode of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, one of two kinds of charges providing different potentials (hereinafter referred to as a Low-level charge and a High-level charge) is applied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, when an n-channel transistor is used as the transistor 3200, an apparent threshold voltage $V_{th\_H}$ at the time when the High-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to make the transistor 3200 in an "on state". Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the High-level charge is supplied to the gate of the transistor 3200 in writing and the potential of the fifth wiring 3005 is $V_0$ ($>V_{th\_H}$), the transistor 3200 is in an "on state". In the case where the Low-level charge is supplied to the gate of the transistor 3200 in writing, the transistor 3200 remains in an "off state" even when the potential of the fifth wiring 3005 is $V_0$ ($<V_{th\_L}$). Thus, the data retained in the gate of the transistor 3200 can be read by determining the potential of the second wiring 3002.

In the case where memory cells are arrayed, it is necessary that only data of a designated memory cell(s) can be read. The fifth wiring 3005 in the case where data is not read may be supplied with a potential at which the transistor 3200 is in an "off state" regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

Figure 30C:
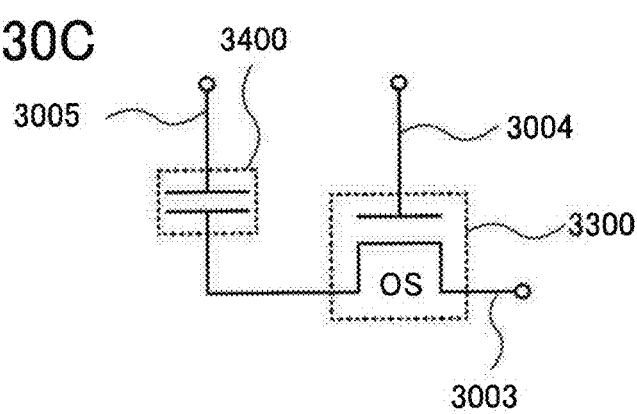

The semiconductor device illustrated in FIG. 30(C) is different from the semiconductor device illustrated in FIG. 30(A) in that the transistor 3200 is not provided. Also in this case, writing and holding of data can be performed in a manner similar to the above.

Next, reading of data will be described. When the transistor 3300 is in an on state, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor containing the first semiconductor material may be used in a driver circuit for driving a memory cell, and a transistor containing the second semiconductor material may be stacked over the driver circuit as the transistor 3300.

The semiconductor device described in this embodiment can retain data for an extremely long period because the transistor in which a channel formation region is formed using an oxide semiconductor and whose off-state current is extremely small is applied thereto. In other words, refresh operation becomes unnecessary or the frequency of the refresh operation can be extremely lowered, which leads to a sufficient reduction in power consumption. Further, stored data can be retained for a long period even during a period in which power is not supplied (note that the potential is preferably fixed).

Further, in the semiconductor device described in this embodiment, high voltage is not needed for writing data and there is no problem of element deterioration. For example, unlike a conventional nonvolatile memory, it is not necessary to inject electrons into a floating gate or extract electrons from a floating gate, and thus a problem such as deterioration of a gate insulating layer does not occur at all. In other words, the semiconductor device according to one embodiment of the present invention does not have a limit on the number of times of data writing, which is a problem in a conventional nonvolatile memory, and reliability thereof is drastically increased. Furthermore, since data is written by the on state or the off state of the transistor, high-speed operation can be easily realized.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where it is considered that the number of portions to which the terminal is connected might be plural, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the invention is clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. Therefore, for example, part of a diagram or a text including one or more of active elements (e.g., transistors and diodes), wirings, passive elements (e.g., capacitors and resistors), conductive layers, insulating layers, semiconductor layers, organic materials, inorganic materials, components, devices, operating methods, manufacturing methods, and the like can be taken out to constitute one embodiment of the invention. For example, from a circuit diagram in which N circuit elements (such as transistors or capacitors) (N is an integer) are provided, it is possible to take out M circuit elements (such as transistors or capacitors) (M is an integer, where M<N) to constitute one embodiment of the invention. For another example, it is possible to take out M layers (M is an integer, where M<N) from a cross-sectional view in which N layers (N is an integer) are provided, to constitute one embodiment of the invention. For another example, it is possible to take out M elements (M is an integer, where M<N) from a flow chart in which N elements (N is an integer) are provided, to constitute one embodiment of the invention.

<Imaging Device>

An imaging device of one embodiment of the present invention will be described below.

Figure 31A:
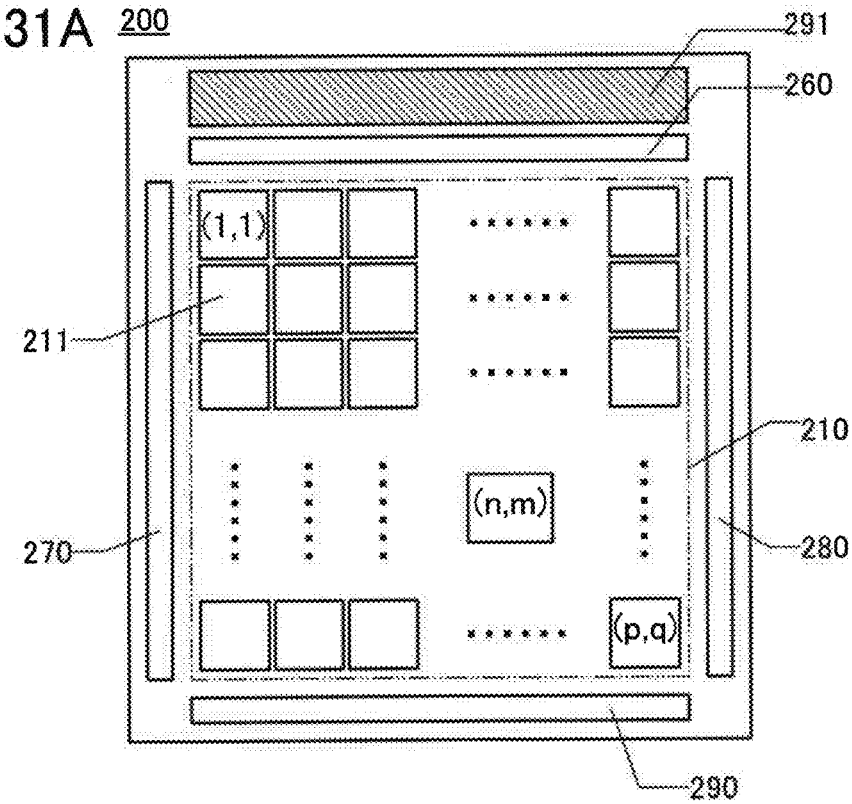
FIG. 31 Plan views each illustrating an imaging device.

FIG. 31(A) is a plan view illustrating an example of an imaging device 200 of one embodiment of the present invention. The imaging device 200 includes a pixel portion 210 and a peripheral circuit 260, a peripheral circuit 270, a peripheral circuit 280, and a peripheral circuit 290 which are peripheral circuits for driving the pixel portion 210. The pixel portion 210 includes a plurality of pixels 211 arranged in a matrix of p rows and q columns (p and q are each an integer of 2 or more). The peripheral circuit 260, the peripheral circuit 270, the peripheral circuit 280, and the peripheral circuit 290 are each connected to a plurality of pixels 211 and each have a function of supplying a signal for driving the plurality of pixels 211. In this specification and the like, in some cases, "a peripheral circuit" or "a driver circuit" indicate all of the peripheral circuit 260, the peripheral circuit 270, the peripheral circuit 280, and the peripheral circuit 290. For example, the peripheral circuit 260 can be regarded as part of the peripheral circuit.

In addition, the imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted over a semiconductor device such as an IC. Note that as the peripheral circuit, one or more of the peripheral circuit 260, the peripheral circuit 270, the peripheral circuit 280, and the peripheral circuit 290 may be omitted.

Figure 31B:
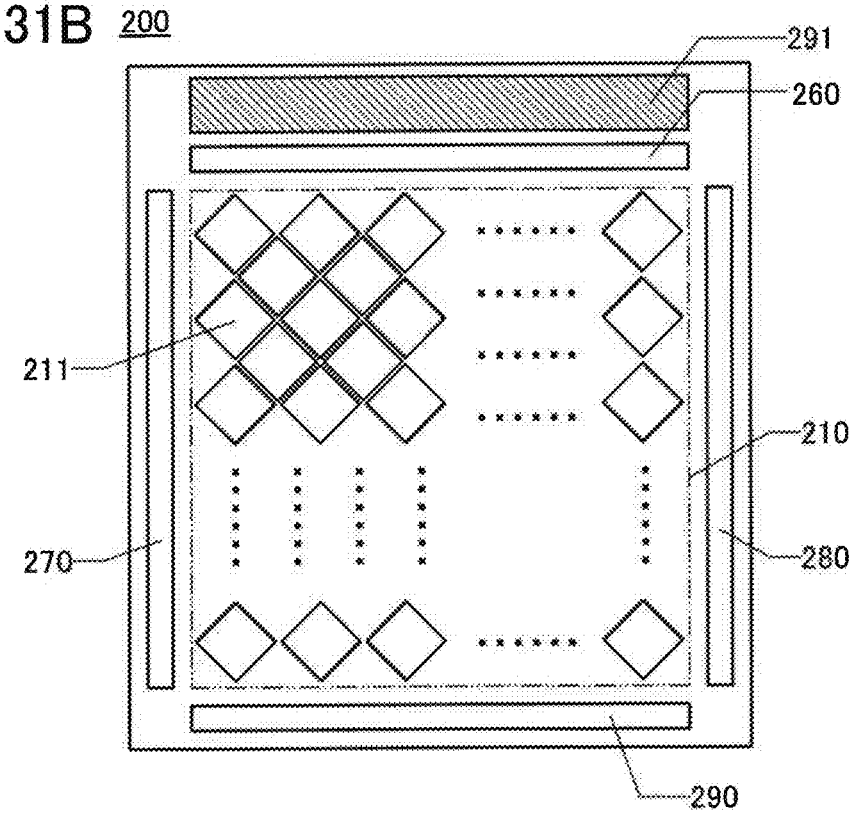

As illustrated in FIG. 31(B), the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 32A:
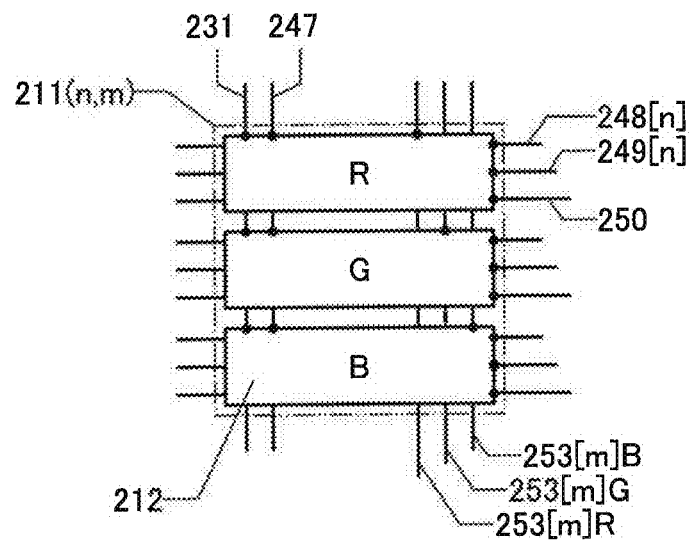
FIG. 32 Plan views of pixels of an imaging device.

FIG. 32(A) is a plan view showing an example of the pixel 211 with which a color image is obtained. The pixel 211 illustrated in FIG. 32(A) includes a subpixel 212 provided with a color filter transmitting light with a red (R) wavelength band (also referred to as a "subpixel 212R"), a subpixel 212 provided with a color filter transmitting light with a green (G) wavelength band (also referred to as a "subpixel 212G"), and a subpixel 212 provided with a color filter transmitting light with a blue (B) wavelength band (also referred to as a "subpixel 212B"). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n], respectively. For example, the wiring 253 connected to the pixel 211 in the m-th column is referred to as a wiring 253[m]. Note that in FIG. 32(A), the wiring 253 connected to the subpixel 212R in the pixel 211 in the m-th column is referred to as a wiring 253[m]R, the wiring 253 connected to the subpixel 212G in the pixel 211 in the m-th column is referred to as a wiring 253[m]G, the wiring 253 connected to the subpixel 212B in the pixel 211 in the m-th column is referred to as a wiring 253[m]B. The subpixels 212 are electrically connected to the peripheral circuit through the above wirings.

Figure 32B:
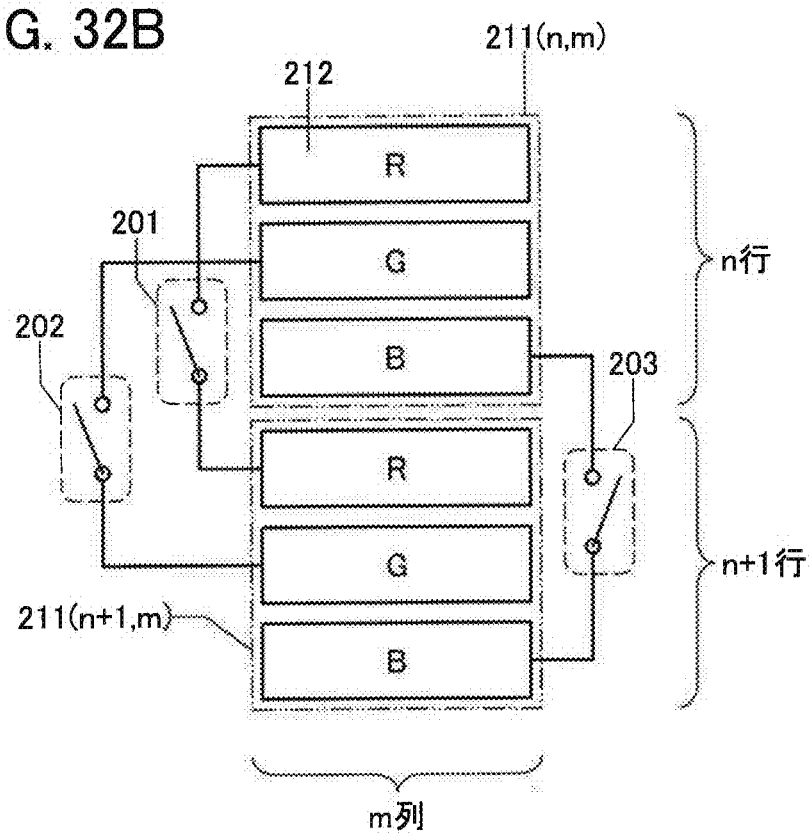

The imaging device 200 has a structure in which the subpixel 212 is electrically connected to the subpixel 212 in an adjacent pixel 211 which is provided with a color filter that transmits light with the same wavelength band as the subpixel 212, via a switch. FIG. 32(B) shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 32(B), the subpixel 212R arranged in the n-th row and the m-th column and the subpixel 212R arranged in the n+1-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the n+1-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter that transmits yellow (Y) light may be provided, in addition to the subpixels 212 provided with the color filters that transmits red (R), green (G), and blue (B) light. The pixel 211 including the subpixel 212 provided with a color filter that transmits blue (B) light may be provided, in addition to the subpixels 212 provided with the color filters that transmits cyan (C), yellow (Y), and magenta (M) light. When the subpixels 212 that sense light with four different wavelength bands are provided in one pixel 211, the reproducibility of colors of an obtained image can be increased.

For example, in FIG. 32(A), in regard to the subpixel 212 that senses a red wavelength band, the subpixel 212 that senses a green wavelength band, and the subpixel 212 that senses a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 that senses the same wavelength band are provided, the redundancy is increased, and the reliability of the imaging device 200 can be increased.

When an IR (IR: Infrared) filter that transmits infrared light and absorbs or reflects visible light is used as the filter, the imaging device 200 that senses infrared light can be obtained.

Furthermore, when a ND (ND: Neutral Density) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Figure 33A:
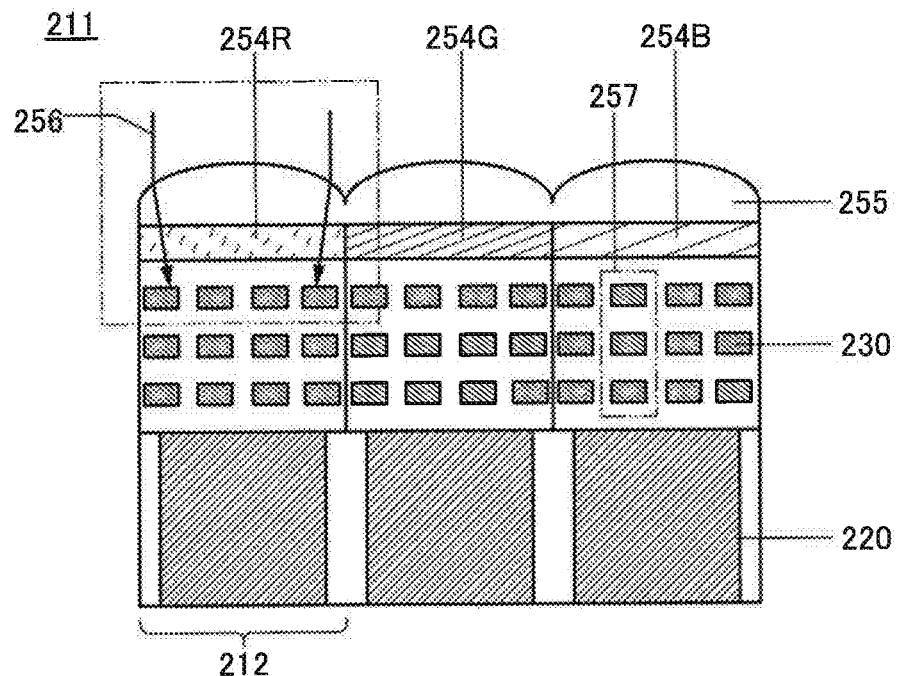
FIG. 33 Cross-sectional views of an imaging device.

Besides the above-described filter, the pixel 211 may be provided with a lens. Here, an arrangement example of the pixel 211, a filter 254, and a lens 255 is described with reference to cross-sectional views in FIG. 33. With the lens 255, the photoelectric conversion element can receive incident light efficiently. Specifically, as illustrated in FIG. 33(A), light 256 enters a photoelectric conversion element 220 through the lens 255, the filter 254 (filters 254R, 254G, and 254B), a pixel circuit 230, and the like which are provided in the pixel 211.

Figure 33B:
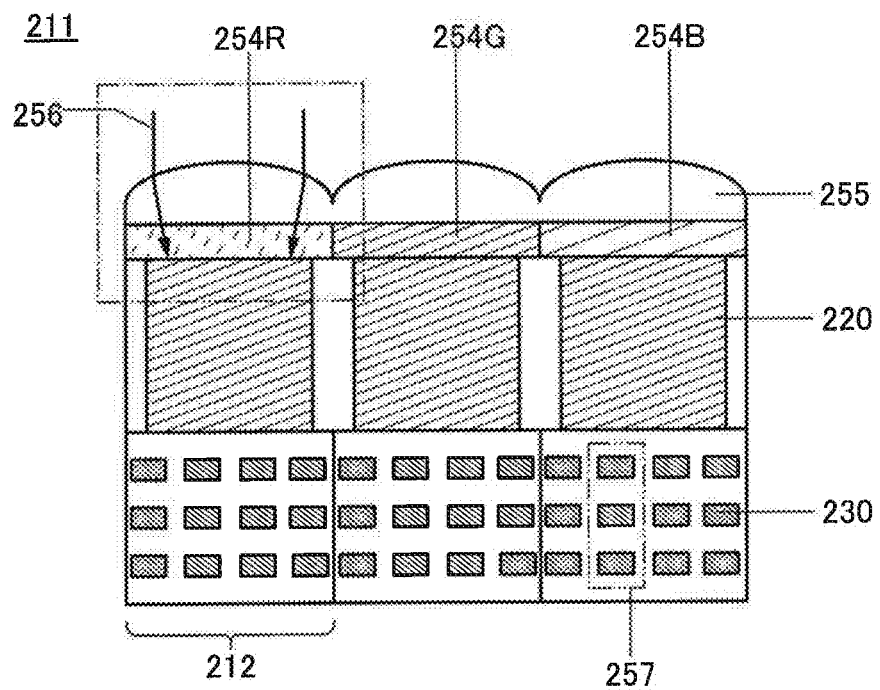

However, part of the light 256 indicated by arrows might be blocked by some wirings 257 as indicated by a region surrounded with dashed-dotted lines. Thus, a preferable structure is that the lens 255 and the filter 254 are provided on the photoelectric conversion element 220 side so that the photoelectric conversion element 220 can efficiently receive the light 256 as illustrated in FIG. 33(B). When the light 256 enters the photoelectric conversion element 220 from the photoelectric conversion element 220 side, the imaging device 200 with high sensitivity can be provided.

As the photoelectric conversion element 220 illustrated in FIG. 33, a photoelectric conversion element in which a p-n junction or a p-i-n junction is formed may be used.

The photoelectric conversion element 220 may be formed using a substance that has a function of absorbing a radiation and generating electric charge. Examples of the substance that has a function of absorbing a radiation and generating electric charge include selenium, lead iodide, mercury iodide, gallium arsenide, cadmium telluride, and a cadmium—zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIG. 32.

<Configuration Example 2 of Pixel>

An example of a pixel including a transistor using silicon and a transistor using an oxide semiconductor will be described below.

Figure 34A:
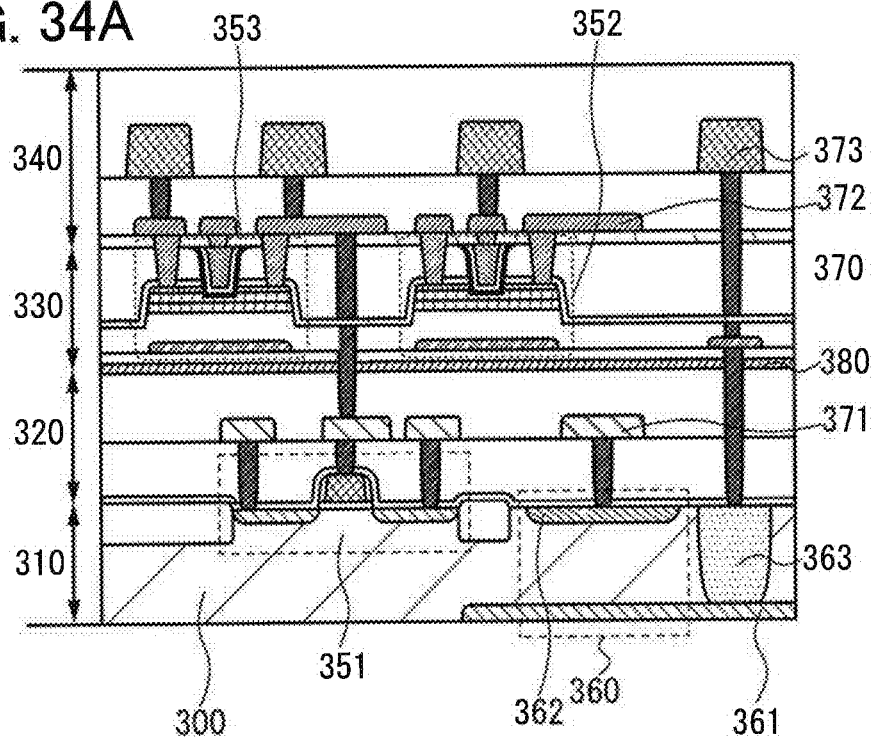
FIG. 34 Cross-sectional views of an imaging device.
Figure 34B:
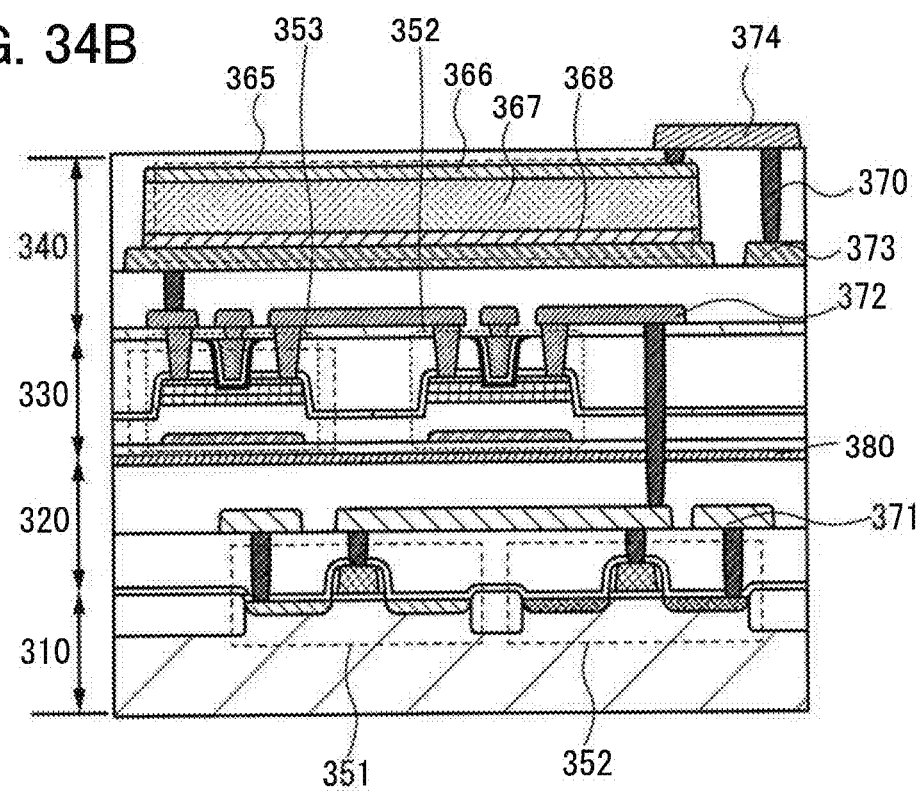

FIG. 34(A) and FIG. 34(B) are each a cross-sectional view of an element included in an imaging device.

The imaging device illustrated in FIG. 34(A) includes a transistor 351 including silicon provided over a silicon substrate 300, a transistor 352 and a transistor 353 which include an oxide semiconductor and are stacked over the transistor 351, and a photodiode 360 provided in the silicon substrate 300 and including an anode 361 and a cathode 362. The transistors and the photodiode 360 are electrically connected to various plugs 370 and wirings 371. In addition, the anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

Note that in the example of the cross-sectional view in FIG. 34(A), a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case of forming a pixel with use of transistors, the layer 310 may be a layer including the transistor. Alternatively, the layer 310 may be omitted, and the pixel may include only transistors.

In addition, in the cross-sectional view in FIG. 34(A), the photodiode 360 in the layer 310 and the transistor in the layer 330 can be formed so as to overlap with each other. Thus, the degree of integration of pixels can be increased. In other words, the resolution of the imaging device can be increased.

An imaging device illustrated in FIG. 34(B) includes a photodiode 365 in the layer 340 and over the transistor. In FIG. 34(B), the layer 310 includes the transistor 351 and a transistor 352 using silicon, the layer 320 includes the wiring 371, the layer 330 includes the transistor 352 and the transistor 353 using an oxide semiconductor layer, the layer 340 includes the photodiode 365. The photodiode 365 includes a semiconductor layer 63, a semiconductor layer 64, and a semiconductor layer 65, and is electrically connected to the wiring 373 and a wiring 374 through the plug 370.

The element structure illustrated in FIG. 34(B) can increase the aperture ratio.

Alternatively, a pin-type diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Note that this embodiment can be combined with any of the other embodiments and examples in this specification as appropriate.

(Embodiment 5)

<RF Tag>

In this embodiment, an RF tag that includes the transistor described in the above embodiments or the memory device described in the above embodiment is described with reference to FIG. 35.

The RF tag of this embodiment includes a memory circuit, stores necessary data in the memory circuit, and transmits and receives data to/from the outside with use of contactless means, for example, wireless communication. The RF tag with these features can be used for an individual authentication system in which an object or the like is recognized by reading the individual information, for example. In order that the RF tag is used for such application, extremely high reliability is needed.

A configuration of the RF tag is described with reference to FIG. 35. FIG. 35 is a block diagram illustrating a configuration example of an RF tag.

Figure 35:
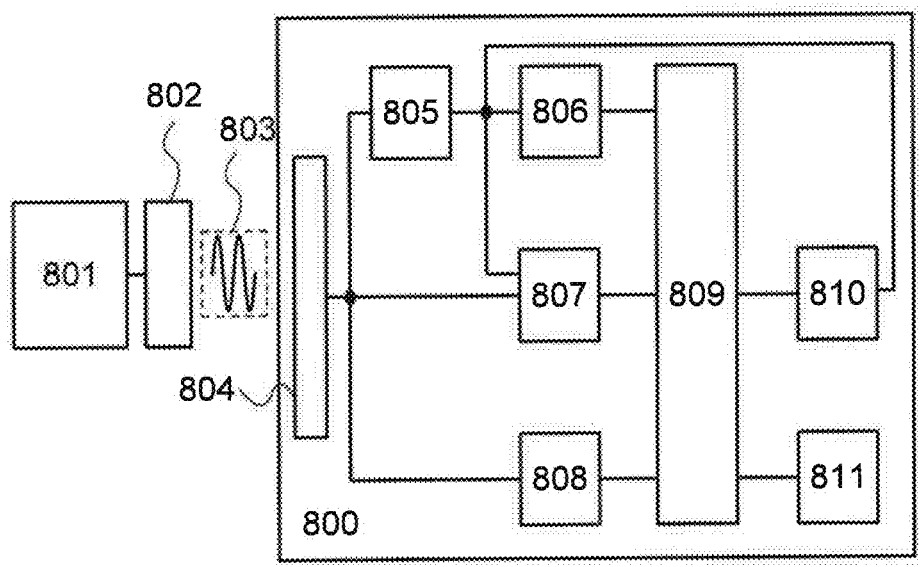
FIG. 35 A view illustrating a configuration example of an RF tag.

As shown in FIG. 35, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress reduction of a rectifying function due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the configuration of each circuit will be described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit is a circuit which controls power so that power that is higher than or equal to certain power is not input to a circuit in a later stage if the amplitude of the input alternating signal is high and an internal generation voltage is high.

The constant voltage circuit 806 is a circuit that generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 is a circuit that demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit described above is provided or not can be determined as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, putting identification numbers only to good products to be shipped is possible; thus, the identification numbers of the shipped products are in series and customer management corresponding to the shipped products is easily performed.

Note that this embodiment can be combined with any of the other embodiments and examples in this specification as appropriate.

(Embodiment 6)

In this embodiment, a CPU that includes the memory device described in the above embodiment is described.

Figure 36:
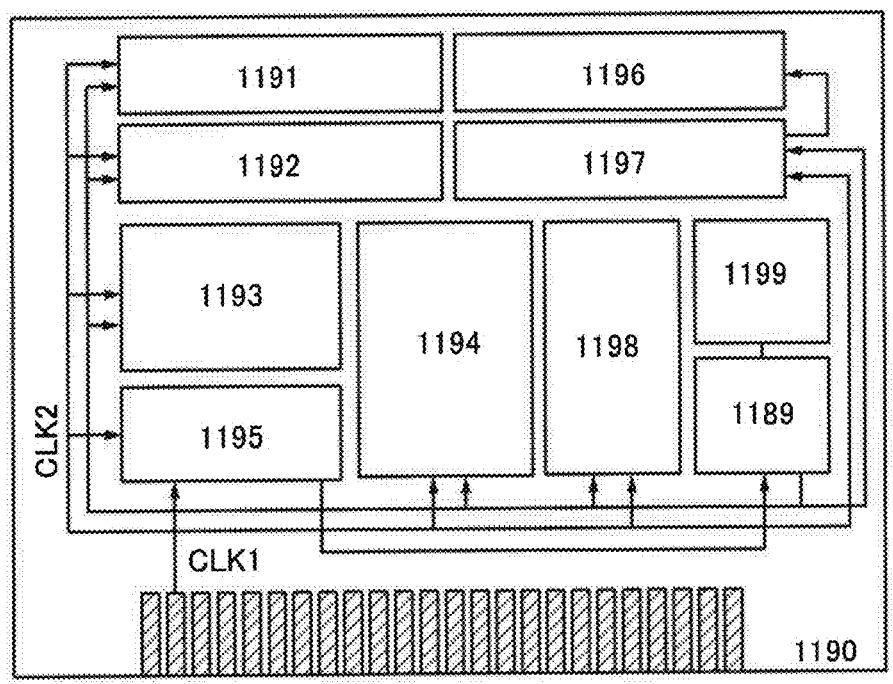
FIG. 36 A view illustrating a configuration example of a CPU.

FIG. 36 is a block diagram illustrating a configuration example of a CPU at least partly including any of the transistors described in the above embodiments as a component.

<Circuit Diagram of CPU>

The CPU illustrated in FIG. 36 includes, over a substrate 1190, an ALU 1191 (ALU: Arithmetic logic unit, arithmetic circuit), an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU shown in FIG. 36 is just an example in which the structure is simplified, and an actual CPU may have a variety of configurations depending on the application. For example, the CPU may have the following configuration: a structure including the CPU illustrated in FIG. 36 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 36, a memory cell is provided in the register 1196. For the memory cell of the register 1196, any of the transistors described in Embodiments 1 to 3 can be used.

In the CPU illustrated in FIG. 36, the register controller 1197 selects the holding operation in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

<Memory Circuit>

Figure 37:
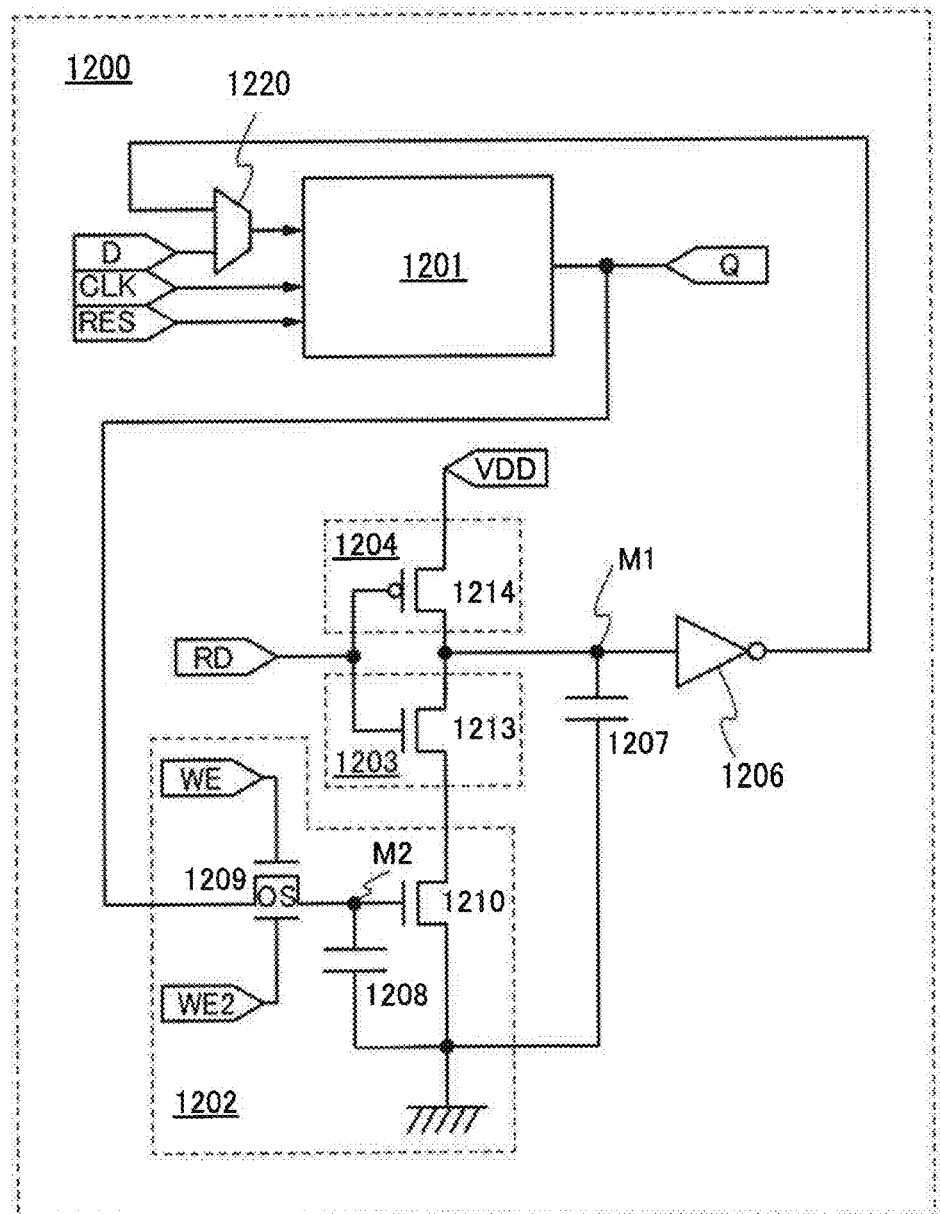
FIG. 37 A circuit diagram of a memory element.

FIG. 37 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the storage device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on state or the off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 can be omitted as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 37 has a structure with a second gate (second gate electrode: back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and a current when a gate voltage VG is 0 V) can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 36 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In FIG. 37, an example where a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 37, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer formed using a semiconductor other than an oxide semiconductor or in the substrate 1190 can be used for the rest of the transistors.

As the circuit 1201 in FIG. 37, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can hold data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal held by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, after the supply of the power supply voltage is restarted, the storage device can be returned to the same state in a short time as that before the power supply is stopped. Therefore, since the power supply can be stopped even for a short time in the processor or one or more of logic circuits included in the processor, power consumption can be reduced.

Although an example in which the memory element 1200 is used in a CPU is described in this embodiment, the memory element 1200 can also be used in an LSI such as a DSP (Digital Signal Processor), a custom LSI, or a PLD (Programmable Logic Device), and a RF (Radio Frequency) tag.

Note that this embodiment can be combined with any of the other embodiments and examples in this specification as appropriate.

(Embodiment 7)

In this embodiment, configuration examples of a display device using a transistor of one embodiment of the present invention will be described.

<Circuit Configuration Example of Display Device>

Figure 38A:
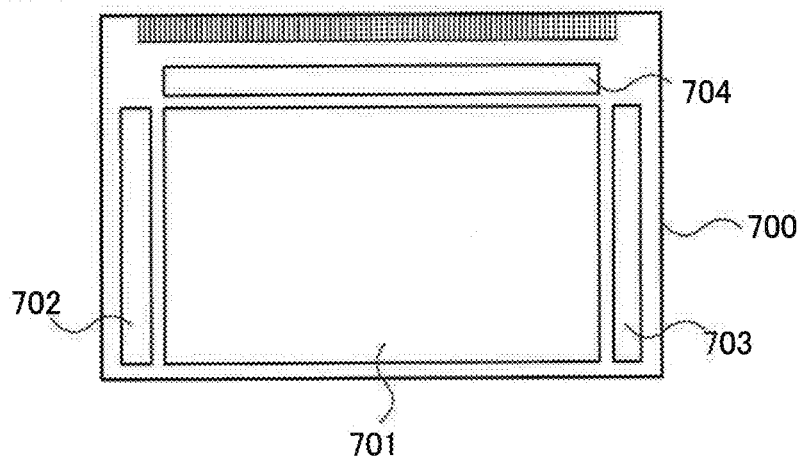
FIG. 38 A view illustrating a configuration example of a display device and circuit diagrams of pixels.
Figure 38B:
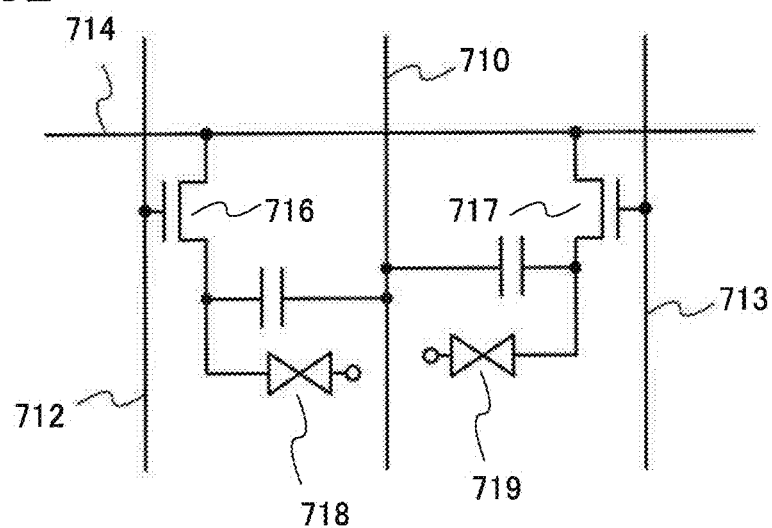
Figure 38C:
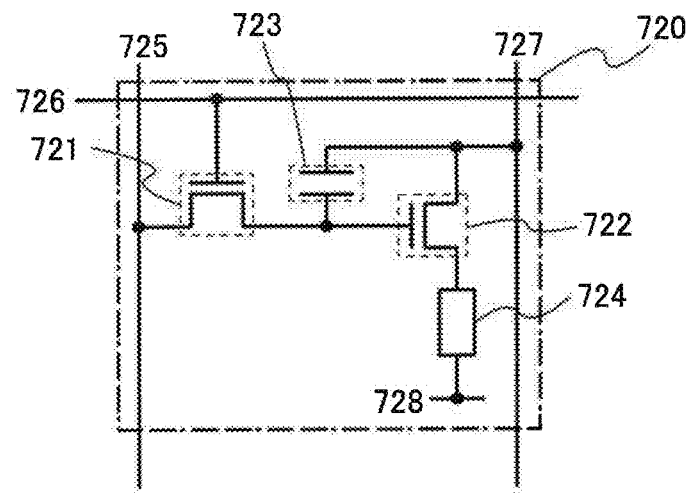

FIG. 38(A) is a top view of the display device of one embodiment of the present invention, and FIG. 38(B) is a circuit diagram illustrating a pixel circuit that can be used in the case where a liquid crystal element is used in a pixel in the display device of one embodiment of the present invention. Furthermore, FIG. 38(C) is a circuit diagram illustrating a pixel circuit that can be used in the case where an organic EL element is used in a pixel in the display device of one embodiment of the present invention.

The transistor in the pixel portion can be formed in accordance with Embodiments 1 to 3. Further, the transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 38(A) illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a FPC (Flexible Printed Circuit).

In FIG. 38(A), the first scan line driver circuit 702, the second scan line driver circuit 703, and the signal line driver circuit 704 are formed over the substrate 700 where the pixel portion 701 is formed. Accordingly, the number of components of a driver circuit and the like provided outside is reduced, so that a reduction in cost can be achieved. Furthermore, if the driver circuit is provided outside the substrate 700, wirings would need to be extended and the number of wiring connections would increase. When the driver circuit is provided over the substrate 700, the number of connections of wirings can be reduced; thus, an improvement in reliability or yield can be achieved. Note that a structure where one or more of the first scan line driver circuit 702, the second scan line driver circuit 703, and the signal line driver circuit 704 may be mounted on the substrate 700 or provided outside the substrate 700 may be employed.

<Liquid Crystal Display Device>

FIG. 38(B) illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A scan line 712 of a transistor 716 and a scan line 713 of a transistor 717 are separated so that different gate signals can be supplied thereto. In contrast, a data line 714 is shared by the transistor 716 and the transistor 717. The transistor described in any of Embodiments 1 to 3 can be used as appropriate as each of the transistors 716 and 717. Thus, a highly reliable liquid crystal display device can be provided.

A first pixel electrode is electrically connected to the transistor 716 and a second pixel electrode is electrically connected to the transistor 717. The first pixel electrode and the second pixel electrode are separated. There is no specific limitation on the shapes of the first electrode and the second electrode. For example, the first pixel electrode has a V shape.

A gate electrode of the transistor 716 is connected to the scan line 712, and a gate electrode of the transistor 717 is connected to the scan line 713. When different gate signals are supplied to the scan line 712 and the scan line 713, operation timings of the transistor 716 and the transistor 717 can be varied; thus, alignment of liquid crystals can be controlled.

Furthermore, a storage capacitor may be formed using a capacitor wiring 710, a gate insulating layer functioning as a dielectric, and a capacitor electrode electrically connected to the first pixel electrode layer or the second pixel electrode layer.

In a multi-domain design, a first liquid crystal element 718 and a second liquid crystal element 719 are included in a pixel. The first liquid crystal element 718 includes the first pixel electrode layer, a counter electrode layer, and a liquid crystal layer therebetween, and the second liquid crystal element 719 includes the second pixel electrode layer, a counter electrode layer, and a liquid crystal layer therebetween.

Note that a pixel circuit shown in FIG. 38(B) is not limited thereto. For example, a switch, a resistor, a capacitor, a transistor, a sensor, a logic circuit, or the like may be added to the pixel circuit illustrated in FIG. 38(B).

<Organic EL Display Device>

FIG. 38(C) shows another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. When the electrons and holes are recombined, the light-emitting organic compound forms an excited state; thus, the light-emitting organic compound returns to a ground state from the excited state, thereby emitting light. Owing to such a mechanism, this light-emitting element is referred to as a current-excitation light-emitting element.

FIG. 38(C) shows an example of a pixel circuit that can be used. Here, an example in which one pixel includes two n-channel transistors is shown. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate.

As the switching transistor 721 and the driver transistor 722, any of the transistors described in Embodiments 1 to 3 can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 will be described. In the case of a voltage-input voltage driving method, a video signal for making the driver transistor 722 into two states in which the driver transistor is turned on or off is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog gray scale driving.

Note that the configuration of the pixel circuit is not limited to the pixel configuration shown in FIG. 38(C). For example, a switch, a resistor, a capacitor, a sensor, a transistor, a logic circuit, or the like may be added to the pixel circuit illustrated in FIG. 38(C).

In the case where the transistor described in the above embodiments is used for the circuit shown in FIG. 38, the structure where the source electrode (the first electrode) is electrically connected to the low potential side and the drain electrode (the second electrode) is electrically connected to the high potential side is employed. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ various modes or can include various elements. A display element, a display device, a light-emitting element, or a light-emitting device include at least one of the following, for example: an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display (PDP), a micro electro mechanical system (MEMS), a digital micromirror device (DMD), a digital micro shutter (DMS), MIRASOL (registered trademark), an IMOD (interference modulation) element, an electrowetting element, a piezoelectric ceramic display, and a display element using a carbon nanotube. Other than the above, display media whose contrast, luminance, reflectivity, transmittance, or the like is changed by an electrical or magnetic effect may be included. Note that examples of display devices having EL elements include an EL display. Examples of a display device including an electron emitter include a field emission display (FED), an SED-type flat panel display (SED: Surface-conduction Electron-emitter Display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

Note that this embodiment can be combined with any of the other embodiments and examples in this specification as appropriate.

(Embodiment 8)

In this embodiment, a display module including a semiconductor device of one embodiment of the present invention will be described with reference to FIG. 29.

<Display Module>

Figure 39:
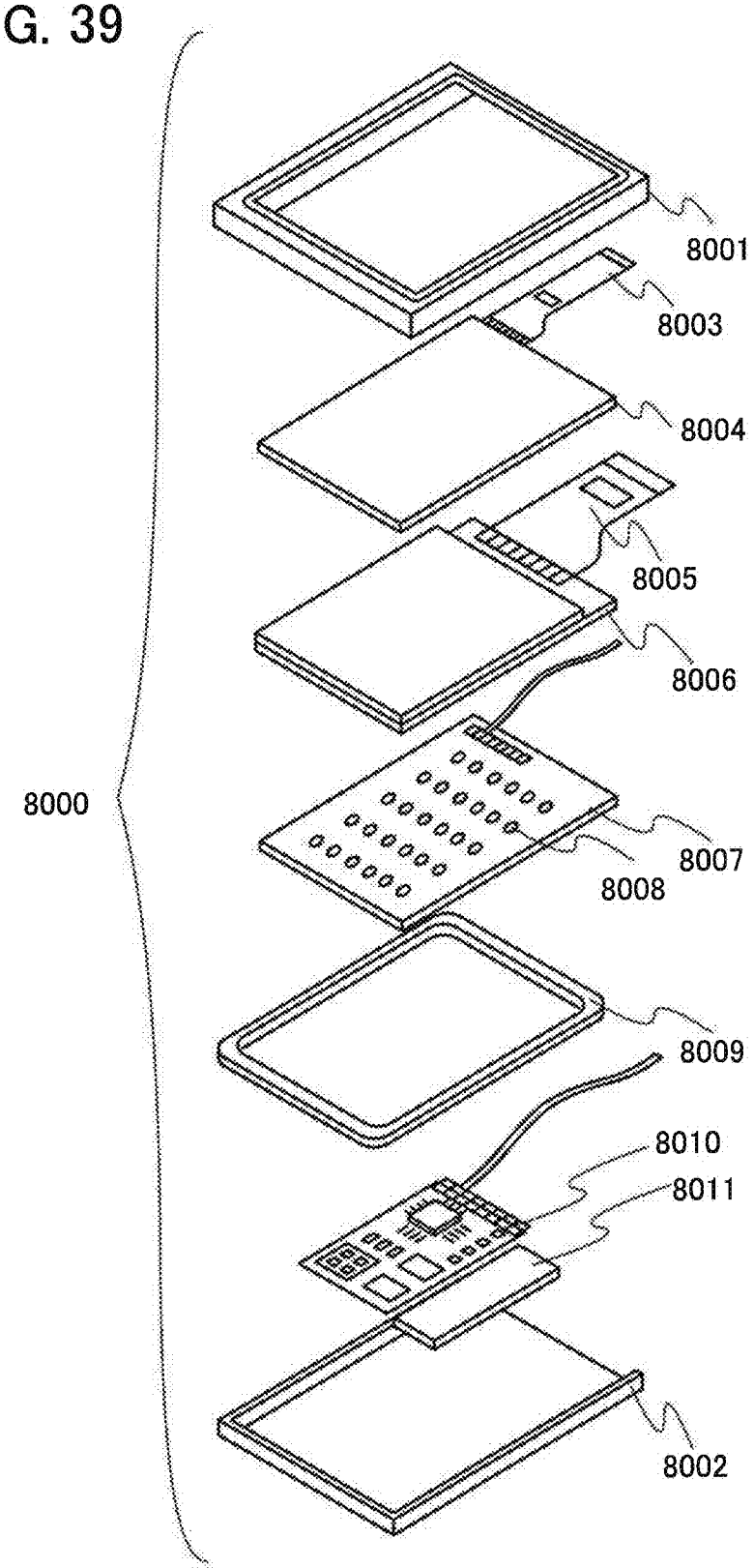
FIG. 39 A view illustrating a display module.

In a display module 6000 in FIG. 39, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. It is also possible that a counter substrate (sealing substrate) of the display panel 6006 has a touch panel function. A photosensor may be provided in each pixel of the display panel 6006 so that an optical touch panel function is added. Alternatively, an electrode for a touch sensor may be provided in each pixel of the display panel 6006 so that a capacitive touch panel function is added.

The backlight unit 6007 includes a light source 6008. A structure where the light source 6008 is provided at an end portion of the backlight unit 6007 and a light diffusing plate is used may be employed.

The frame 6009 has a function as an electromagnetic shield for blocking electromagnetic waves generated from the printed circuit board 6010 besides a function of protecting the display panel 6006. The frame 6009 may function as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. Note that the battery 6011 can be omitted in the case where a commercial power source is used.

The display module 6000 can be additionally provided with a member such as a polarizing plate, a retardation plate, or a prism sheet.

Note that this embodiment can be combined with any of the other embodiments and examples in this specification as appropriate.

(Embodiment 9)

In this embodiment, application examples of the semiconductor device of one embodiment of the present invention will be described.

<Package Using a Lead Frame Interposer>

Figure 40A:
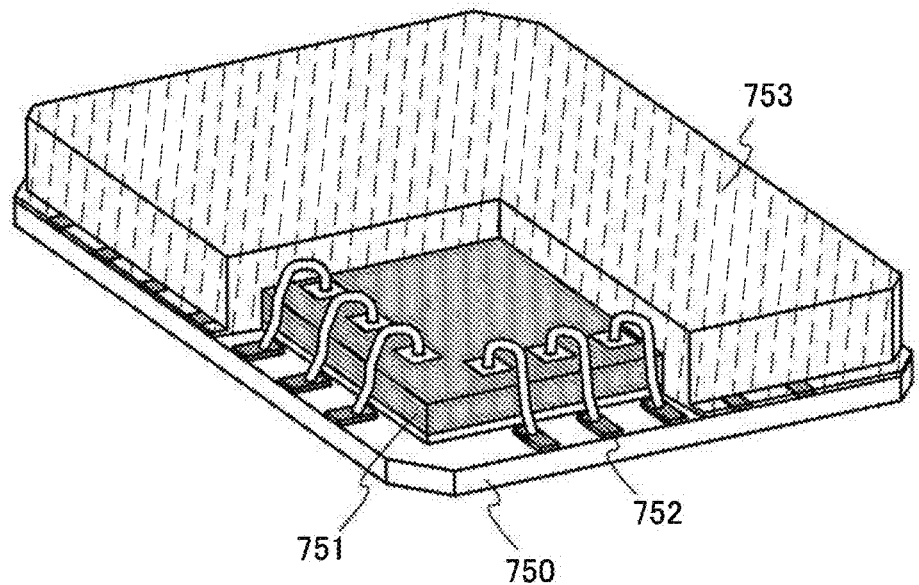
FIG. 40 Perspective views illustrating a cross-sectional structure of a package using a lead frame interposer.

FIG. 40(A) shows a perspective view illustrating a cross-sectional structure of a package using a lead frame interposer. In the package illustrated in FIG. 40(A), a chip 1751 corresponding to the semiconductor device of one embodiment of the present invention is connected to a terminal 1752 over an interposer 1750 by wire bonding. The terminal 1752 is placed on a surface of the interposer 1750 on which the chip 1751 is mounted. The chip 1751 may be sealed by a mold resin 1753, in which case the chip 1751 is sealed such that part of each of the terminals 1752 is exposed.

Figure 40B:
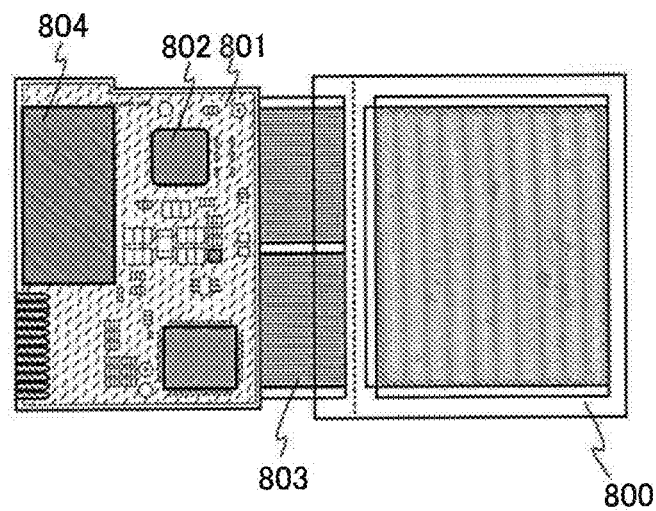

The structure of a module of an electronic device (mobile phone) in which a package is mounted on a circuit board is illustrated in FIG. 40(B). In the module of the mobile phone in FIG. 40(B), a package 1802 and a battery 1804 are mounted on a printed wiring board 1801. The printed wiring board 1801 is mounted on a panel 1800 including a display element by an FPC 1803.

Note that this embodiment can be combined with any of the other embodiments and examples in this specification as appropriate.

(Embodiment 10)

In this embodiment, electronic devices and lighting devices of one embodiment of the present invention will be described with reference to drawings.

<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices are television devices (also referred to as TV or television receivers), monitors for computers and the like, cameras such as digital cameras and digital video cameras, digital photo frames, mobile phones (also referred to as cellular phones or portable telephone devices), portable game machines, portable information terminals, audio playback devices, large game machines such as pin-ball machines, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 41A:
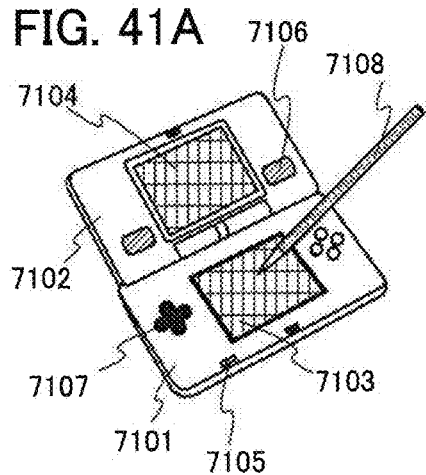
FIG. 41 Views illustrating electronic devices.

FIG. 41(A) illustrates a portable game machine which includes a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the display device according to one embodiment of the present invention is used as the display portion 7103 or 7104, it is possible to provide a user-friendly portable game machine with quality that hardly deteriorates. Although the portable game machine illustrated in FIG. 41(A) includes two display portions, the display portion 7103 and the display portion 7104, the number of display portions included in the portable game machine is not limited thereto.

Figure 41B:
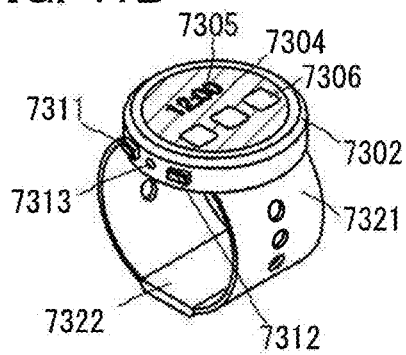

FIG. 41(B) illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 41C:
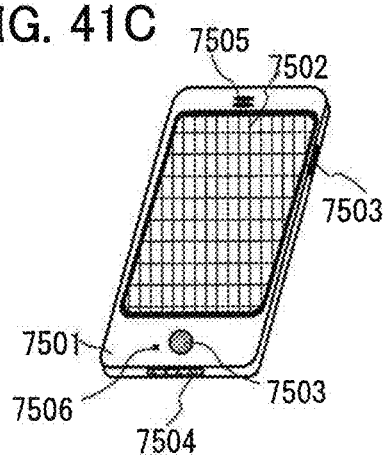

FIG. 41(C) illustrates a portable information terminal, which includes a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that the display portion 7502 is small- or medium-sized but can perform full high vision, 4K, or 8 K display because it has greatly high definition; therefore, a significantly clear image can be obtained.

Figure 41D:
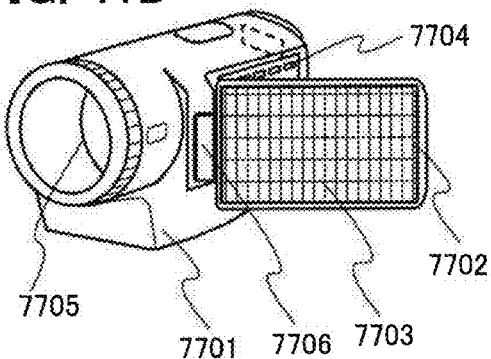

FIG. 41(D) illustrates a video camera including a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be provided in a focus position of the lens 7705. The semiconductor device of one embodiment of the present invention can be used for an integrated circuit, a CPU, or the like incorporated in the first housing 7701.

Figure 41E:
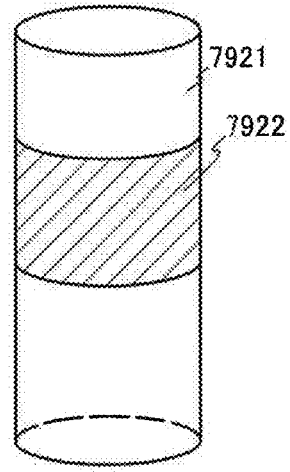

FIG. 41(E) illustrates a digital signage which includes a display portion 7902 provided on a utility pole 7901. The display device of one embodiment of the present invention can be used for a control circuit of the display portion 7902.

Figure 42A:
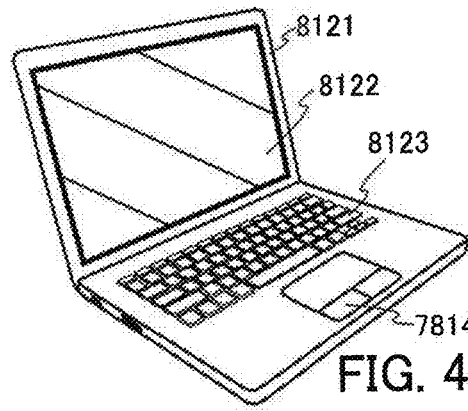
FIG. 42 Views illustrating electronic devices.

FIG. 42(A) illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8$k$ display because it has greatly high resolution; therefore, a significantly clear image can be obtained.

Figure 42B:
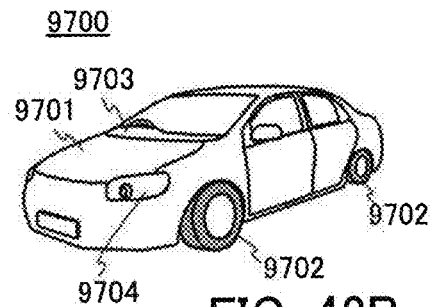
Figure 42C:
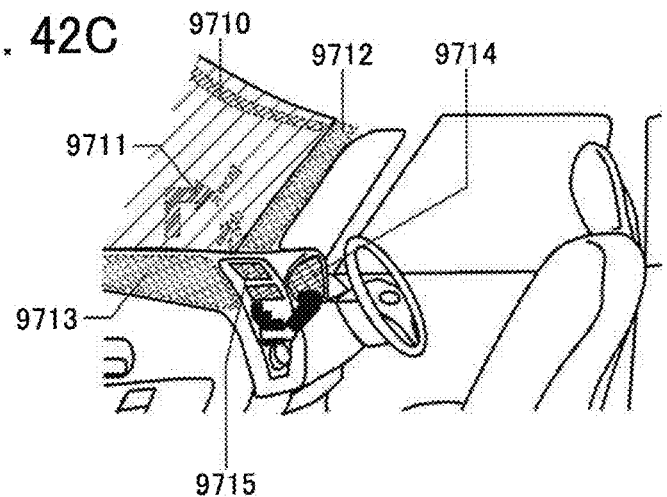

FIG. 42(B) is an external view of an automobile 9700. FIG. 42(C) illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 42(C).

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for electrodes included in the display device or the input/output device. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard portion. For example, the display portion 9713 can compensate for the view hindered by the dashboard by showing an image taken by an imaging unit provided on the car body. That is, showing an image taken by an imaging unit provided on the outside of the car body can compensate for blind areas and enhance the safety. In addition, showing an image so as to compensate for the area which cannot be seen makes it possible for the driver to confirm safety easily and comfortably.

Figure 42D:
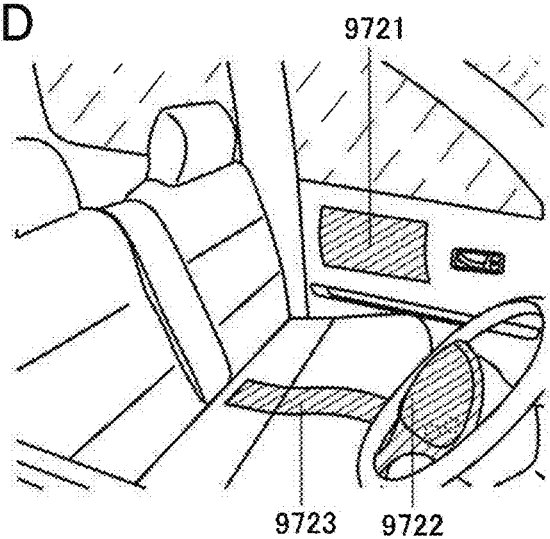

FIG. 42(D) illustrates the inside of a car in which a bench seat is used as a driver seat and a front passenger seat. A display portion 9721 is a display device or input/output device provided in a door portion. For example, the display portion 9721 can compensate for the view hindered by the door by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The display content, layout, or the like on the display portions can be changed as appropriate in accordance with his or her preference. The information listed above can also be displayed on the display portion 9710 to the display portion 9713, the display portion 9721, and the display portion 9723. The display portion 9710 to the display portion 9715 and the display portion 9721 to the display portion 9723 can also be used as lighting devices. The display portion 9710 to the display portion 9715 and the display portion 9721 to the display portion 9723 can also be used as heating devices.

Figure 43A:
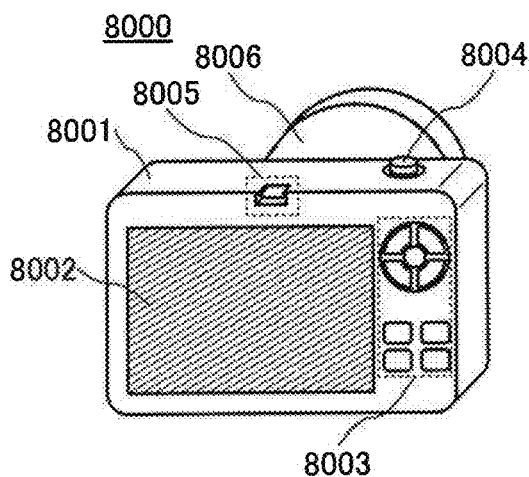
FIG. 43 Views illustrating electronic devices.

FIG. 43(A) illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which is described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, the display portion 8002 has a function as a touch panel and images can be taken at the touch of the display portion 8002.

The display device or input/output device of one embodiment of the present invention can be used in the display portion 8002.

Figure 43B:
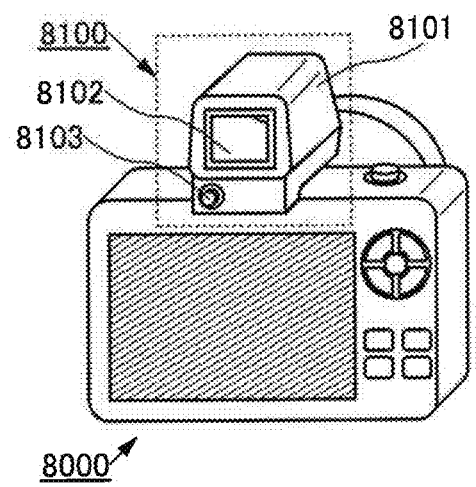

FIG. 43(B) shows an example of the case where the camera 8000 is provided with the finder 8100.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 functions as a power supply button. With the button 8103, the on/off state of the display portion 8102 can be switched.

The semiconductor device of one embodiment of the present invention can be used for an integrated circuit and an image sensor included in the housing 8101.

Although the camera 8000 and the finder 8100 are separate electronic device which are detachable in FIGS. 43(A) and (B), the housing 8001 of the camera 8000 may include a finder having the display device or input/output device of one embodiment of the present invention.

Figure 43C:
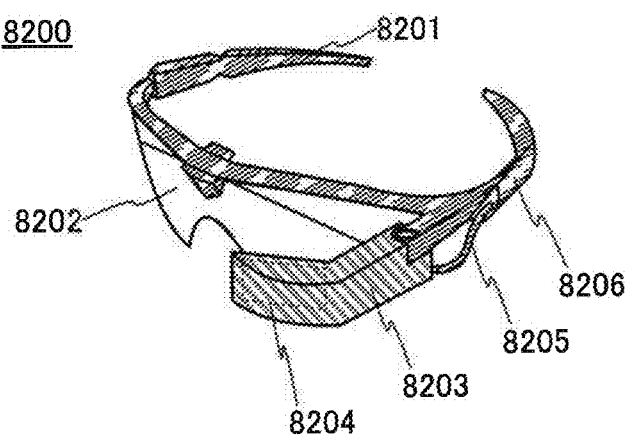

FIG. 43(C) illustrates an external view of a head-mounted display 8200.

The head-mounted display 8200 includes a mounting portion 8201, a lens 8202, a main body 8203, a display portion 8204, a cable 8205, and the like. The mounting portion 8201 incorporates a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the eyepoint of the user are calculated using the captured data to utilize the eye of the user as an input means.

The mounting portion 8201 may include a plurality of electrodes so as to be in contact with the user. The main body 8203 may have a function of sensing current flowing through the electrodes with the movement of the user's eyeball to recognize user's eyepoint. The main body 8203 may have a function of sensing current flowing through the electrodes to monitor the user's pulse. The mounting portion 8201 may include sensors, such as a temperature sensor, a pressure sensor, or an acceleration sensor and may have a function of displaying the user's biological information on the display portion 8204. The movement of the user's head or the like may be sensed so that an image displayed on the display portion 8204 can be changed in synchronization with the movement.

The semiconductor device of one embodiment of the present invention can be used for an integrated circuit included in the main body 8203.

At least part of this embodiment can be implemented in combination with any of the other embodiments and the other examples described in this specification as appropriate.

(Embodiment 11)

In this embodiment, application examples of an RF tag using the semiconductor device of one embodiment of the present invention will be described with reference to FIG. 44.

<Application Examples of RF Tag>

Figure 44A:
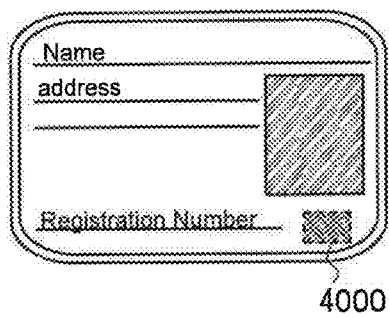
FIG. 44 Views illustrating electronic devices.
Figure 44B:
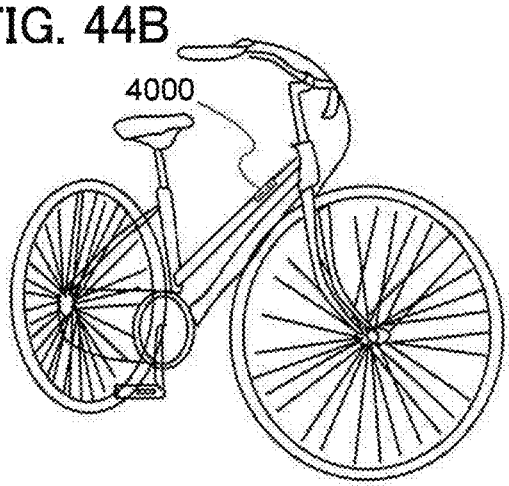
Figure 44C:
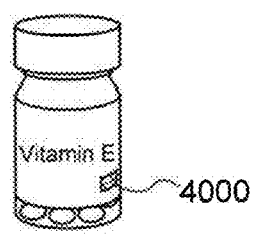
Figure 44D:
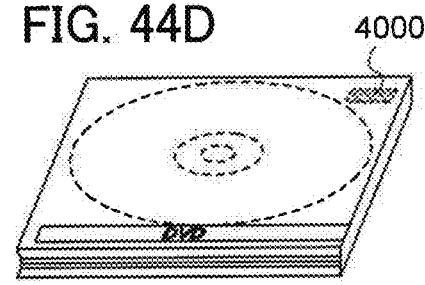
Figure 44E:
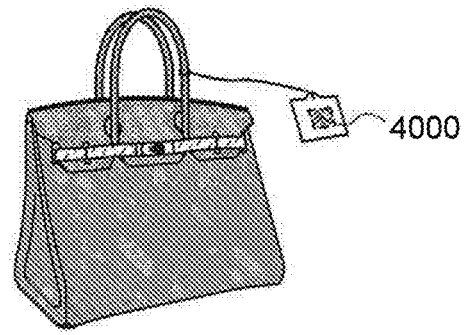
Figure 44F:
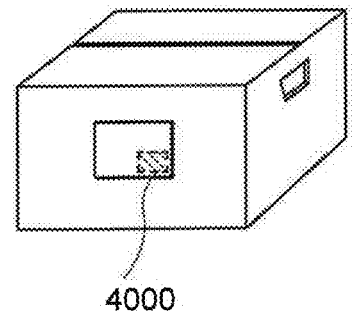

The RF tag is widely used and can be provided for, for example, products such as bills, coins, securities, bearer bonds, documents (driver's licenses, resident's cards, or the like, see FIG. 44(A)), vehicles (bicycles, see FIG. 44(B)), packaging containers (wrapping, bottles, or the like, see FIG. 44(C)), recording media (DVD, video tapes, or the like, personal belongings (bags, glasses, or the like, see FIG. 44(D)), foods, plants, animals, human bodies, clothing, household goods, medical supplies such as medicine and chemicals, and electronic devices (liquid crystal display devices, EL display devices, television sets, or cellular phones), or tags on products (see FIG. 44(E) and FIG. 44(F)).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have a higher level of security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments and examples in this specification as appropriate.

REFERENCE NUMERALS

10 transistor
11 transistor
12 transistor
13 transistor
14 transistor
63 semiconductor layer
64 semiconductor layer
65 semiconductor layer
100 substrate
110 insulating layer
120 oxide semiconductor layer
121 oxide semiconductor layer
122 oxide semiconductor layer
123 oxide semiconductor layer
123*a* oxide semiconductor film
124 oxide semiconductor layer
130 source electrode layer
130*b* conductive layer
131 source electrode layer
132 source electrode layer
135 conductive layer
140 drain electrode layer
141 drain electrode layer
142 drain electrode layer
150 gate insulating layer
150*a* insulating film
160 gate electrode layer
160*a* conductive film
161 gate electrode layer
162 gate electrode layer
163 gate electrode layer
165 conductive layer
166 conductive layer
167 conductive layer
170 insulating layer
171 mixed layer
172 oxygen
174 groove portion
175 insulating layer
175*b* insulating layer
176 resist mask
177 insulating layer
180 insulating layer
185 insulating layer
190 conductive layer
191 conductive layer
192 conductive layer
200 imaging device
201 switch
202 switch
203 switch
210 pixel portion
211 pixel
212 subpixel
212B subpixel
212G subpixel
212R subpixel
220 photoelectric conversion element
230 pixel circuit
231 wiring
247 wiring
248 wiring
249 wiring
250 wiring
253 wiring
254 filter
254B filter
254G filter
254R filter
255 lens
256 light
257 wiring
260 peripheral circuit
270 peripheral circuit 280 peripheral circuit
290 peripheral circuit
291 light source
300 silicon substrate
310 layer
320 layer
330 layer
340 layer
351 transistor
352 transistor
353 transistor
360 photodiode
361 anode
362 cathode
363 low-resistance region
365 photodiode
366 semiconductor layer
367 semiconductor layer
368 semiconductor layer
370 plug
371 wiring
372 wiring
373 wiring
374 wiring
601 precursor
602 precursor
700 substrate
701 pixel portion
702 scan line driver circuit
703 scan line driver circuit
704 signal line driver circuit
710 capacitor wiring
712 scan line
713 scan line
714 signal line
716 transistor
717 transistor
718 liquid crystal element
719 liquid crystal element
720 pixel
721 switching transistor
722 driver transistor
723 capacitor
724 light-emitting element
725 signal line
726 scan line
727 power supply line
728 common electrode
800 RF tag
801 communication device
802 antenna
803 radio signal
804 antenna
805 rectifier circuit
806 constant-voltage circuit
807 demodulation circuit
808 modulation circuit
809 logic circuit
810 memory circuit
811 ROM
1189 ROM interface
1190 substrate
1191 ALU
1192 ALU controller
1193 instruction decoder
1194 interrupt controller
1195 timing controller
1196 register
1197 register controller
1198 bus interface
1199 ROM
1200 memory element
1201 circuit
1202 circuit
1203 switch
1204 switch
1206 logic element
1207 capacitor
1208 capacitor
1209 transistor
1210 transistor
1213 transistor
1214 transistor
1220 circuit
1223 oxide semiconductor layer
1700 deposition substrate
1701 chamber
1702 load chamber
1703 pretreatment chamber
1704 chamber
1705 chamber
1706 unload chamber
1711a source material supply portion
1711b source material supply portion
1712a high-speed valve
1712b high-speed valve
1713a source material introduction port
1713b source material introduction port
1714 source material exhaust port
1715 evacuation unit
1716 substrate holder
1720 transfer chamber
1750 interposer
1751 chip
1752 terminal
1753 mold resin
1800 panel
1801 printed circuit board
1802 package
1803 FPC
1804 battery
2100 transistor
2200 transistor
2201 insulator
2202 wiring
2203 plug
2204 insulator
2205 wiring
2207 insulator
2210 intermediate layer
2211 semiconductor substrate
2212 insulator
2213 gate electrode
2214 gate insulator
2215 drain region
3001 wiring
3002 wiring
3003 wiring
3004 wiring
3005 wiring
3200 transistor
3300 transistor
3400 capacitor
4000 RF tag 5100 pellet
5120 substrate
5161 region
6000 display module
6001 upper cover
6002 lower cover
6003 FPC
6004 touch panel
6005 FPC
6006 display panel
6007 backlight unit
6008 light source
6009 frame
6010 printed circuit board
6011 battery
7101 housing
7102 housing
7103 display portion
7104 display portion
7105 microphone
7106 speaker
7107 operation key
7108 stylus
7302 housing
7304 display portion
7311 operation button
7312 operation button
7313 connection terminal
7321 band
7322 gold
7501 housing
7502 display portion
7503 operation button
7504 external connection port
7505 speaker
7506 microphone
7701 housing
7702 housing
7703 display portion
7704 operation key
7705 lens
7706 joint
7901 utility pole
7902 display portion
8000 camera
8001 housing
8002 display portion
8003 operation button
8004 shutter button
8005 connection portion
8006 lens
8100 finder
8101 housing
8102 display portion
8103 button
8121 housing
8122 display portion
8123 keyboard
8124 pointing device
8200 head-mounted display
8201 mounting portion
8202 lens
8203 main body
8204 display portion
8205 cable
8206 battery
9700 automobile
9701 car body
9702 wheel
9703 dashboard
9704 light
9710 display portion
9711 display portion
9712 display portion
9713 display portion
9714 display portion
9715 display portion
9721 display portion
9722 display portion
9723 display portion

The invention claimed is:

1. A semiconductor device comprising:
a first insulating layer;
a first oxide semiconductor layer over the first insulating layer;
a second oxide semiconductor layer over the first oxide semiconductor layer;
a source electrode layer and a drain electrode layer over the second oxide semiconductor layer;
a second insulating layer over the first insulating layer, the source electrode layer, and the drain electrode layer;
a third insulating layer over the second insulating layer;
a third oxide semiconductor layer over the second oxide semiconductor layer;
a gate insulating layer over the third oxide semiconductor layer; and
a gate electrode layer over the gate insulating layer,
wherein the second insulating layer is in contact with a side surface of the first oxide semiconductor layer, a side surface of the second oxide semiconductor layer, a side surface of the source electrode layer, and a side surface of the drain electrode layer, and
wherein the third oxide semiconductor layer is in contact with the side surface of the second oxide semiconductor layer, the side surface of the source electrode layer, the side surface of the drain electrode layer, the side surface of the second insulating layer, and the side surface of the third insulating layer.

2. The semiconductor device according to claim 1, wherein an aluminum oxide layer is used as the second insulating layer.

3. A semiconductor device comprising:
a first insulating layer;
a first oxide semiconductor layer over the first insulating layer;
a second oxide semiconductor layer over the first oxide semiconductor layer;
a source electrode layer and a drain electrode layer over the second oxide semiconductor layer;
a first conductive layer and a second conductive layer in contact with a side surface of the second oxide semiconductor layer;
a second insulating layer over the first insulating layer, the source electrode layer, and the drain electrode layer;
a third insulating layer over the second insulating layer;
a third oxide semiconductor layer over the second oxide semiconductor layer;
a gate insulating layer over the third oxide semiconductor layer; and
a gate electrode layer over the gate insulating layer,
wherein a side surface of the first conductive layer and a side surface of the second conductive layer are in contact with the second insulating layer, wherein the third oxide semiconductor layer is in contact with a side surface of the first insulating layer, a side surface of the first oxide semiconductor layer, a side surface of the second oxide semiconductor layer, a side surface of the source electrode layer, a side surface of the drain electrode layer, a side surface of the second insulating layer, and a side surface of the third insulating layer.

4. The semiconductor device according to claim 3, wherein an aluminum oxide layer is used as the second insulating layer.

5. A semiconductor device comprising:
a first insulating layer;
a first oxide semiconductor layer over the first insulating layer;
a second oxide semiconductor layer over the first oxide semiconductor layer;
a source electrode layer and a drain electrode layer over the second oxide semiconductor layer;
a second insulating layer over the first insulating layer, the source electrode layer, and the drain electrode layer;
a third insulating layer over the second insulating layer;
a fourth insulating layer over the source electrode layer and the drain electrode layer and in contact with a side surface of the second insulating layer and a side surface of the third insulating layer;
a third oxide semiconductor layer over the second oxide semiconductor layer;
a gate insulating layer over the third oxide semiconductor layer; and
a gate electrode layer over the gate insulating layer,
wherein the second insulating layer is in contact with a side surface of the first oxide semiconductor layer, a side surface of the second oxide semiconductor layer, a side surface of the source electrode layer, and a side surface of the drain electrode layer, and
wherein the third oxide semiconductor layer is in contact with a side surface of the first insulating layer, a side surface of the first oxide semiconductor layer, a side surface of the second oxide semiconductor layer, a side surface of the source electrode layer, a side surface of the drain electrode layer, and a side surface of the fourth insulating layer.

6. The semiconductor device according to claim 5, wherein an aluminum oxide layer is used as the second insulating layer.

7. A semiconductor device comprising:
a first conductive layer;
a first insulating layer over the first conductive layer;
a first oxide semiconductor layer over the first insulating layer;
a second oxide semiconductor layer over the first oxide semiconductor layer;
a source electrode layer and a drain electrode layer over the second oxide semiconductor layer;
a second insulating layer over the first insulating layer, the source electrode layer, and the drain electrode layer;
a third insulating layer over the second insulating layer;
a third oxide semiconductor layer over the second oxide semiconductor layer;
a gate insulating layer over the third oxide semiconductor layer;
a gate electrode layer over the gate insulating layer; and
a fourth insulating layer over and in contact with the third insulating layer, the third oxide semiconductor layer, the gate insulating layer, and the gate electrode layer,
wherein the fourth insulating layer is an aluminum oxide film,
wherein the second insulating layer is in contact with a side surface of the first oxide semiconductor layer, a side surface of the second oxide semiconductor layer, a side surface of the source electrode layer, and a side surface of the drain electrode layer,
wherein the third oxide semiconductor layer is in contact with a side surface of the first insulating layer, a side surface of the first oxide semiconductor layer, a side surface of the second oxide semiconductor layer, a side surface of the source electrode layer, a side surface of the drain electrode layer, a side surface of the second insulating layer, and a side surface of the third insulating layer.

8. The semiconductor device according to claim 7, wherein an aluminum oxide film is used as the second insulating layer.

9. The semiconductor device according to claim 7,
wherein the second insulating layer comprises a first opening,
wherein the third insulating layer comprises a second opening which overlaps the first opening, and
wherein the a third oxide semiconductor layer, the gate insulating layer and the gate electrode layer are embedded in the first opening and the second opening.

10. A method for manufacturing a semiconductor device, comprising:
forming a first insulating layer;
forming a first oxide semiconductor film over the first insulating layer;
forming a second oxide semiconductor film over the first oxide semiconductor film,
performing first heat treatment;
forming a first conductive film over the second oxide semiconductor film;
partly etching the first oxide semiconductor film and the second oxide semiconductor film with a first mask and the first conductive film to form a first oxide semiconductor layer and a second oxide semiconductor layer having island shapes;
forming a second insulating layer over the first insulating layer and the first conductive film;
forming a third insulating film over the second insulating layer;
performing planarization treatment on the third insulating film to form a third insulating layer;
selectively etching the third insulating layer and the second insulating layer with a second mask;
selectively etching the first conductive film with the second mask and the second insulating layer to form a source electrode layer and a drain electrode layer;
forming a third oxide semiconductor film over the third insulating layer and the second oxide semiconductor layer;
forming a fourth insulating film over the third oxide semiconductor film;
forming a second conductive film over the fourth insulating film; and
performing chemical mechanical polishing treatment on the second conductive film, the third insulating film, and the third oxide semiconductor film to form a third oxide semiconductor layer, a gate insulating layer, and a gate electrode layer, and
forming an aluminum oxide film over and in contact with the gate electrode layer by a sputtering method.

11. The method for manufacturing the semiconductor device according to claim 10, wherein the second insulating layer is formed by a sputtering method with an oxygen gas.

12. The method for manufacturing the semiconductor device according to claim 10, wherein the second insulating layer is formed over a silicon oxide film by a sputtering method using an aluminum oxide target under a condition where an oxygen gas of 50 vol. % or higher is included.

13. The method for manufacturing the semiconductor device according to claim 10, further comprising the steps of:
forming a mixed layer of the first insulating layer and the second insulating layer, and at the same time, adding oxygen to the mixed layer or the first insulating layer when the second insulating layer is formed, and
performing second heat treatment to diffuse the oxygen into the second oxide semiconductor layer after forming the second insulating layer,
wherein the second heat treatment is performed at a temperature higher than or equal to 300° C. and lower than or equal to 450° C.

14. A method for manufacturing a semiconductor device, comprising:
forming a first insulating layer;
forming a first oxide semiconductor film over the first insulating layer;
forming a second oxide semiconductor film over the first oxide semiconductor film;
performing first heat treatment,
forming a first conductive film over the second oxide semiconductor film;
selectively etching the first oxide semiconductor film and the second oxide semiconductor film with a first mask and the first conductive film to form a first oxide semiconductor layer and a second oxide semiconductor layer having island shapes;
forming a second insulating film over the first insulating layer and the first conductive film,
forming a third insulating film over the second insulating film,
performing planarization treatment on the third insulating film;
partly etching the third insulating film and the second insulating film with a second mask to form a third insulating layer and a second insulating layer;
forming a fourth insulating film over the first conductive film and the third insulating layer;
anisotropically etching to form a fourth insulating layer in contact with side surfaces of the second insulating layer and the third insulating layer;
partly etching the first conductive film using the fourth insulating layer as a mask to form a source electrode layer and a drain electrode layer;
forming a third oxide semiconductor film over the third insulating layer and the second oxide semiconductor layer;
forming a fifth insulating film over the third oxide semiconductor film,
forming a second conductive film over the fifth insulating film; and
performing chemical mechanical polishing treatment on the second conductive film, the third insulating film, and the third oxide semiconductor film to form a third oxide semiconductor layer, a gate insulating layer, and a gate electrode layer.

15. The method for manufacturing the semiconductor device according to claim 14, wherein the second insulating film is formed by a sputtering method with an oxygen gas.

16. The method for manufacturing the second insulating film according to claim 14, wherein the second insulating film is formed over a silicon oxide film by a sputtering method using an aluminum oxide target under a condition where an oxygen gas of 50 vol. % or higher is included.

17. The method for manufacturing the semiconductor device according to claim 14, further comprising the steps of:
forming a mixed layer of the first insulating layer and the second insulating layer, and at the same time, adding oxygen to the mixed layer or the first insulating layer when the second insulating layer is formed, and
performing second heat treatment to diffuse the oxygen into the second oxide semiconductor layer after forming the second insulating layer,
wherein the second heat treatment is performed at a temperature higher than or equal to 300° C. and lower than or equal to 450° C.

* * * * *